US008178395B2

(12) United States Patent
Lin et al.

(10) Patent No.: US 8,178,395 B2
(45) Date of Patent: May 15, 2012

(54) METHOD OF MAKING A SEMICONDUCTOR CHIP ASSEMBLY WITH A POST/BASE HEAT SPREADER WITH A THERMAL VIA

(75) Inventors: Charles W. C. Lin, Singapore (SG); Chia-Chung Wang, Hsinchu (TW); Ming Yu Shih, Ban-Chao (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 13/113,051

(22) Filed: May 22, 2011

(65) Prior Publication Data
US 2011/0275180 A1 Nov. 10, 2011

Related U.S. Application Data

(60) Division of application No. 13/111,966, filed on May 20, 2011, which is a continuation-in-part of application No. 12/616,773, filed on Nov. 11, 2009, now Pat. No. 8,067,784, and a continuation-in-part of application No. 12/616,775, filed on Nov. 11, 2009, said application No. 12/616,773 is a continuation-in-part of application No. 12/557,540, filed on Sep. 11, 2009, and a continuation-in-part of application No. 12/557,541, filed on Sep. 11, 2009, now Pat. No. 7,948,076, said application No. 12/616,775 is a continuation-in-part of application No. 12/557,540, and a continuation-in-part of application No. 12/557,541, said application No. 12/557,540 is a continuation-in-part of application No. 12/406,510, filed on Mar. 18, 2009, said application No. 12/557,541 is a continuation-in-part of application No. 12/406,510.

(60) Provisional application No. 61/429,142, filed on Jan. 2, 2011, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 21/60* (2006.01)
(52) U.S. Cl. ............... 438/122; 438/121; 257/E21.506
(58) Field of Classification Search ............... 438/121, 438/122, E21.506
See application file for complete search history.

(56) References Cited

U.S. PATENT DOCUMENTS
3,689,993 A 9/1972 Tolar ............................ 438/380
(Continued)

FOREIGN PATENT DOCUMENTS
JP 2005-166775 6/2005

*Primary Examiner* — Zandra Smith
*Assistant Examiner* — Paul Patton
(74) *Attorney, Agent, or Firm* — David M. Sigmond

(57) ABSTRACT

A method of making a semiconductor chip assembly includes providing a post, a base, a support layer and an underlayer, wherein the post extends above the base and the support layer is sandwiched between the base and the underlayer, mounting an adhesive on the base including inserting the post into an opening in the adhesive, mounting a conductive layer on the adhesive including aligning the post with an aperture in the conductive layer, then flowing the adhesive upward between the post and the conductive layer, solidifying the adhesive, then providing a conductive trace that includes a pad, a terminal and a selected portion of the conductive layer, providing a heat spreader that includes the post, the base, the underlayer and a thermal via that extends from the base through the support layer to the underlayer, then mounting a semiconductor device on the post, electrically connecting the semiconductor device to the conductive trace and thermally connecting the semiconductor device to the heat spreader.

40 Claims, 42 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |
| 6,625,028 B1 | 9/2003 | Dove et al. | 361/704 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhou | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 * | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

* cited by examiner

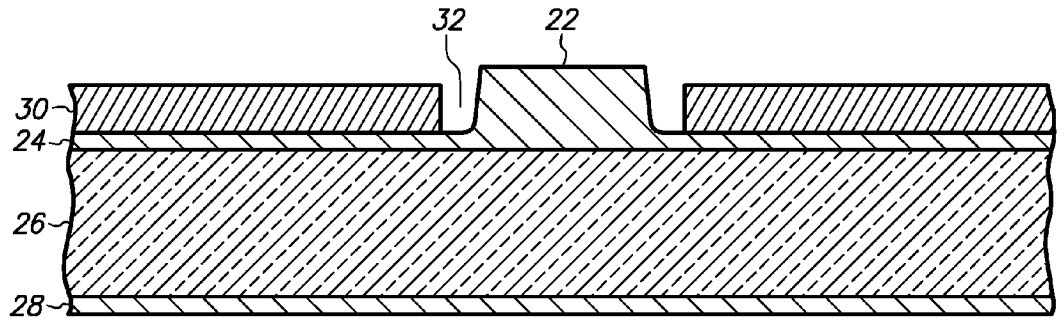
FIG. 4A1
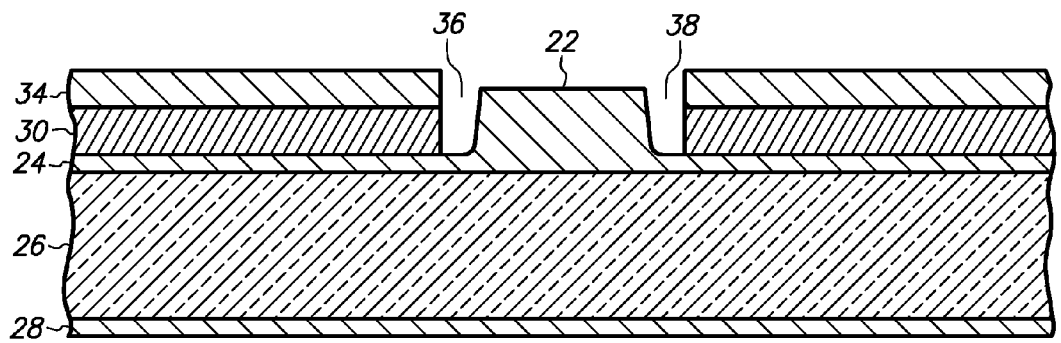
FIG. 4B1
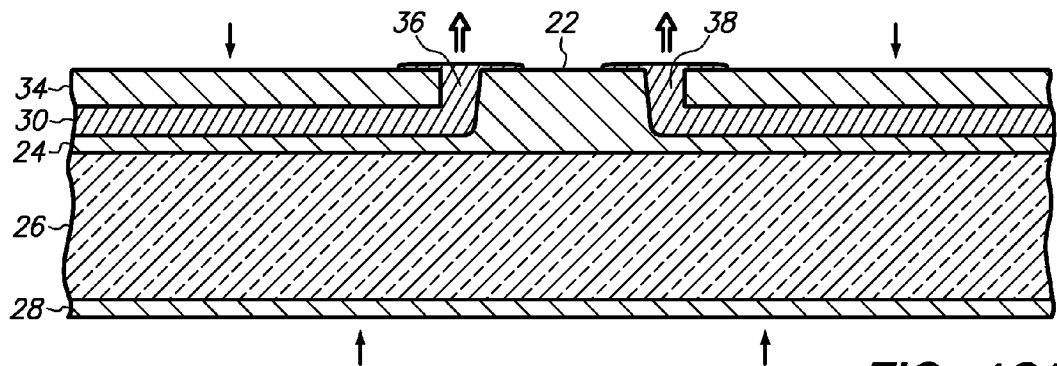
FIG. 4C1

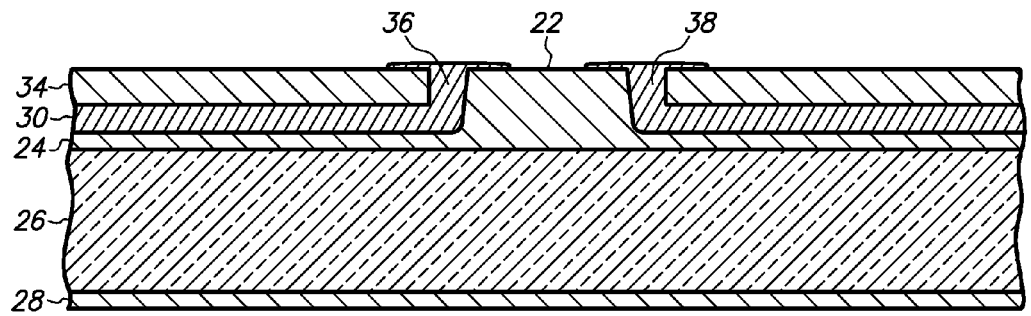
FIG. 4D1
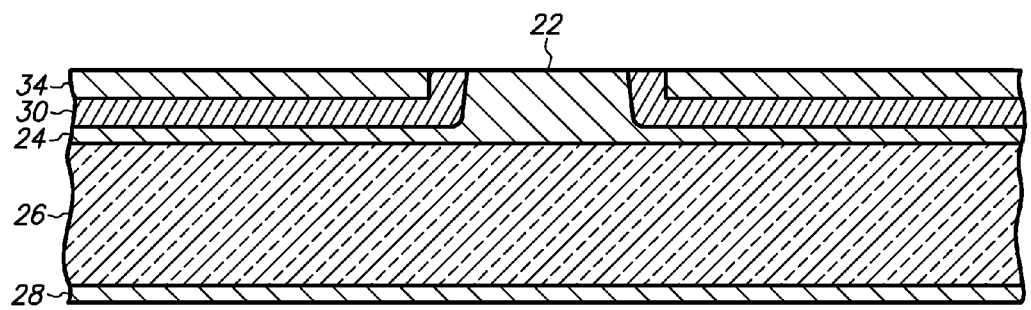
FIG. 4E1
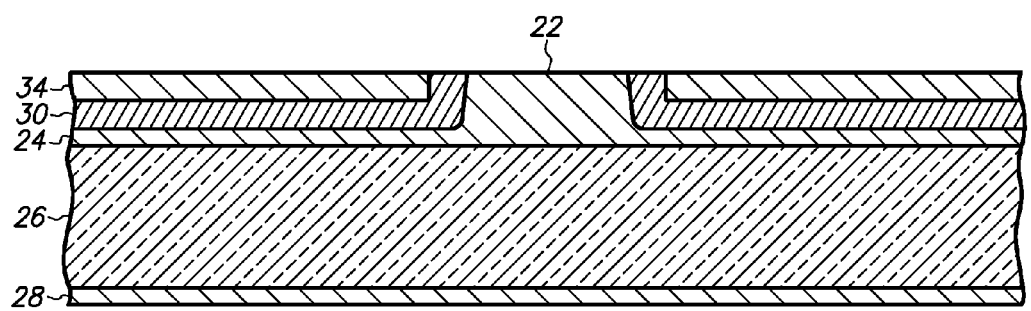
FIG. 4E2

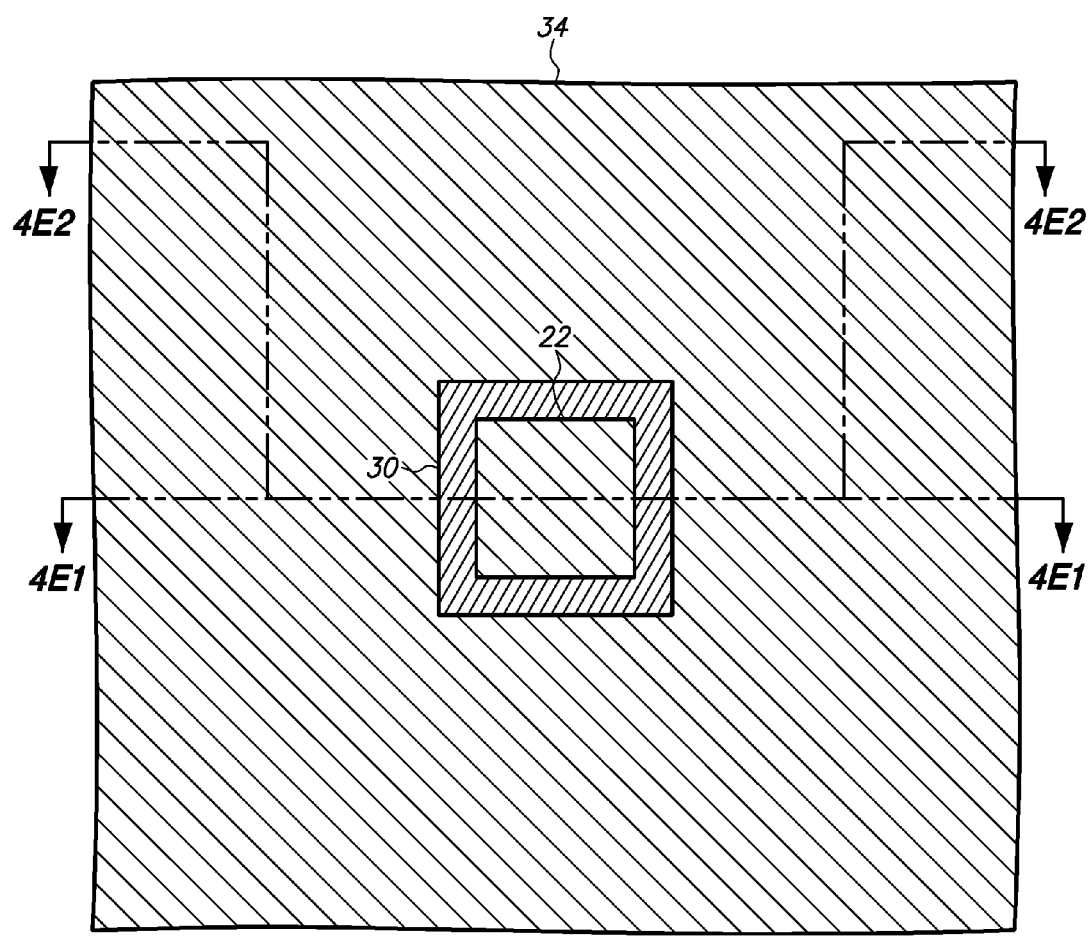
FIG. 4E3

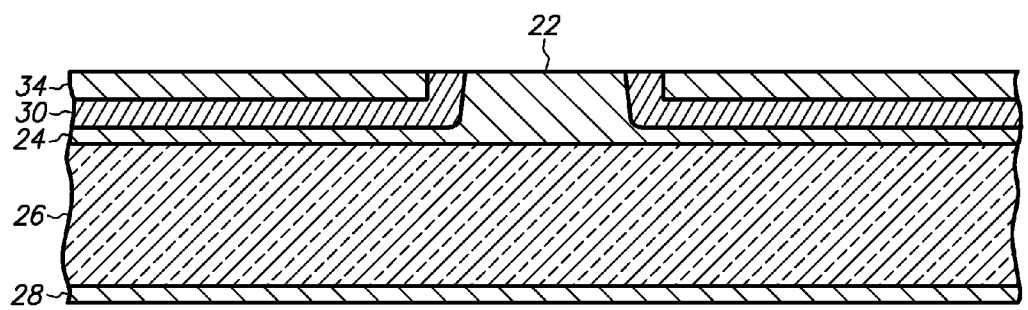
FIG. 4F1
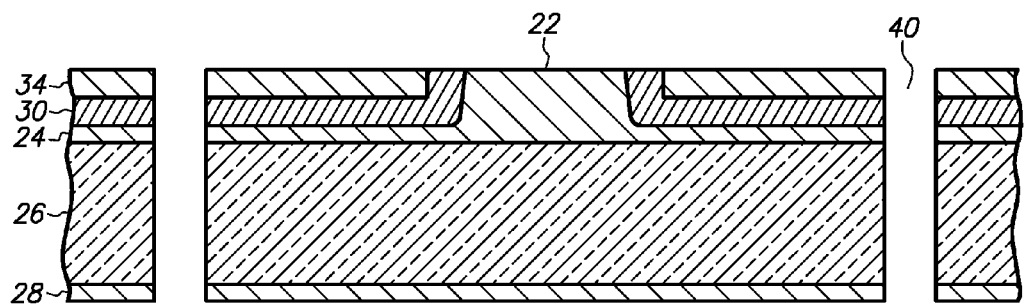
FIG. 4F2

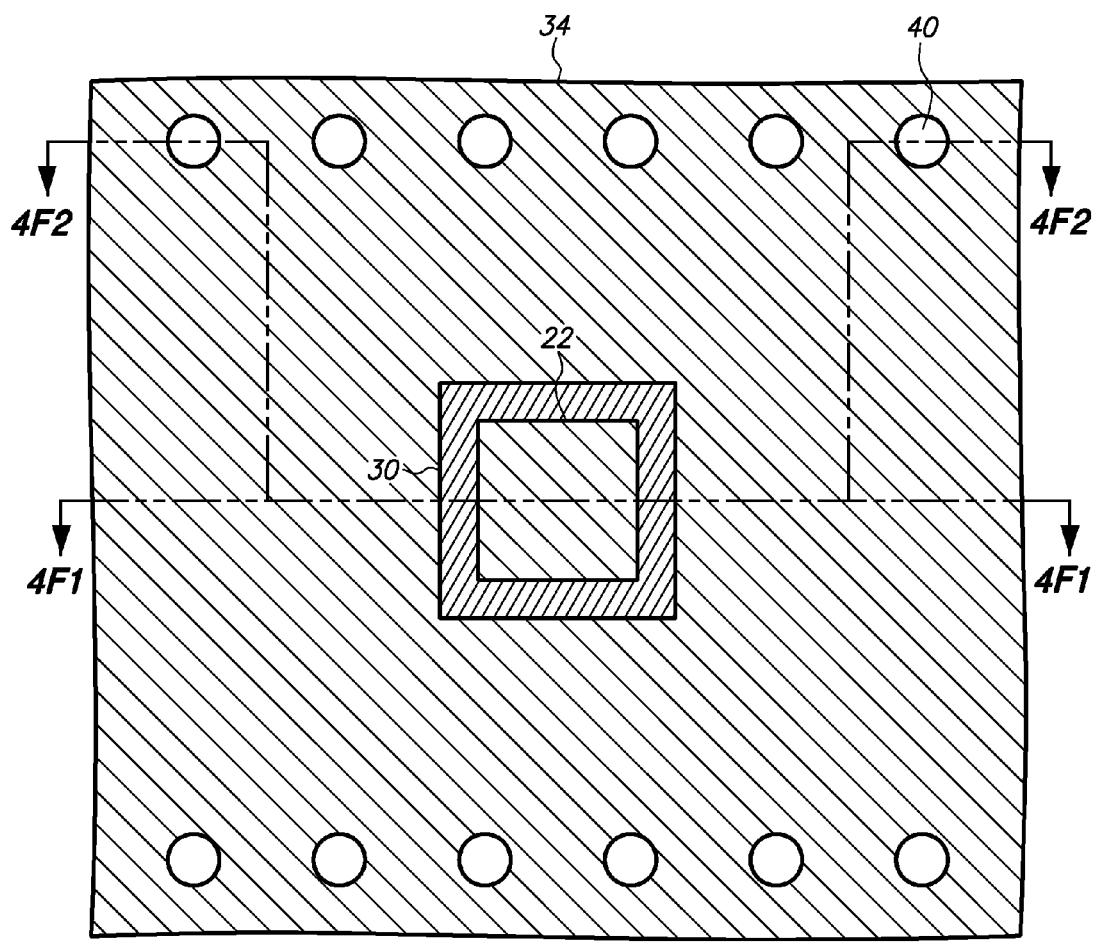
FIG. 4F3

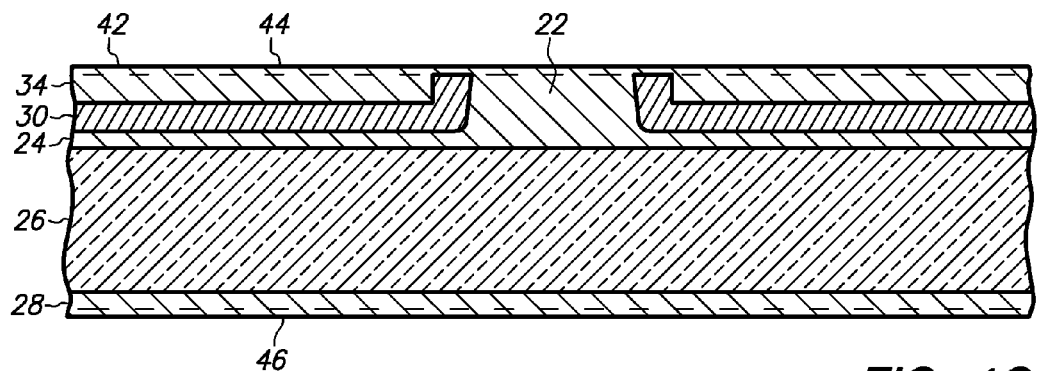
FIG. 4G1
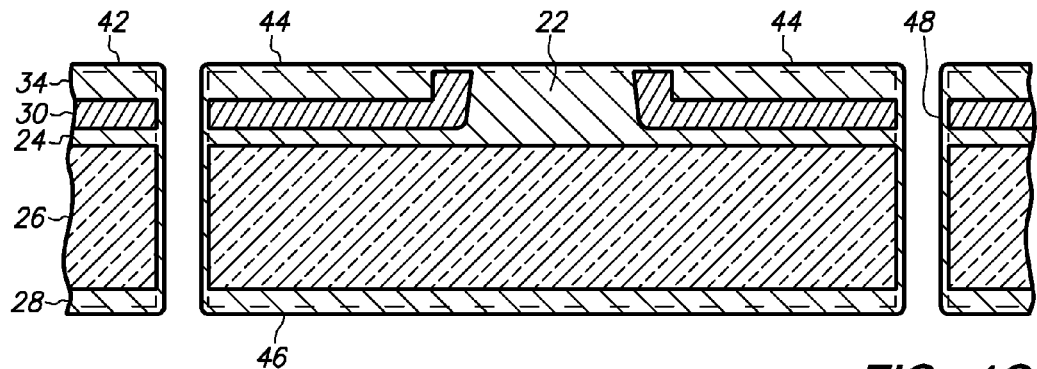
FIG. 4G2

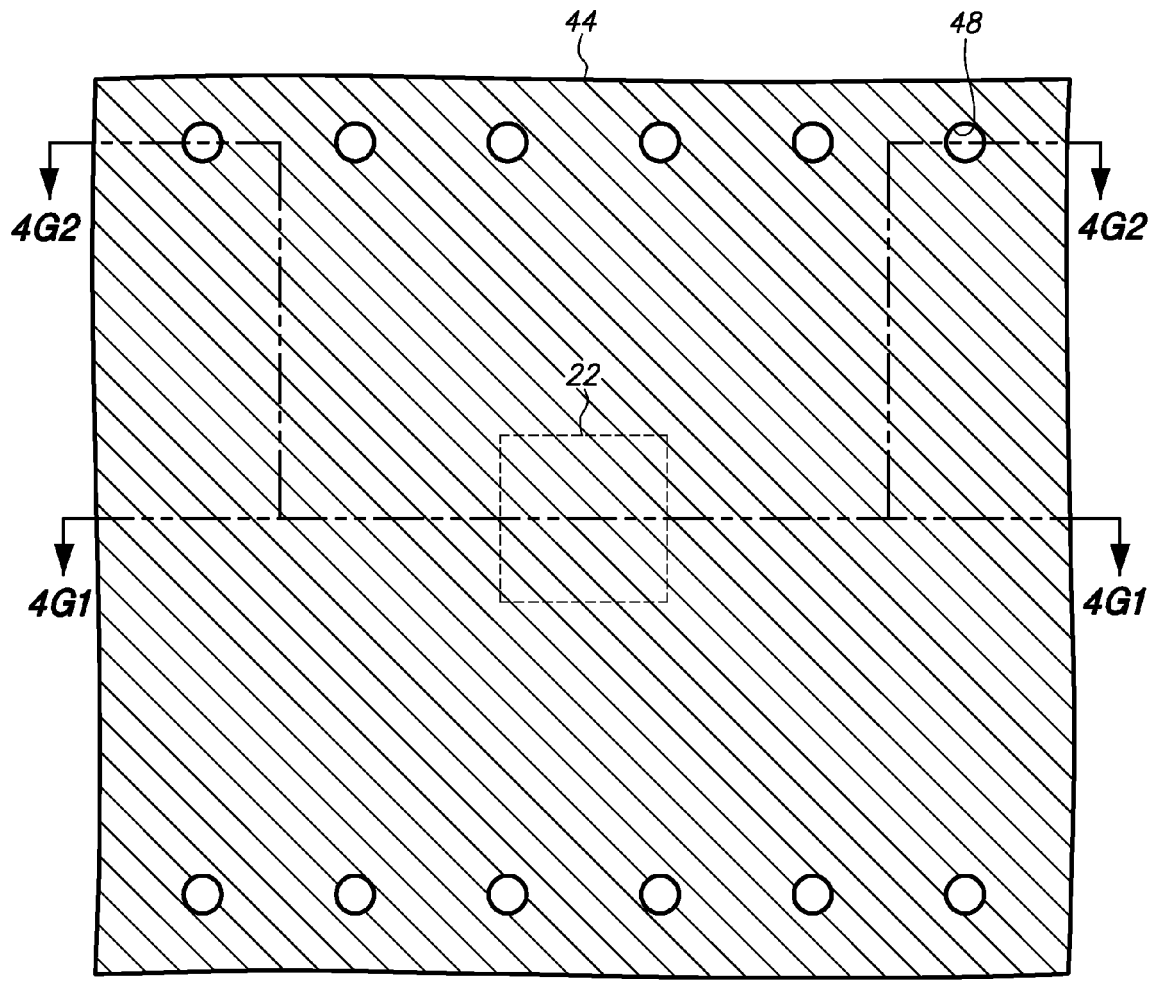
FIG. 4G3

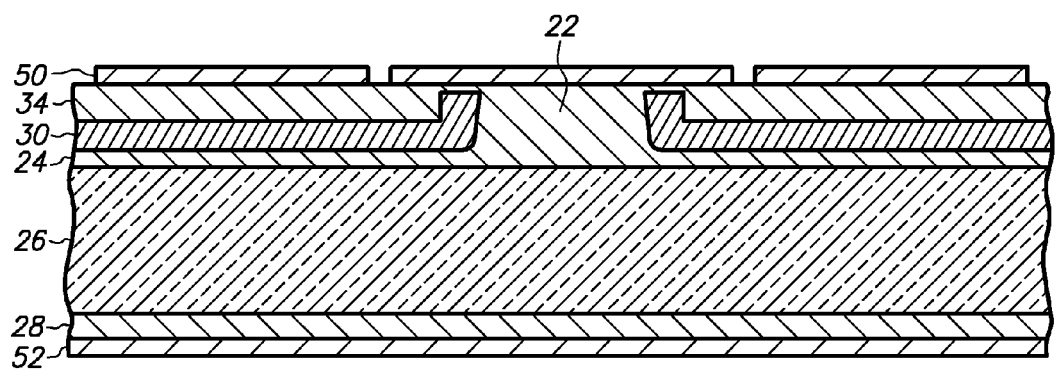
FIG. 4H1
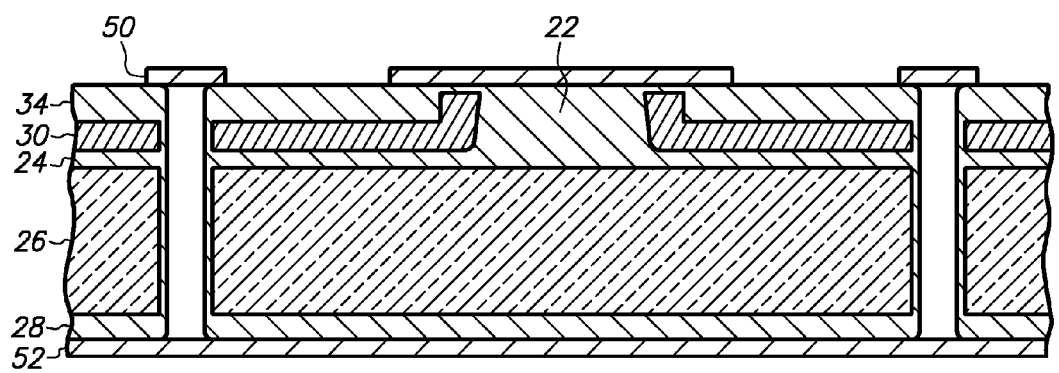
FIG. 4H2

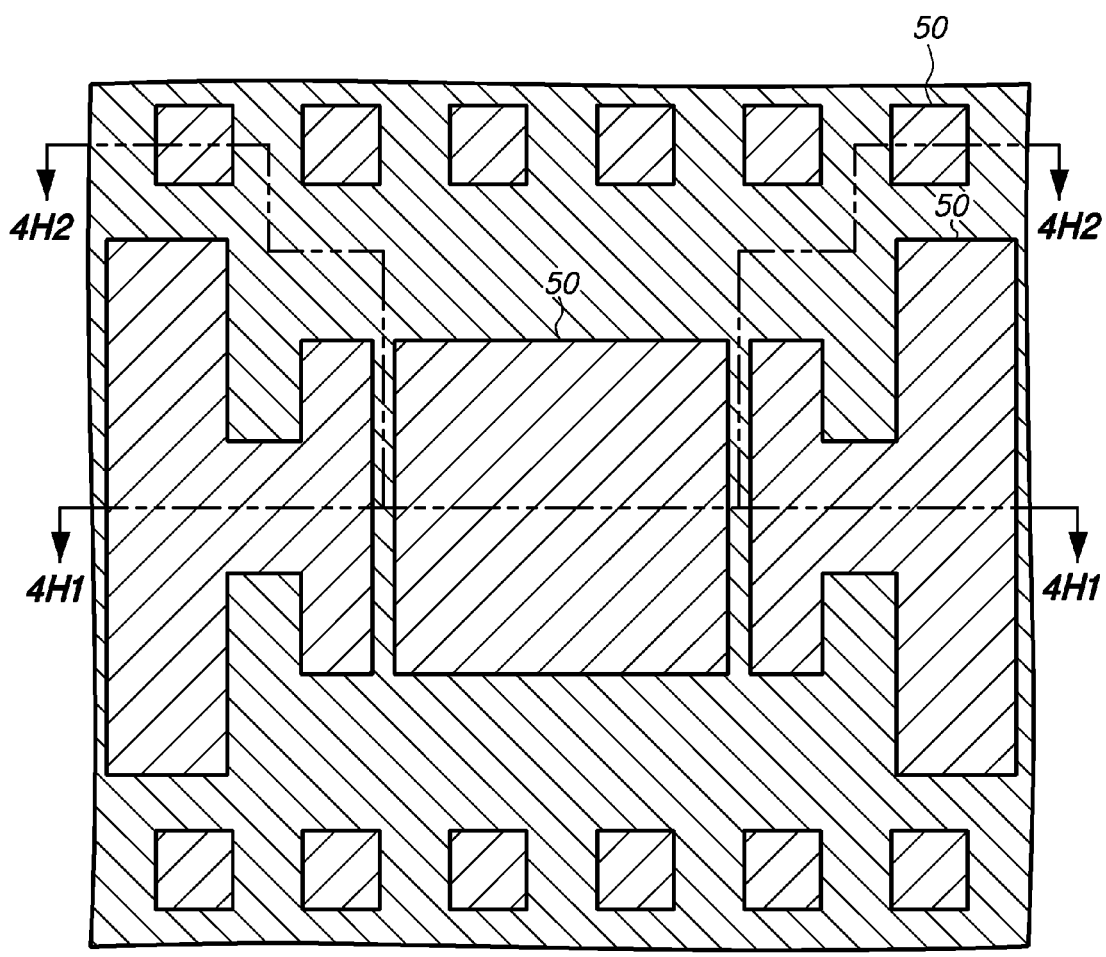
FIG. 4H3

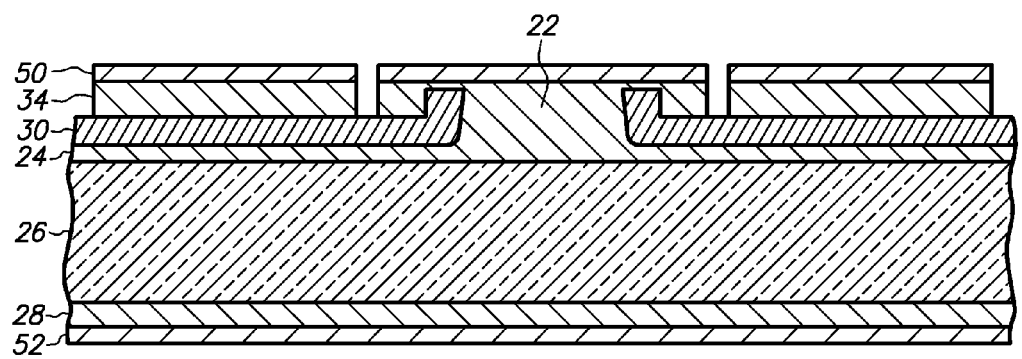
FIG. 4I1
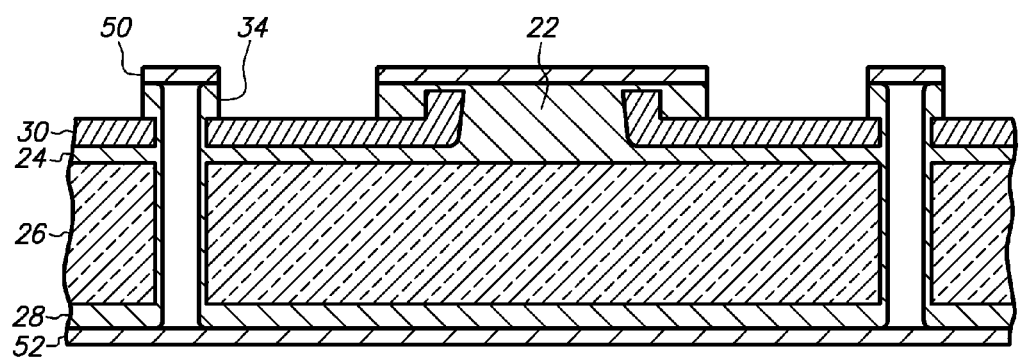
FIG. 4I2

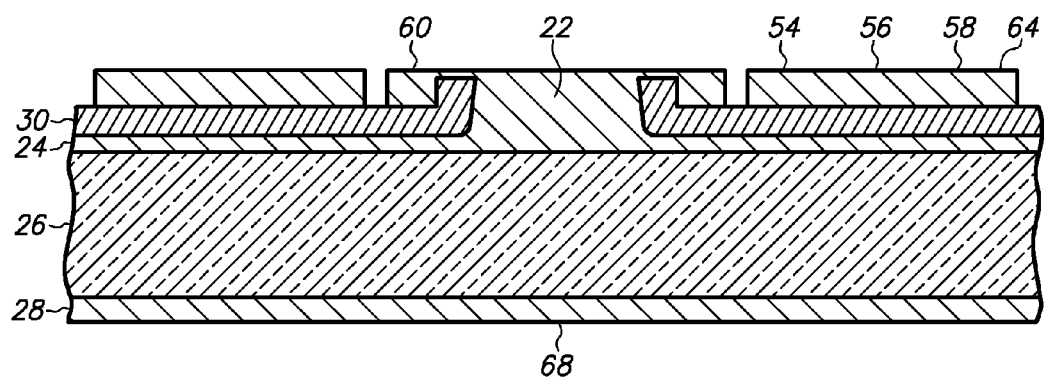
FIG. 4J1
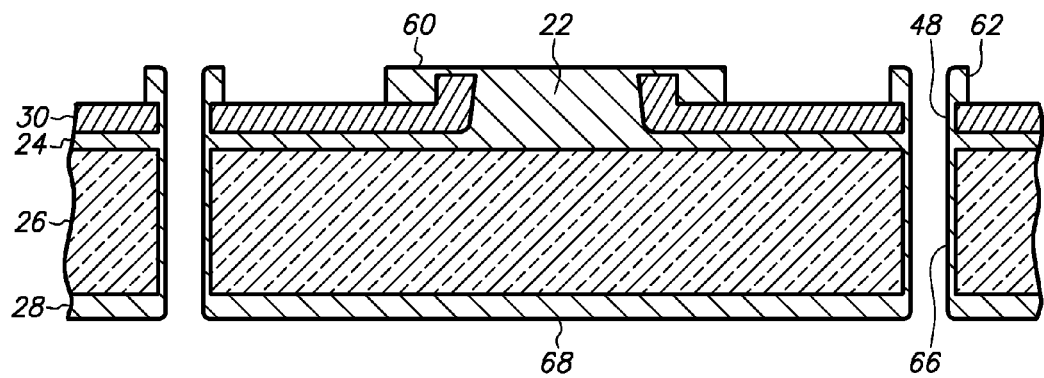
FIG. 4J2

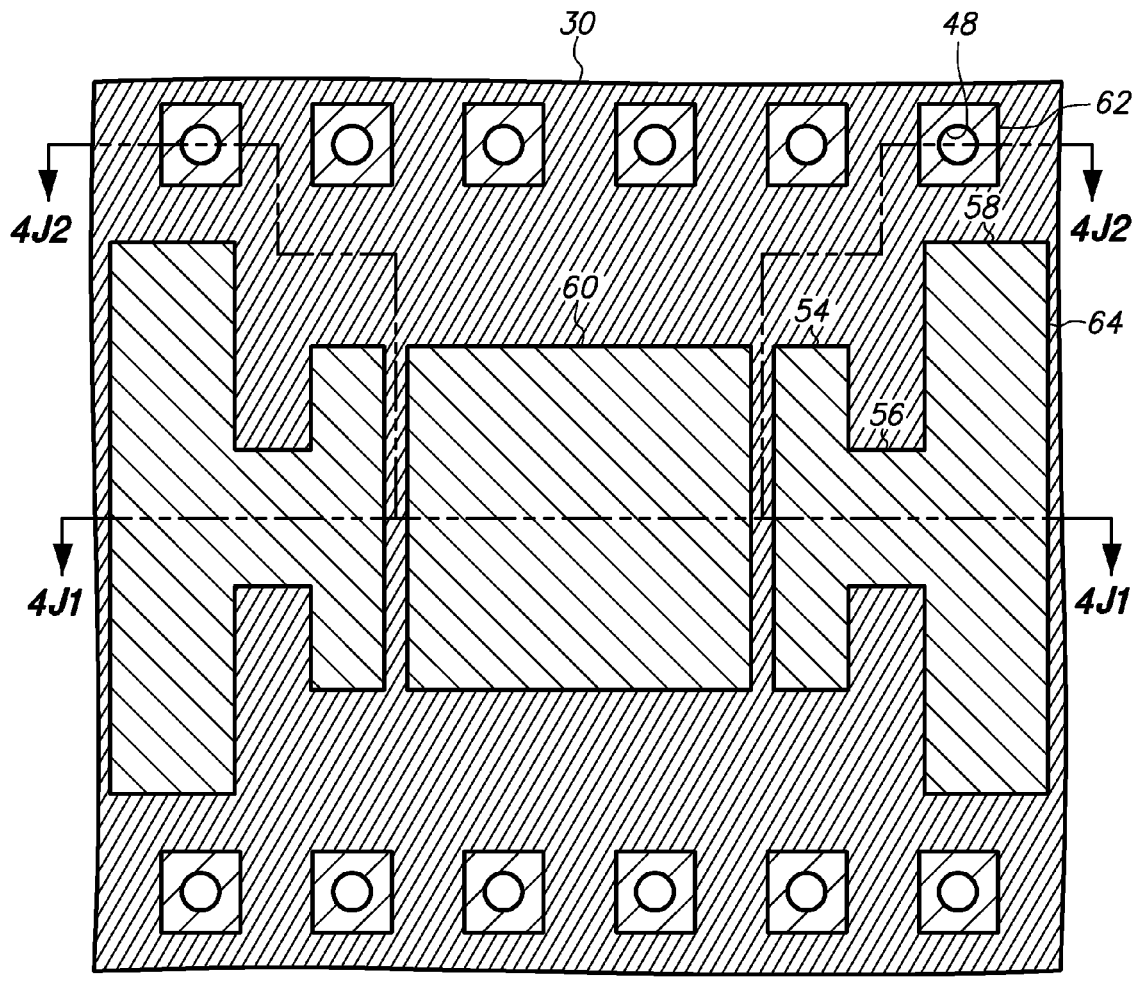
FIG. 4J3

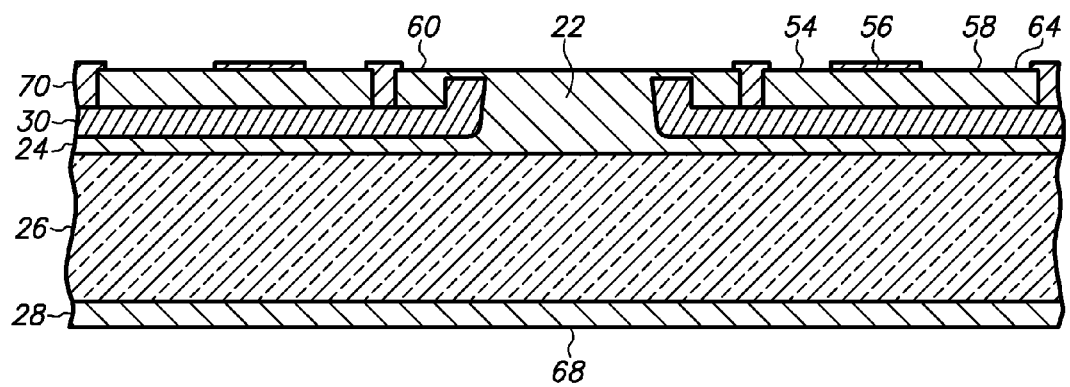
*FIG. 4K1*
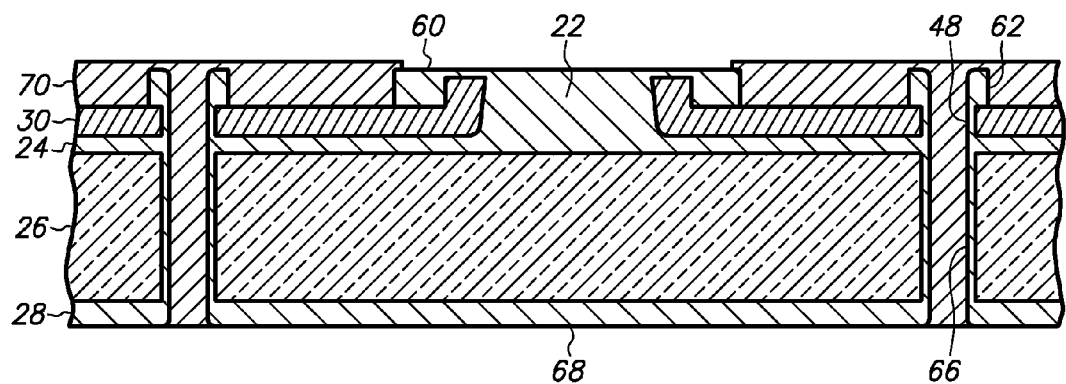
*FIG. 4K2*

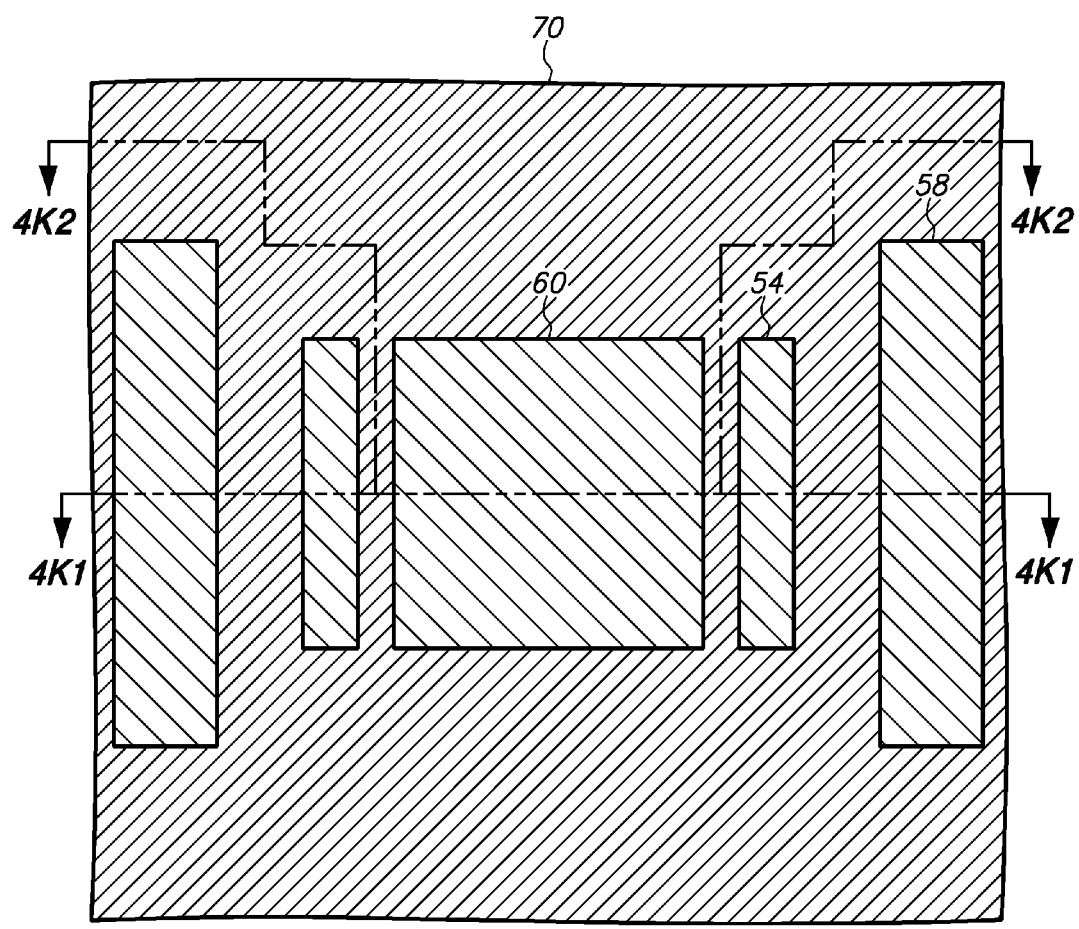
FIG. 4K3

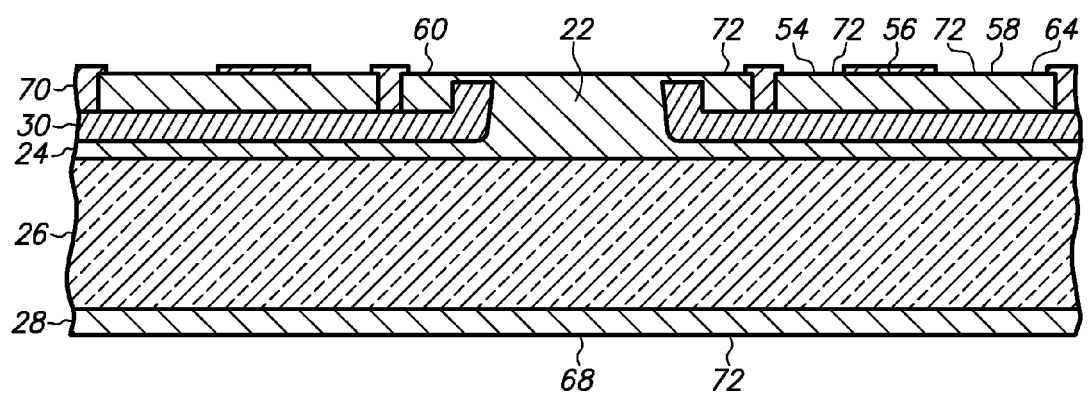
FIG. 4L1
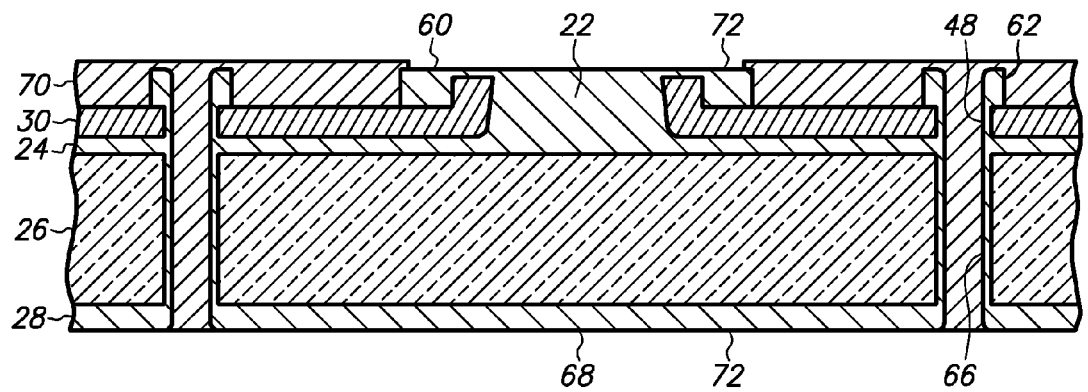
FIG. 4L2

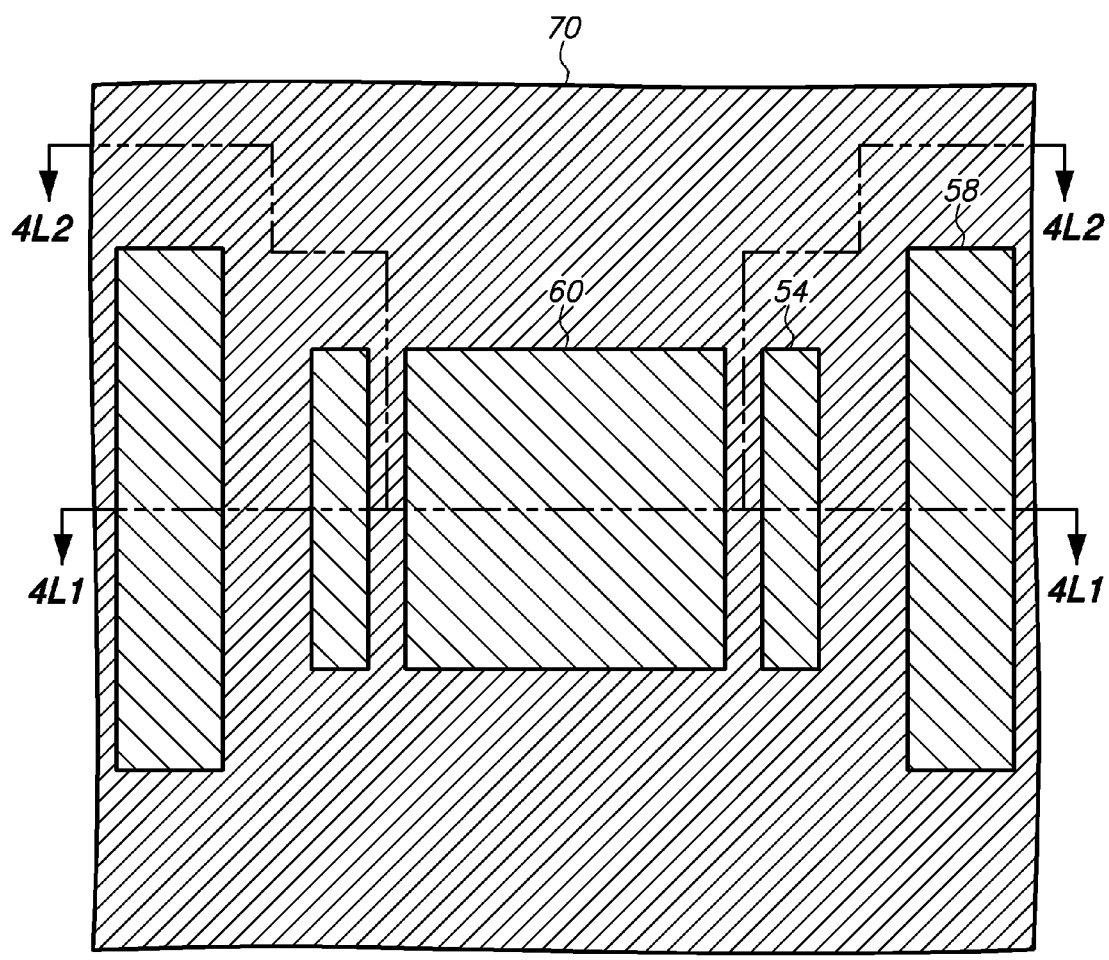
FIG. 4L3

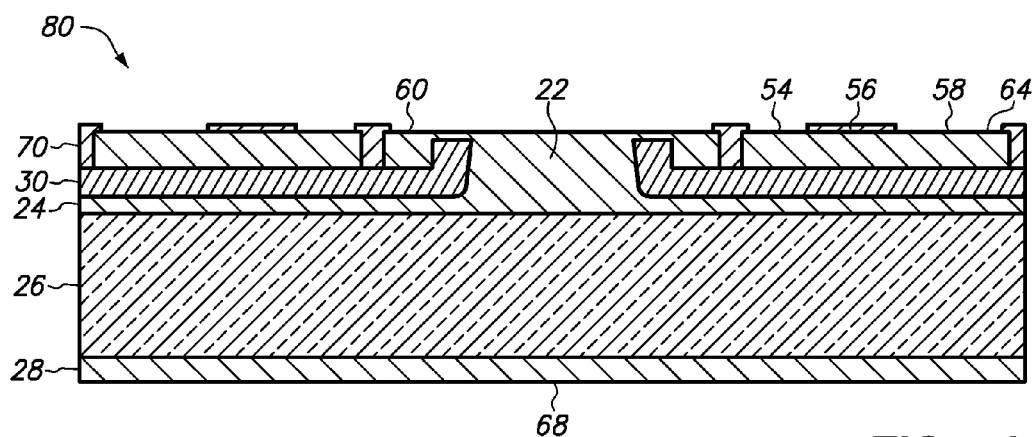
FIG. 4M1
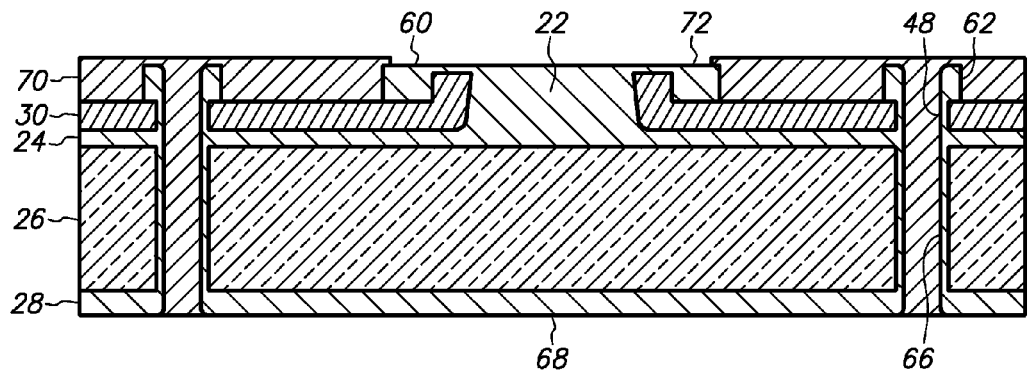
FIG. 4M2

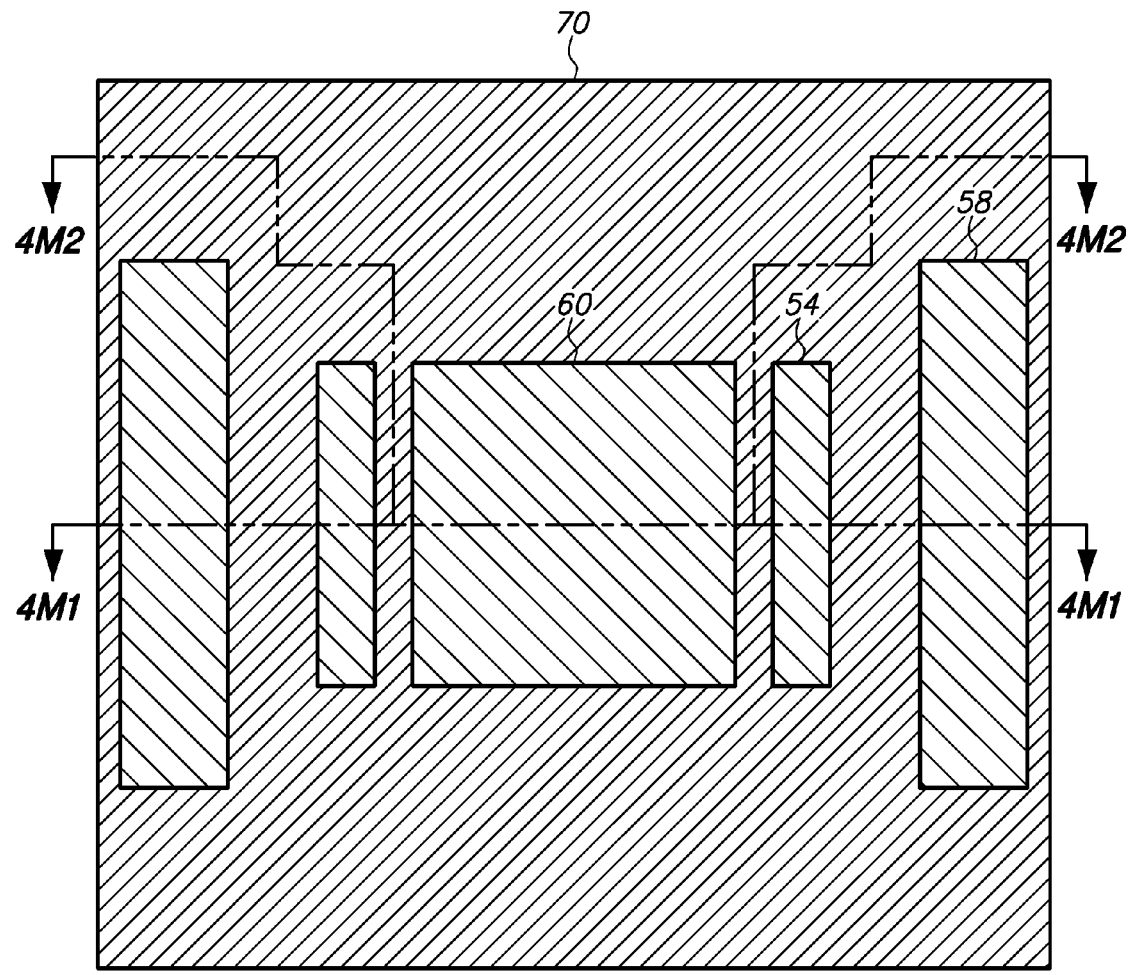
FIG. 4M3

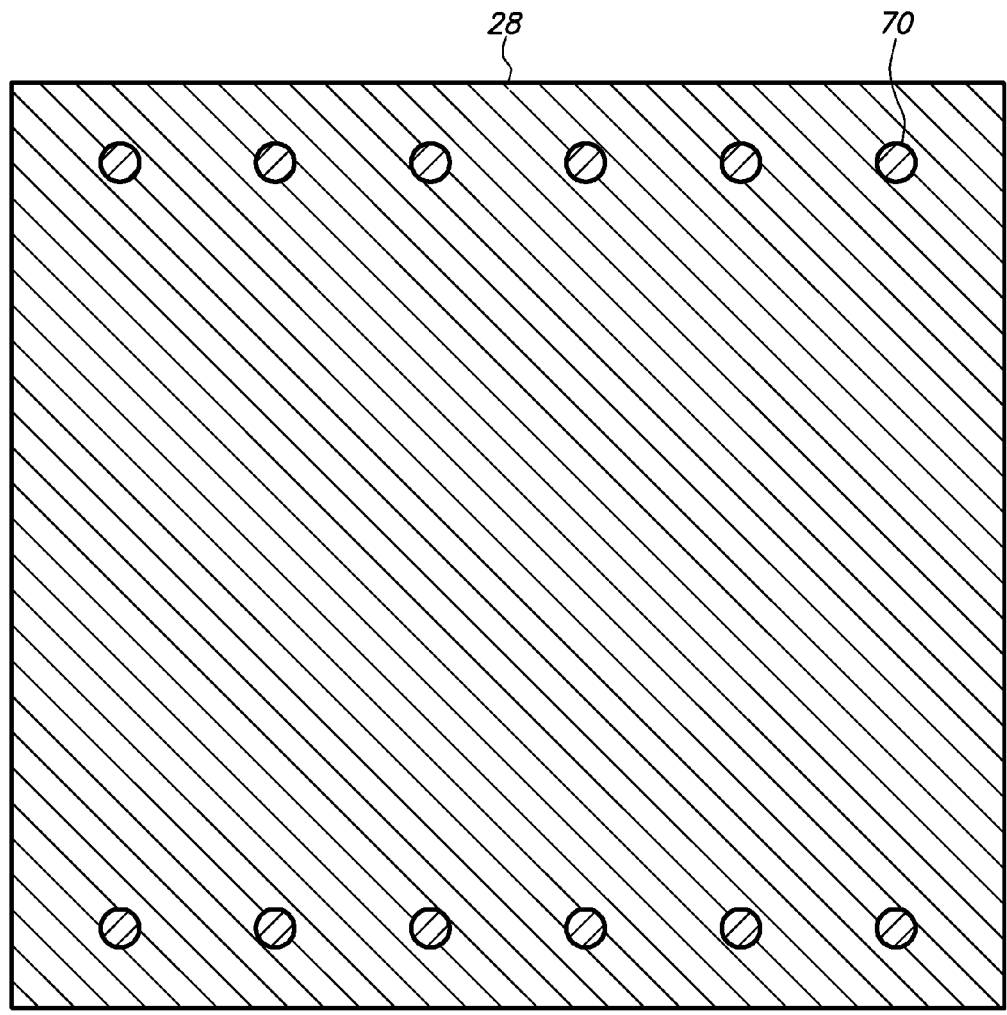
FIG. 4M4

METHOD OF MAKING A SEMICONDUCTOR CHIP ASSEMBLY WITH A POST/BASE HEAT SPREADER WITH A THERMAL VIA

CROSS-REFERENCE TO RELATED APPLICATIONS

This application is a divisional of U.S. application Ser. No. 13/111,966 filed May 20, 2011, which is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009, each of which is incorporated by reference. U.S. application Ser. No. 13/111,966 filed May 20, 2011 also claims the benefit of U.S. Provisional Application Ser. No. 61/429,142 filed Jan. 2, 2011, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive, a support layer and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace, an adhesive and a support layer. The heat spreader includes a post, a base, an underlayer and a thermal via. The conductive trace includes a pad and a terminal. The semiconductor device is electrically connected to the conductive trace and thermally connected to the heat spreader. The post extends upwardly from the base into an opening in the adhesive, the base extends laterally from the post, the support layer is sandwiched between the base and the underlayer and the thermal via extends from the base through the support layer to the underlayer. The conductive trace provides signal routing between the pad and the terminal.

In accordance with an aspect of the present invention, a semiconductor chip assembly includes a semiconductor device, an adhesive, a heat spreader, a conductive trace and a support layer. The adhesive includes an opening. The heat spreader includes a post, a base, an underlayer and a thermal via, wherein (i) the post is adjacent to the base and extends above the base in an upward direction, (ii) the base covers the post in a downward direction opposite the upward direction, extends laterally from the post in lateral directions orthogonal to the upward and downward directions and is sandwiched between the post and the underlayer, (iii) the underlayer extends below and is spaced from the base, covers the post in the downward direction and extends laterally beyond the post, and (iv) the thermal via extends from the base to the underlayer, is spaced from and laterally offset from the post and provides a thermally conductive path between the base and the underlayer. The conductive trace includes a pad and a terminal.

The semiconductor device overlaps the post, the base, the support layer and the underlayer, is electrically connected to the pad and thereby electrically connected to the terminal and is thermally connected to the post and thereby thermally connected to the underlayer. The adhesive is mounted on and extends above the base, covers the post in the downward direction extends laterally from the post to or beyond the terminal and is sandwiched between the base and the pad. The support layer is sandwiched between the base and the underlayer and extends laterally beyond the post. The post extends into the opening, the base is sandwiched between the adhesive and the support layer, the thermal via extends through the support layer and the underlayer extends below the semiconductor device, the support layer and the pad.

In accordance with another aspect of the present invention, a semiconductor chip assembly includes a semiconductor device, an adhesive, a heat spreader, a conductive trace and a support layer. The adhesive includes an opening. The heat spreader includes a post, a base, a cap, an underlayer and a thermal via, wherein (i) the post is adjacent to and integral with the base and extends above the base in an upward direction, (ii) the base covers the post in a downward direction opposite the upward direction, extends laterally from the post in lateral directions orthogonal to the upward and downward directions and is sandwiched between the post and the underlayer, (iii) the cap extends above and is adjacent to and covers in the upward direction and extends laterally from a top of the post, (iv) the underlayer extends below and is spaced from the base and extends laterally beyond the post, and (v) the thermal via extends from the base to the underlayer, is spaced from and laterally offset from the post and the cap and provides a thermally conductive path between the base and the underlayer. The conductive trace includes a pad and a terminal.

The semiconductor device is mounted on the cap, overlaps the post, the base, the cap, the support layer and the underlayer, is electrically connected to the pad and thereby electrically connected to the terminal and is thermally connected to the cap and thereby thermally connected to the underlayer. The adhesive is mounted on and extends above the base, extends laterally from the post to or beyond the terminal and is sandwiched between the base and the pad. The support layer is sandwiched between the base and the underlayer, covers the post in the downward direction and extends laterally beyond the post. The post extends into the opening, the base is sandwiched between the adhesive and the support layer, the cap overlaps the adhesive, the thermal via extends through the support layer and the underlayer extends below the semiconductor device, the support layer and the pad. Furthermore, the post, the base, the cap and the underlayer are metallic and the support layer is non-metallic.

In accordance with another aspect of the present invention, a semiconductor chip assembly includes a semiconductor device, an adhesive, a heat spreader, a conductive trace, a substrate and a support layer. The adhesive includes an opening. The heat spreader includes a post, a base, a cap, an underlayer and a thermal via, wherein (i) the post is adjacent to and integral with the base and extends above the base in an upward direction, (ii) the base covers the post in a downward direction opposite the upward direction, extends laterally from the post in lateral directions orthogonal to the upward and downward directions and is sandwiched between the post and the underlayer, (iii) the cap extends above and is adjacent to and covers in the upward direction and extends laterally from a top of the post, (iv) the underlayer extends below and is spaced from the base, covers the post in the downward direction and extends laterally beyond the post, and (v) the thermal via includes a plated through-hole that extends from the base to the underlayer, is metallurgically bonded to the base and the underlayer and provides a thermally conductive path between the base and the underlayer and the thermal via is spaced from and laterally offset from the post and the cap and provides no electrical function. The substrate includes a dielectric layer, wherein an aperture extends through the substrate. The conductive trace includes a pad, a terminal and a routing line, wherein the routing line provides an electrically conductive path between the pad and the terminal.

The semiconductor device is mounted on the cap, overlaps the post, the base, the cap, the support layer and the underlayer, is electrically connected to the pad and thereby electrically connected to the terminal and is thermally connected to the cap, thereby thermally connected to the post, thereby thermally connected to the base, thereby thermally connected to the thermal via and thereby thermally connected to the underlayer. The adhesive is mounted on and extends above the base, contacts the post, the base, the cap and the thermal via, is spaced from the support layer and the underlayer, extends laterally from the post to or beyond the terminal and is sandwiched between the post and the dielectric layer, between the base and the dielectric layer, between the base and the pad and between the base and the terminal. The substrate is mounted on the adhesive and extends above the base and the dielectric layer is sandwiched between the conductive trace and the adhesive. The support layer is sandwiched between the base and the underlayer, covers the post in the downward direction and extends laterally beyond the post. The pad, the terminal and the routing line are mounted on the dielectric layer and extend above the adhesive and the dielectric layer. The post extends into the opening and the aperture and extends above and below the aperture, the base is sandwiched between the adhesive and the support layer and extends below the adhesive and the dielectric layer, the cap contacts and overlaps the adhesive and the dielectric layer, the plated through-hole extends through the base, the adhesive, the dielectric layer and the support layer and the underlayer extends below the semiconductor device, the support layer and the conductive trace. Furthermore, the post, the base, the cap and the underlayer are metallic and the support layer is non-metallic.

The cap can have a rectangular or square shape and the top of the post can have a circular shape. In this instance, the cap can be sized and shaped to accommodate a thermal contact surface of the semiconductor device whereas the top of the post is not sized and shaped to accommodate the thermal contact surface of the semiconductor device. The cap can also contact and cover a portion of the adhesive that is coplanar with and adjacent to the post. The cap can also contact and overlap the dielectric layer. In addition, the cap is thermally connected to the underlayer by the post, the base and the thermal via.

The heat spreader can consist of the post, the base, the cap, the underlayer and multiple thermal vias. The heat spreader can also consist essentially of copper, aluminum or copper/nickel/aluminum. The heat spreader can also include a buried copper core shared by the post, the base, the cap, the underlayer and thermal via and plated surface contacts that consist of gold, silver and/or nickel at the cap and the underlayer. In any case, the heat spreader provides heat dissipation and spreading from the semiconductor device to the next level assembly.

The semiconductor device can be mounted on the heat spreader and the conductive trace. For instance, the semiconductor device can be mounted on and overlap the post and the pad, be electrically connected to the pad using a first solder joint and be thermally connected to the heat spreader using a second solder joint. Alternatively, the semiconductor device can be mounted on and overlap the post but not the conductive trace, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the cap and the pad, overlaps the post and the pad, is electrically connected to the pad using a first solder joint and is thermally connected to the cap using a second solder joint. Alternatively, the semiconductor device can be a semiconductor chip such as an LED chip that is mounted on the cap but not the pad, overlaps the post but not the pad, is electrically connected to the pad using a wire bond and is thermally connected to the cap using a die attach.

The adhesive can contact the post and the dielectric layer in a gap in the aperture between the post and the substrate, extend across the dielectric layer in the gap, contact the post, the base, the cap, the thermal via and the dielectric layer outside the gap and be spaced from the support layer and the underlayer. The adhesive can also contact or be spaced from the pad, the terminal and the routing line. The adhesive can also cover and surround the post in the lateral directions and cover the cap outside the post in the downward direction. The adhesive can also conformally coat the sidewalls of the post. The adhesive can also fill the space between the post and the dielectric layer and between the base and the substrate.

The adhesive can extend laterally from the post to or beyond the terminal. For instance, the adhesive and the terminal can extend to peripheral edges of the assembly. In this instance, the adhesive extends laterally from the post to the terminal. Alternatively, the adhesive can extend to peripheral edges of the assembly and the terminal can be spaced from the peripheral edges of the assembly. In this instance, the adhesive extends laterally from the post beyond the terminal.

The adhesive alone can intersect an imaginary horizontal line between the post and the thermal via, an imaginary horizontal line between the post and the dielectric layer, an imaginary horizontal line between the post and a peripheral edge of the assembly and an imaginary vertical line between the base and the cap. The adhesive alone can also intersect an imaginary vertical line between the base and the pad and an imaginary vertical line between the base and the terminal if the dielectric layer is omitted, otherwise the adhesive alone can intersect an imaginary vertical line between the base and the dielectric layer.

The post can be integral with the base. For instance, the post and the base can be a single-piece metal or include a single-piece metal at their interface, and the single-piece metal can be copper. The post can also be coplanar with the adhesive above the dielectric layer at the cap and below the dielectric layer at the base. The post can also have a cut-off conical or pyramidal shape in which its diameter decreases as it extends upwardly from the base to its top at the cap.

The base can cover the post, the cap and the conductive trace in the downward direction, support the adhesive, the substrate and the conductive trace and extend to or be spaced from the peripheral edges of the assembly.

The support layer can cover the post, the cap and the conductive trace in the downward direction, support the base, the adhesive, the substrate and the conductive trace and extend to or be spaced from the peripheral edges of the assembly. The support layer can also be thicker than the pad, the terminal, the base, the cap and the underlayer.

The support layer can be sandwiched between the base and the underlayer. For instance, the support layer can contact and be sandwiched between the base and the underlayer. In this instance, the thermal via extends from the base through the support layer alone to the underlayer. Alternatively, the support layer can contact and be sandwiched between a second adhesive and the underlayer, wherein the second adhesive contacts and is sandwiched between base and the support layer. In this instance, the thermal via extends from the base through the support layer and the second adhesive to the underlayer. Furthermore, the support layer and the underlayer can be a single-sided copper clad laminate attached to the base by the second adhesive. As another alternative, the support layer can contact and be sandwiched between a metal layer and the underlayer, wherein a second adhesive contacts and is sandwiched between base and the metal layer and the metal layer contacts and is sandwiched between the support layer and the second adhesive. In this instance, the thermal via extends from the base through the support layer, the metal layer and the second adhesive to the underlayer. Furthermore, the support layer, the metal layer and the underlayer can be a double-sided copper clad laminate attached to the base by the second adhesive. In any case, the support layer is sandwiched between the base and the underlayer and the thermal via extends from the base through the support layer to the underlayer.

The support layer can be various electrically insulative organic or inorganic materials such as epoxy or polyimide. The support layer can also include a reinforcement such as E-glass to increase strength and a filler such as aluminum oxide or aluminum nitride to increase thermal conductivity. The support layer can also be primarily plastic.

The underlayer can cover the post, the cap and the conductive trace in the downward direction and extend to or be spaced from the peripheral edges of the assembly.

The thermal via can include a plated through-hole that is metallurgically bonded to the base and the underlayer, contacts the adhesive, the dielectric layer and the support layer, extends through the base, the adhesive, the dielectric layer and the support layer and is spaced from and laterally offset from the post, the cap and the conductive trace. The thermal via can also include a stub that is metallurgically bonded to the plated through-hole and located above the base. The thermal via can also extend above the post and the adhesive and be coplanar with the pad, the terminal and/or the routing line above the post and the adhesive and have no electrical function. Furthermore, the stub and the plated through-hole above the base can have no thermal function.

The substrate can be spaced from the heat spreader. The substrate can also be a laminated structure.

The conductive trace can contact or be spaced from the adhesive. For instance, the conductive trace can contact and extend above the adhesive and the adhesive can contact and be sandwiched between the conductive trace and the base. In this instance, the dielectric layer is omitted. Alternatively, the conductive trace can contact and extend above the dielectric layer and be spaced from the adhesive and the dielectric layer can contact and be sandwiched between the adhesive and the base.

The conductive trace can include a routing line that extends above the base, the adhesive, the dielectric layer and the support layer in an electrically conductive path between the pad and the terminal Likewise, the conductive trace can include a plated through-hole that extends through the base, the adhesive, the dielectric layer and the support layer in an electrically conductive path between the pad and the terminal. For instance, the pad can extend above the base, the adhesive, the dielectric layer and the support layer, the terminal can extend below the base, adhesive, the dielectric layer and the support layer and the plated through-hole can extend through the base, the adhesive, the dielectric layer and the support layer and electrically connect the pad and the terminal Likewise, the pad and the routing line can extend above the base, the adhesive, the dielectric layer and the support layer, the terminal can extend below the base, the adhesive, the dielectric layer and the support layer and the plated through-hole can extend through the base, the adhesive, the dielectric layer and the support layer and electrically connect the routing line and the terminal.

The pad and the terminal can have the same thickness and be coplanar with one another at a top surface that faces in the upward direction. Furthermore, the pad and the cap can have the same thickness where closest to one another, have different thickness where the cap is adjacent to the post and be coplanar with one another at a top surface that faces in the upward direction. Moreover, the terminal and the underlayer have the same thickness and be coplanar with one another at a bottom surface that faces in the downward direction.

The conductive trace can consist of the pad, the terminal and the routing line. The conductive trace can also consist of the pad, the terminal and the plated through-hole. The conductive trace can also consist of the pad, the terminal, the routing line and the plated through-hole. The conductive trace can also consist essentially of copper. The conductive trace can also include a buried copper core and plated surface contacts that consist of gold, silver and/or nickel at the pad and the terminal. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The cap can be a thermal contact for the semiconductor device, the underlayer can be a thermal contact for the next level assembly, and the cap and the underlayer can provide thermal routing between the semiconductor device and the next level assembly.

The pad, the terminal, the cap and the underlayer can be the same metals and the post and the base can be the same metal. For instance, the pad, the terminal, the cap and the underlayer can include a gold, silver or nickel surface layer and a buried copper core and be primarily copper, the post and the base can be copper and the routing line and the thermal via can include or be copper. In this instance, a plated contact can include a gold or silver surface layer and a buried nickel layer that contacts and is sandwiched between the surface layer and the buried copper core or a nickel surface layer that contacts the buried copper core.

The heat spreader can include a copper core shared by the post, the base, the cap, the underlayer and thermal via and the conductive trace can include a copper core shared by the pad, the terminal and the routing line. For instance, the heat spreader can include a gold, silver or nickel surface layer at the cap and the underlayer and a buried copper core at the post, the base, the cap, the underlayer and the thermal via and be primarily copper. In this instance, the cap can include a plated contact as its surface layer and the underlayer can include a plated contact as its surface layer. Likewise, the conductive trace can include a gold, silver or nickel surface layer at the pad and the terminal, a buried copper core at the pad, the terminal and the routing line and be primarily copper. In this instance, the pad can include a plated contact as its surface layer and the terminal can include a plated contact as its surface layer.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post, a base, a support layer and an underlayer, wherein the post extends above the base and the support layer is sandwiched between the base and the underlayer, mounting an adhesive on the base including inserting the post into an opening in the adhesive, mounting a conductive layer on the adhesive including aligning the post with an aperture in the conductive layer, then flowing the adhesive upward between the post and the conductive layer, solidifying the adhesive, then providing a conductive trace that includes a pad, a terminal and a selected portion of the conductive layer, providing a heat spreader that includes the post, the base, the underlayer and a thermal via that extends from the base through the support layer to the underlayer, then mounting a semiconductor device on the post, electrically connecting the semiconductor device to the conductive trace and thermally connecting the semiconductor device to the heat spreader.

In accordance with an aspect of the present invention, a method of making a semiconductor chip assembly includes (1) providing a post, a base, a support layer, an underlayer, a conductive layer and an adhesive, wherein (a) the post is adjacent to the base, extends above the base in an upward direction, extends into an opening in the adhesive and is aligned with an aperture in the conductive layer, (b) the base extends below the post in a downward direction opposite the upward direction, extends laterally from the post in lateral directions orthogonal to the upward and downward directions and is sandwiched between the adhesive and the support layer, (c) the conductive layer is mounted on and extends above the adhesive, (d) the adhesive is sandwiched between the base and the conductive layer and is non-solidified, (e) the support layer is sandwiched between the base and the underlayer, and (f) the underlayer extends below the support layer, then (2) flowing the adhesive into and upward in a gap located in the aperture between the post and the conductive layer, (3) solidifying the adhesive, then (4) providing a conductive trace that includes a pad, a terminal and a selected portion of the conductive layer, (5) providing a thermal via that extends from the base through the support layer to the underlayer and provides a thermally conductive path between the base and the underlayer, (6) providing a heat spreader that includes the post, the base, the underlayer and the thermal via, then (7) mounting a semiconductor device on the post, wherein the semiconductor device overlaps the post, the base, the support layer and the underlayer and the underlayer covers the post in the downward direction, (8) electrically connecting the semiconductor device to the pad, thereby electrically connecting the semiconductor device to the terminal, and (9) thermally connecting the semiconductor device to the post, thereby thermally connecting the semiconductor device to the underlayer.

In accordance with another aspect of the present invention, a method of making a semiconductor chip assembly includes (1) providing a post, a base, a support layer and an underlayer, wherein (a) the post is adjacent to and integral with the base and extends above the base in an upward direction, (b) the base extends below the post in a downward direction opposite the upward direction and extends laterally from the post in lateral directions orthogonal to the upward and downward directions, (c) the support layer is sandwiched between the base and the underlayer and (d) the underlayer extends below the support layer, (2) providing an adhesive, wherein an opening extends through the adhesive, (3) providing a conductive layer, wherein an aperture extends through the conductive layer, (4) mounting the adhesive on the base, including inserting the post into the opening, wherein the adhesive extends above the base and the post extends into the opening, (5) mounting the conductive layer on the adhesive, including aligning the post with the aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer, (8) applying heat to solidify the molten adhesive, thereby mechanically attaching the post and the base to the conductive layer, then (9) providing a conductive trace that includes a pad, a terminal and a selected portion of the conductive layer, (10) providing a cap that extends above and is adjacent to and covers in the upward direction and extends laterally from a top of the post, (11) providing a thermal via that provides a thermally conductive path between the base and the underlayer, including providing a plated through-hole that extends from the base through the support layer to the underlayer, (12) providing a heat spreader that includes the post, the base, the cap, the underlayer and the thermal via, then (13) mounting a semiconductor device on the cap, wherein the semiconductor device overlaps the post, the base, the cap, the support layer and the underlayer and the underlayer covers the post in the downward direction, (14) electrically connecting the semiconductor device to the pad, thereby electrically connecting the semiconductor device to the terminal, and (15) thermally connecting the semiconductor device to the cap, thereby thermally connecting the semiconductor device to the underlayer.

In accordance with another aspect of the present invention, a method of making a semiconductor chip assembly includes (1) providing a post, a base, a support layer and an underlayer, wherein (a) the post is adjacent to and integral with the base and extends above the base in an upward direction, (b) the base extends below the post in a downward direction opposite the upward direction and extends laterally from the post in lateral directions orthogonal to the upward and downward directions, (c) the support layer is sandwiched between the base and the underlayer and is non-metallic and is solidified and (d) the underlayer extends below the support layer, (2) providing an adhesive, wherein an opening extends through the adhesive, (3) providing a conductive layer, wherein an aperture extends through the conductive layer, (4) mounting the adhesive on the base, including inserting the post into the opening, wherein the adhesive extends above the base and the post extends into the opening, (5) mounting the conductive layer on the adhesive, including aligning the post with the aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer, (8) applying heat to solidify the molten adhesive, thereby mechanically attaching the post and the base to the conductive layer, then (9) providing a conductive trace that includes a pad, a terminal and a routing line, wherein the pad, the terminal and the routing line include a selected portion of the conductive layer and the routing line provides an electrically conductive path between the pad and the terminal, (10) providing a cap that extends above and is adjacent to and covers in the upward direction and extends laterally from a top of the post and includes a selected portion of the conductive layer, (11) providing a thermal via that provides a thermally conductive path between the base and the underlayer and includes a selected portion of the conductive layer, including providing a plated through-hole that extends from the conductive layer through the adhesive to the base and from the base through the support layer to the underlayer, (12) providing a heat spreader that includes the post, the base, the cap, the underlayer and the thermal via, then (13) mounting a semiconductor device on the cap, wherein the semiconductor device overlaps the post, the base, the cap, the support layer and the underlayer and the underlayer covers the post in the downward direction, (14) electrically connecting the semiconductor device to the pad, thereby electrically connecting the semiconductor device to the terminal, and (15) thermally connecting the semiconductor device to the cap, thereby thermally connecting the semiconductor device to the post, thereby thermally connecting the semiconductor device to the base, thereby thermally connecting the semiconductor device to the thermal via and thereby thermally connecting the semiconductor device to the underlayer.

Providing the post, the base, the support layer and the underlayer can include providing a metal plate, attaching the support layer and the underlayer to the metal plate and then providing the post and the base by etching the metal plate.

Attaching the support layer and the underlayer to the metal plate can include laminating the metal plate to the underlayer using the support layer or depositing the support layer on the metal plate and then depositing the underlayer on the support layer. For instance, uncured epoxy or polyimide filled with aluminum oxide or aluminum nitride can be sandwiched between the metal plate and the underlayer and then cured, thereby laminating the metal plate to the underlayer. Alternatively, diamond-like carbon (DLC) can be deposited on the metal plate by vacuum coating or spray coating and then the underlayer can be deposited on the DLC by sputtering or electroless plating and then electroplating.

Providing the post and the base can include forming an etch mask on the metal plate that selectively exposes the metal plate and defines the post, etching the metal plate in a pattern defined by the etch mask, thereby forming a recess in the metal plate that extends into but not through the metal plate, wherein the post is an unetched portion of the metal plate that protrudes above the base and is laterally surrounded by the recess and the base is an unetched portion of the metal plate below the post and the recess and then removing the etch mask.

Providing the adhesive can include providing a prepreg with uncured epoxy, flowing the adhesive can include melting the uncured epoxy and compressing the uncured epoxy between the base and the conductive layer, and solidifying the adhesive can include curing the molten uncured epoxy.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace. As another alternative, mounting the conductive layer can include mounting the conductive layer and a dielectric layer on the adhesive such that the conductive layer overlaps the dielectric layer and is spaced from the adhesive, the dielectric layer contacts and is sandwiched between the conductive layer and the adhesive and the aperture extends through the conductive layer and the dielectric layer.

Providing the heat spreader can include providing a cap on the post that extends above and is adjacent to and covers in the upward direction and extends laterally from a top of the post and that contacts and overlaps the adhesive, is spaced from and overlaps the base, the support layer and the underlayer, is spaced from the conductive trace and includes a selected portion of the conductive layer after solidifying the adhesive and before mounting the semiconductor device.

Providing the pad can include removing selected portions of the conductive layer after solidifying the adhesive. The removing can include applying a wet chemical etch to the conductive layer using an etch mask that defines the pad such that the pad includes a selected portion of the conductive layer.

Providing the terminal can include removing selected portions of the conductive layer after solidifying the adhesive. The removing can include applying a wet chemical etch to the conductive layer using an etch mask that defines the terminal such that the terminal includes a selected portion of the conductive layer.

Providing the cap can include removing selected portions of the conductive layer after solidifying the adhesive. The removing can include applying a wet chemical etch to the conductive layer using an etch mask that defines the cap such that the cap includes a selected portion of the conductive layer.

Providing the pad and the terminal can include removing selected portions of the conductive layer using an etch mask that defines the pad and the terminal. Thus, the pad and the terminal can be formed simultaneously using the same etch mask and wet chemical etch. Likewise, providing the pad and the cap can include removing selected portions of the conductive layer using an etch mask that defines the pad and the cap. Thus, the pad and the cap can be formed simultaneously using the same etch mask and wet chemical etch Likewise, providing the pad, the terminal and the cap can include removing selected portions of the conductive layer using an etch mask that defines the pad, the terminal and the cap. Thus, the pad, the terminal and the cap can be formed simultaneously using the same etch mask and wet chemical etch.

Providing the terminal can include removing selected portions of the underlayer after solidifying the adhesive. The removing can include applying a wet chemical etch to the underlayer using an etch mask that defines the terminal such that the terminal includes a selected portion of the underlayer that is spaced and separated from and no longer part of the underlayer.

Providing the underlayer can include removing selected portions of the underlayer after solidifying the adhesive. The removing can include applying a wet chemical etch to the underlayer using an etch mask that defines a smaller portion of the underlayer such that the underlayer is trimmed.

Providing the terminal and the underlayer can include removing selected portions of the underlayer using an etch mask that defines the terminal and the underlayer. Thus, the terminal and the underlayer can be formed simultaneously using the same etch mask and wet chemical etch.

Providing the pad can include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the pad includes a selected portion of the conductive layer. The grinding can include grinding the adhesive without grinding the post and then grinding the post, the adhesive and the conductive layer. The removing can include applying a wet chemical etch to the conductive layer using an etch mask that defines the pad.

Providing the terminal can include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the terminal includes a selected portion of the conductive layer. The grinding can include grinding the adhesive without grinding the post and then grinding the post, the adhesive and the conductive layer. The removing can include applying a wet chemical etch to the conductive layer using an etch mask that defines the terminal.

Providing the cap can include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the cap includes a selected portion of the conductive layer. The grinding can include grinding the adhesive without grinding the post and then grinding the post, the adhesive and the conductive layer. The removing can include applying a wet chemical etch to the conductive layer using an etch mask that defines the cap.

Providing the pad can include depositing a plated layer on the post, the adhesive and the conductive layer after the grinding and then removing selected portions of the conductive layer and the plated layer such that the pad includes selected portions of the conductive layer and the plated layer. Depositing the plated layer can include electrolessly plating a first plated layer on the post, the adhesive and the conductive layer and then electroplating a second plated layer on the first plated layer. The removing can include applying the wet chemical etch to the conductive layer and the plated layer using the etch mask to define the pad.

Providing the terminal can include depositing a plated layer on the post, the adhesive and the conductive layer after the grinding and then removing selected portions of the conductive layer and the plated layer such that the terminal includes selected portions of the conductive layer and the plated layer. Depositing the plated layer can include electroles sly plating a first plated layer on the post, the adhesive and the conductive layer and then electroplating a second plated layer on the first plated layer. The removing can include applying the wet chemical etch to the conductive layer and the plated layer using the etch mask to define the terminal.

Providing the cap can include depositing a plated layer on the post, the adhesive and the conductive layer after the grinding and then removing selected portions of the conductive layer and the plated layer such that the cap includes selected portions of the conductive layer and the plated layer. Depositing the plated layer can include electrolessly plating a first plated layer on the post, the adhesive and the conductive layer and then electroplating a second plated layer on the first plated layer. The removing can include applying the wet chemical etch to the conductive layer and the plated layer using the etch mask to define the cap.

Providing the conductive trace can include providing the pad, the terminal and a routing line in an electrically conductive path between the pad and the terminal. The routing line can include a selected portion of the conductive layer and extend above the adhesive.

Providing the pad, the terminal and the routing line can include removing selected portions of the conductive layer using an etch mask that defines the pad, the terminal and the routing line. Thus, the pad, the terminal and the routing line can be formed simultaneously using the same etch mask and wet chemical etch.

Providing the thermal via can include providing a plated through-hole that extends from the base through the support layer to the underlayer after solidifying the adhesive. The plated through-hole can also extend from the conductive layer through the adhesive to the base. The plated through-hole can also extend through the base, the adhesive, the dielectric layer, the conductive layer, the support layer and the underlayer.

Providing the thermal via can include removing selected portions of the conductive layer using an etch mask that defines a stub that is adjacent to the plated through-hole. Thus, the pad, the terminal and the stub can be formed simultaneously using the same etch mask and wet chemical etch.

Providing the pad, the terminal, the routing line, the cap and the thermal via can include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the pad, the terminal, the routing line, the cap and the thermal via include selected portions of the conductive layer. The grinding can include grinding the adhesive without grinding the post and then grinding the post, the adhesive and the conductive layer. The removing can include applying a wet chemical etch to the conductive layer using an etch mask that defines the pad, the terminal, the routing line, the cap and the stub.

Providing the pad, the terminal, the routing line, the cap and the thermal via can include depositing a plated layer on the post, the adhesive and the conductive layer after the grinding and then removing selected portions of the conductive layer and the plated layer such that the pad, the terminal, the routing line, the cap and the thermal via include selected portions of the conductive layer and the plated layer. Depositing the plated layer can include electrolessly plating a first plated layer on the post, the adhesive and the conductive layer and then electroplating a second plated layer on the first plated layer. The removing can include applying the wet chemical etch to the conductive layer and the plated layer using the etch mask to define the pad, the terminal, the routing line, the cap and the stub.

Providing the conductive trace and the heat spreader can include providing a plated through-hole for the thermal via that extends from the conductive layer through the adhesive to the base and from the base through the support layer to the underlayer after solidifying the adhesive and then removing selected portions of the conductive layer using an etch mask that defines the pad, the terminal and the stub.

Providing the conductive trace and the heat spreader can include providing a hole that extends through the base, the adhesive, the dielectric layer, the conductive layer, the support layer and the underlayer after solidifying the adhesive, then depositing a plated layer on the post, the adhesive and the conductive layer and into the hole, wherein the plated layer forms an upper plated layer that covers the post in the upward direction and the plated through-hole in the hole, then forming an etch mask on the upper plated layer that defines the pad, the terminal, the routing line, the cap and the stub, etching the conductive layer and the upper plated layer in a pattern defined by the etch mask and then removing the etch mask.

Furthermore, the hole can be formed in a single step by mechanical drilling or laser drilling or multiple steps in which the base, the conductive layer and/or the underlayer are opened by wet chemical etching and the adhesive, the dielectric layer and/or the support layer are opened by laser drilling or plasma etching.

Etching the conductive layer and the upper plated layer can include exposing the dielectric layer in the upward direction without exposing the adhesive or the support layer in the upward direction, and etching the underlayer and the lower plated layer can include exposing the support layer in the downward direction without exposing the adhesive or the dielectric layer in the downward direction.

The pad can be formed before, during or after the terminal is formed. Thus, the pad and the terminal can be formed simultaneously using the same wet chemical etch and different etch masks or sequentially using different etch masks. Likewise, the cap can be formed before, during or after the terminal is formed. Thus, the cap and the terminal can be formed simultaneously using the same wet chemical etch and different etch masks or sequentially using different etch masks. Similarly, the pad, the terminal and the cap can be formed simultaneously or sequentially.

Flowing the adhesive can include filling the gap with the adhesive. Flowing the adhesive can also include squeezing the adhesive through the gap, above the post and the conductive layer and on top surface portions of the post and the conductive layer adjacent to the gap.

Solidifying the adhesive can include mechanically bonding the post and the base to the conductive layer.

Mounting the semiconductor device on the post can include mounting the semiconductor device on the cap and thus the post. Mounting the semiconductor device can also include positioning the semiconductor device within the periphery of the cap and outside the periphery of the pad, or alternatively, positioning the semiconductor device within and outside the peripheries of the cap and the pad. Thus, the semiconductor device can overlap the adhesive and the dielectric layer, or alternatively, be located within the peripheries of the opening and the aperture. In any case, the semiconductor device overlaps the post, the base, the cap, the support layer and the underlayer.

Mounting the semiconductor device can include providing a first solder joint between an LED package that includes an LED chip and the pad and a second solder joint between the LED package and the cap, electrically connecting the semiconductor device can include providing the first solder joint between the LED package and the pad, and thermally connecting the semiconductor device can include providing the second solder joint between the LED package and the cap.

Mounting the semiconductor device can include providing a die attach between a semiconductor chip such as an LED chip and the cap, electrically connecting the semiconductor device can include providing a wire bond between the chip and the pad, and thermally connecting the semiconductor device can include providing the die attach between the chip and the cap.

The semiconductor device can be encapsulated by providing an encapsulant on the thermal board that covers the semiconductor device in the upward direction.

The adhesive can contact the post, the base, the cap, the thermal via and the dielectric layer, be spaced from the support layer and the underlayer, cover the conductive trace in the downward direction, cover and surround the post in the lateral directions and extend to peripheral edges of the assembly after the assembly is manufactured and detached from other assemblies in a batch.

The base can cover the semiconductor device, the post, the cap and the conductive trace in the downward direction, support the conductive trace, the adhesive and the substrate and extend to peripheral edges of the assembly after the assembly is manufactured and detached from other assemblies in a batch.

The support layer can cover the semiconductor device, the post, the cap and the conductive trace in the downward direction, support the base, the conductive trace, the adhesive and the substrate and extend to peripheral edges of the assembly after the assembly is manufactured and detached from other assemblies in a batch.

The underlayer can cover the semiconductor device, the post, the cap and the conductive trace in the downward direction, support the base, the conductive trace, the adhesive, the substrate and the support layer and extend to peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The post and the base can be integral with one another, thereby enhancing reliability. The post can provide thermal expansion matching with a semiconductor device mounted thereon, thereby increasing reliability. The cap can be customized for the semiconductor device, thereby enhancing the thermal connection. The adhesive can be sandwiched between the post and the substrate and between the base and the substrate, thereby providing a robust mechanical bond between the heat spreader and the substrate. The support layer can be thick to facilitate a thin base, thereby reducing cost. Furthermore, the support layer and the underlayer can be provided by a commercially available single-sided or double-sided copper clad laminate (CCL), thereby reducing cost. The conductive trace can provide signal routing with simple circuitry patterns or flexible multi-layer signal routing with complex circuitry patterns. The base, the support layer and the underlayer can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 4A1-4M1 are cross-sectional views showing a method of making a thermal board in accordance with an embodiment of the present invention;

FIGS. 4E2-4M2 are cross-sectional views corresponding to FIGS. 4E1-4M1, respectively;

FIGS. 4E3-4M3 are top views corresponding to FIGS. 4E1-4M1, respectively;

FIG. 4M4 is a bottom view corresponding to FIG. 4M1;

DETAILED DESCRIPTION OF THE INVENTION

Figure 1A:
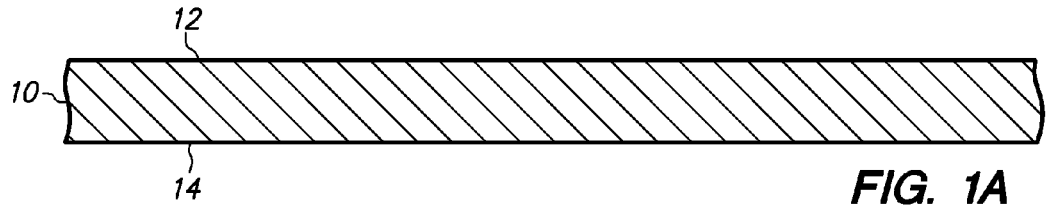
FIGS. 1A-1E are cross-sectional views showing a method of making a post, a base, a support layer and an underlayer in accordance with an embodiment of the present invention.
Figure 1B:
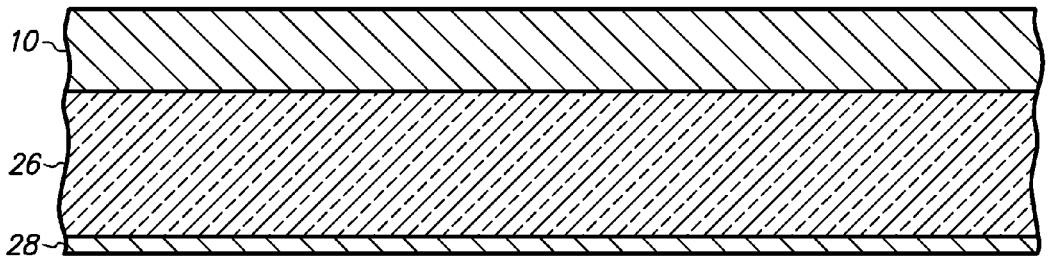
Figure 1C:
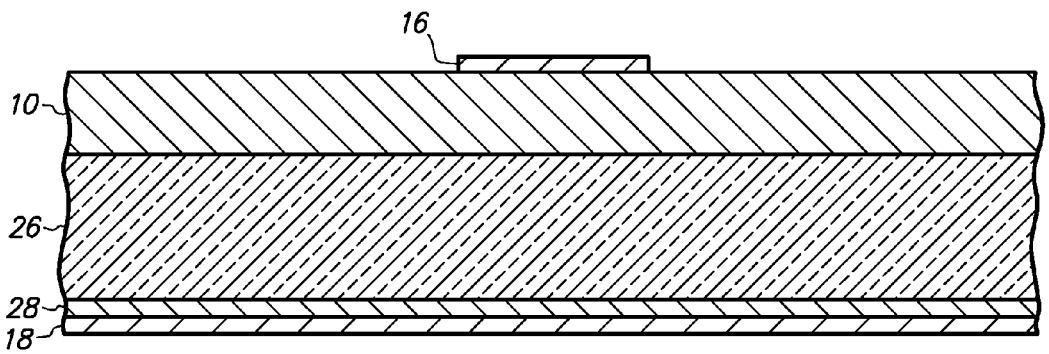
Figure 1D:
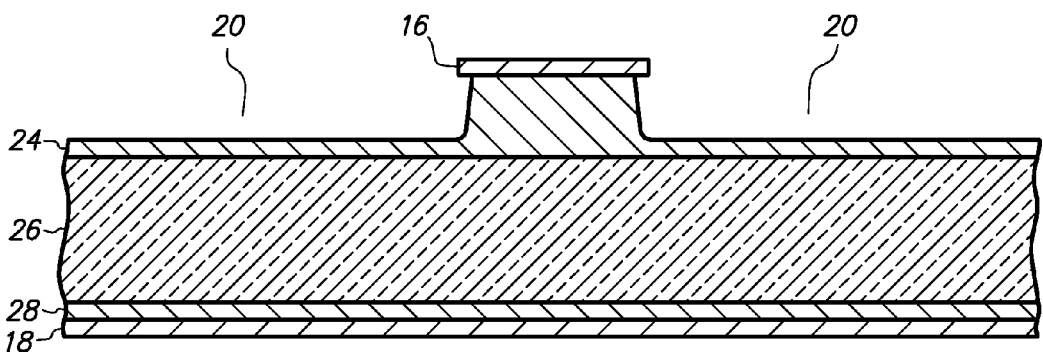
Figure 1E:
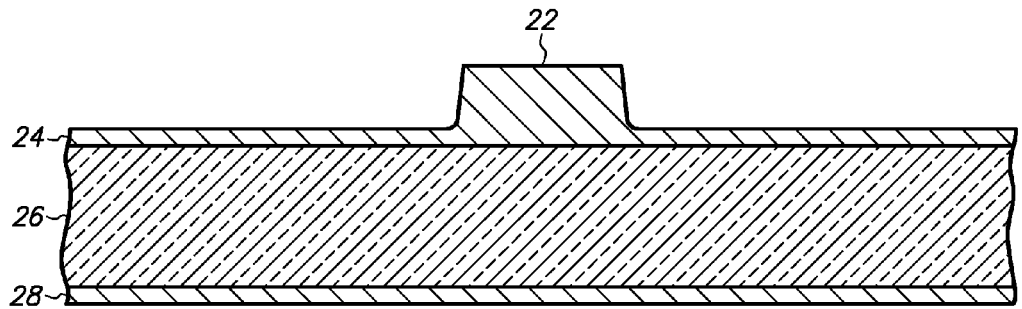
Figure 1F:
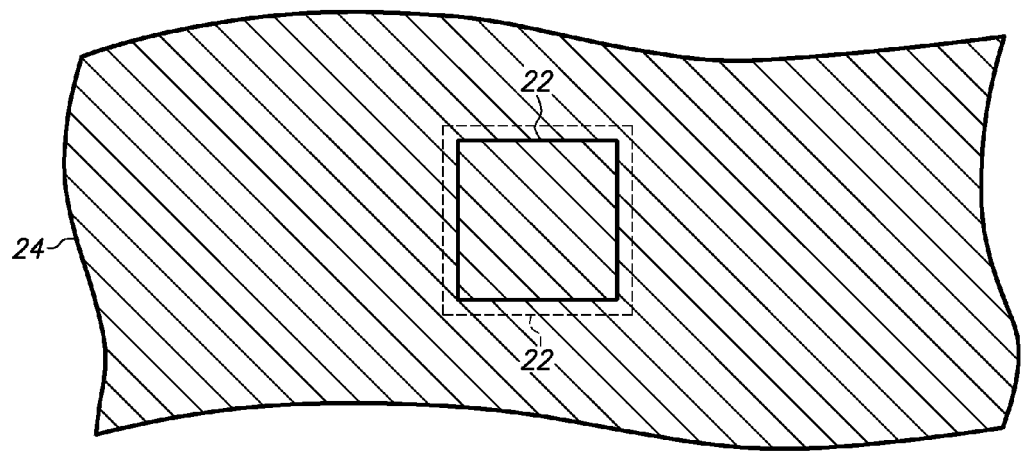
FIGS. 1F and 1G are top and bottom views, respectively, corresponding to FIG. 1E.
Figure 1G:
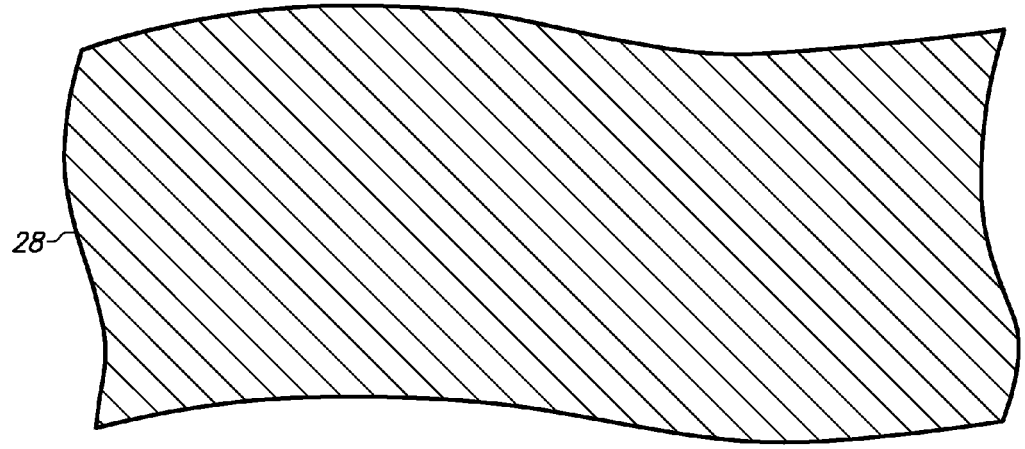

FIGS. 1A-1E are cross-sectional views showing a method of making a post, a base, a support layer and an underlayer in accordance with an embodiment of the present invention, and FIGS. 1F and 1G are top and bottom views, respectively, corresponding to FIG. 1E.

FIG. 1A. is a cross-sectional view of metal plate 10 which includes opposing major surfaces 12 and 14. Metal plate 10 is illustrated as a copper plate with a thickness of 200 microns. Copper has high thermal conductivity, good bondability and low cost. Metal plate 10 can be various metals such as copper, aluminum, alloy 42, iron, nickel, silver, gold, combinations thereof, and alloys thereof.

Metal plate 10 provides the foundation for a unified structure that includes post 22, base 24, support layer 26 and underlayer 28 as described below.

FIG. 1B. is a cross-sectional view of support layer 26 and underlayer 28 attached to metal plate 10.

Support layer 26 is an electrical insulator illustrated as an unpatterned epoxy sheet with a thickness of 1200 microns that attaches base 24 to underlayer 28.

Underlayer 28 is an electrical conductor with high thermal conductivity illustrated as an unpatterned copper sheet with a thickness of 35 microns.

FIG. 1C is a cross-sectional view of etch mask 16 and cover mask 18 formed on metal plate 10 and underlayer 28. Etch mask 16 and cover mask 18 are illustrated as photoresist layers which are deposited on metal plate 10 and underlayer 28, respectively, using dry film lamination in which hot rolls simultaneously press photoresist layers 16 and 18 onto metal plate 10 and underlayer 28, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12 in the upward direction, and photoresist layer 18 remains unpatterned and covers underlayer 28 in the downward direction.

FIG. 1D is a cross-sectional view of recess 20 formed into but not through metal plate 10 by etching metal plate 10 in the pattern defined by etch mask 16. The etching is illustrated as a frontside wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides backside protection. The wet chemical etch is highly selective of copper and etches 150 microns into metal plate 10. As a result, recess 20 extends from surface 12 into but not through metal plate 10, is spaced from surface 14 by 150 microns and has a depth of 150 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1E, 1F and 1G are cross-sectional, top and bottom views, respectively, of post 22, base 24, support layer 26 and underlayer 28 after etch mask 16 and cover mask 18 are removed. The photoresist layers are stripped using a solvent, such as a strong alkaline solution containing potassium hydroxide with a pH of 14, that is highly selective of photoresist with respect to copper and epoxy.

Metal plate 10 as etched includes post 22 and base 24.

Post 22 is an unetched portion of metal plate 10 defined by etch mask 16. Post 22 is adjacent to and integral with and protrudes above base 24, is laterally surrounded by recess 20 and is spaced from support layer 26 and underlayer 28. Post 22 has a height of 150 microns (recess 20 depth), a length and width at its top surface (square portion of surface 12) of 1000 microns and a length and width at its bottom (square portion adjacent to base 24) of 1200 microns. Thus, post 22 has a cut-off pyramidal shape with tapered sidewalls in which its diameter decreases as it extends upwardly from base 24 to its flat square top surface. The tapered sidewalls arise from the lateral undercutting by the wet chemical etch beneath etch mask 16. The top surface is concentrically disposed within a periphery of the bottom (shown in phantom in FIG. 1F).

Base 24 is an unetched portion of metal plate 10 that is located below post 22, covers post 22 in the downward direction, extends laterally from post 22 in a lateral plane (with lateral directions such as left and right) and has a thickness of 50 microns (200−150). Base 24 is located above support layer 26.

Support layer 26 contacts and is sandwiched between and electrically and thermally isolates base 24 and underlayer 28, covers post 22 in the downward direction and extends laterally beyond post 22.

Underlayer 28 is located below support layer 26, covers post 22 in the downward direction and extends laterally beyond post 22.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively by depositing post 22 on base 24 using electroplating, chemical vapor deposition (CVD), physical vapor deposition (PVD) and so on, for instance by electroplating a solder post 22 on a copper base 24, in which case post 22 and base 24 have a metallurgical interface and are adjacent to but not integral with one another. Post 22 can also be formed semi-additively, for instance by depositing upper portions of post 22 on etch-defined lower portions of post 22. Post 22 can also be formed semi-additively by depositing conformal upper portions of post 22 on etch-defined lower portions of post 22. Post 22 can also be sintered to base 24.

Post 22, base 24 and underlayer 28 can be treated to improve bondability to epoxy and solder. For instance, post 22, base 24 and underlayer 28 can be chemically oxidized or microetched to provide rougher surfaces.

Figure 2A:
FIGS. 2A and 2B are cross-sectional views showing a method of making an adhesive in accordance with an embodiment of the present invention.
Figure 2B:
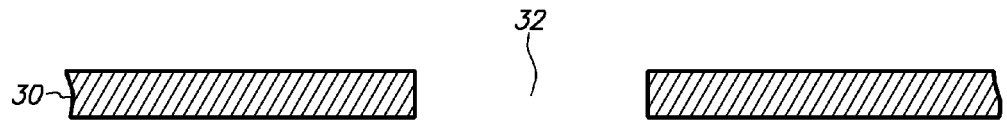
Figure 2C:
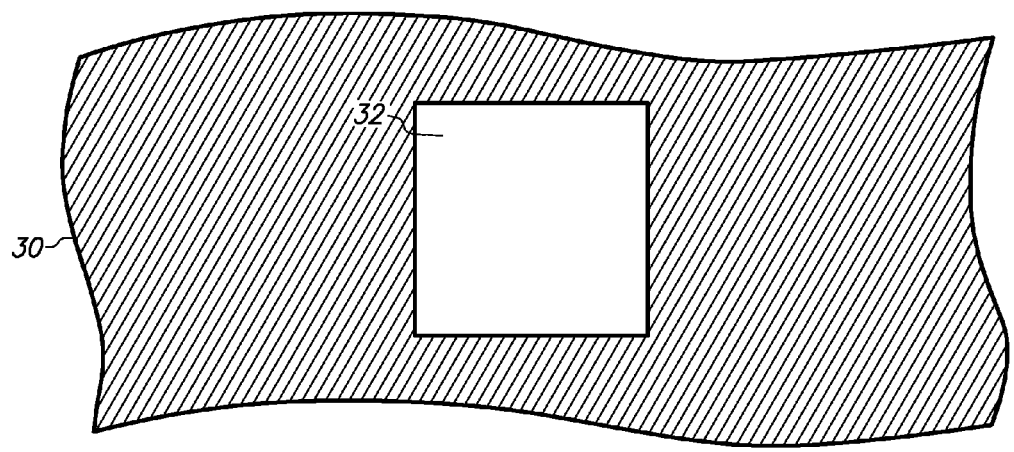
FIGS. 2C and 2D are top and bottom views, respectively, corresponding to FIG. 2B.
Figure 2D:
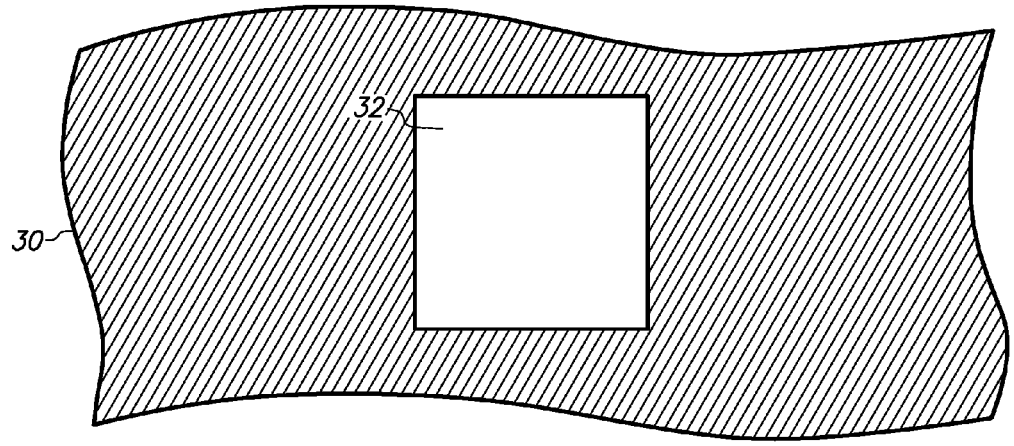

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified unpatterned sheet with a thickness of 100 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W. L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a length and width of 1250 microns. Opening 32 is formed by punching or stamping through the prepreg although other techniques such as plasma etching can be used.

Figure 3A:
FIGS. 3A and 3B are cross-sectional views showing a method of making a conductive layer in accordance with an embodiment of the present invention.
Figure 3B:
Figure 3C:
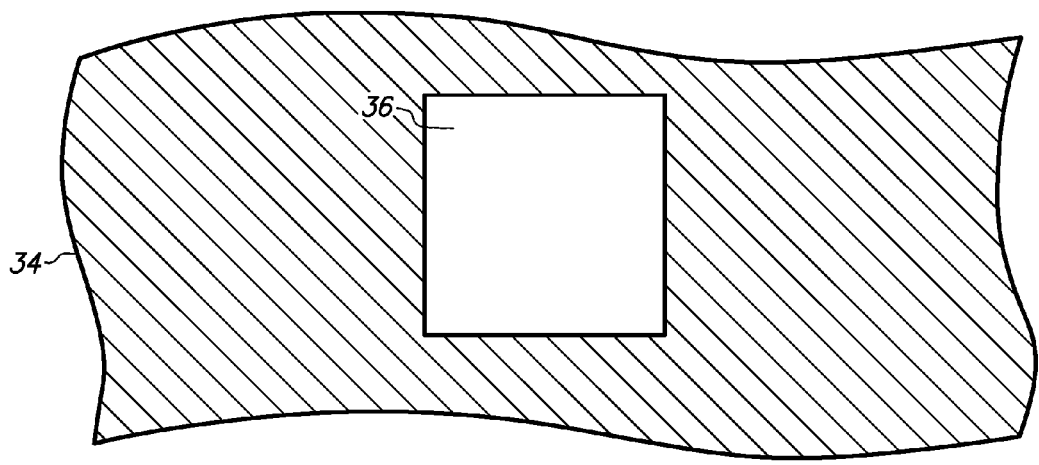
FIGS. 3C and 3D are top and bottom views, respectively, corresponding to FIG. 3B.
Figure 3D:
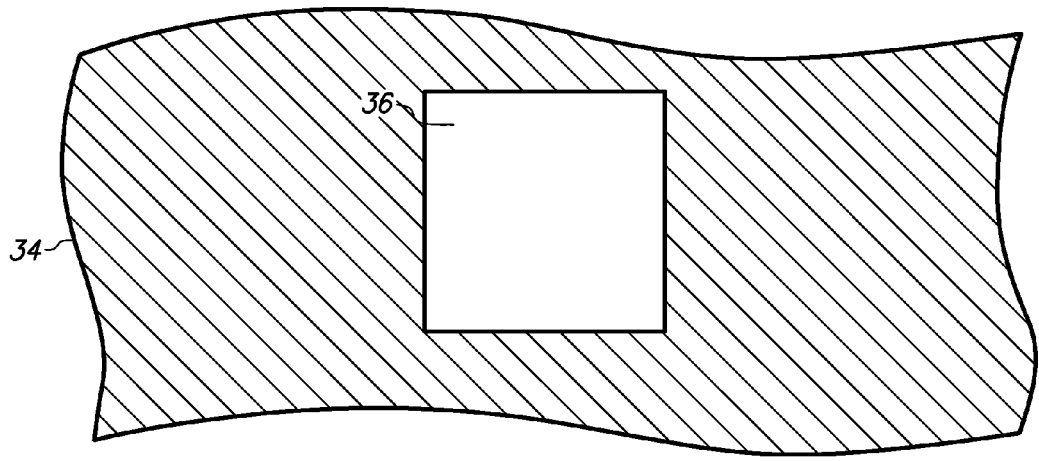
Figure 413:
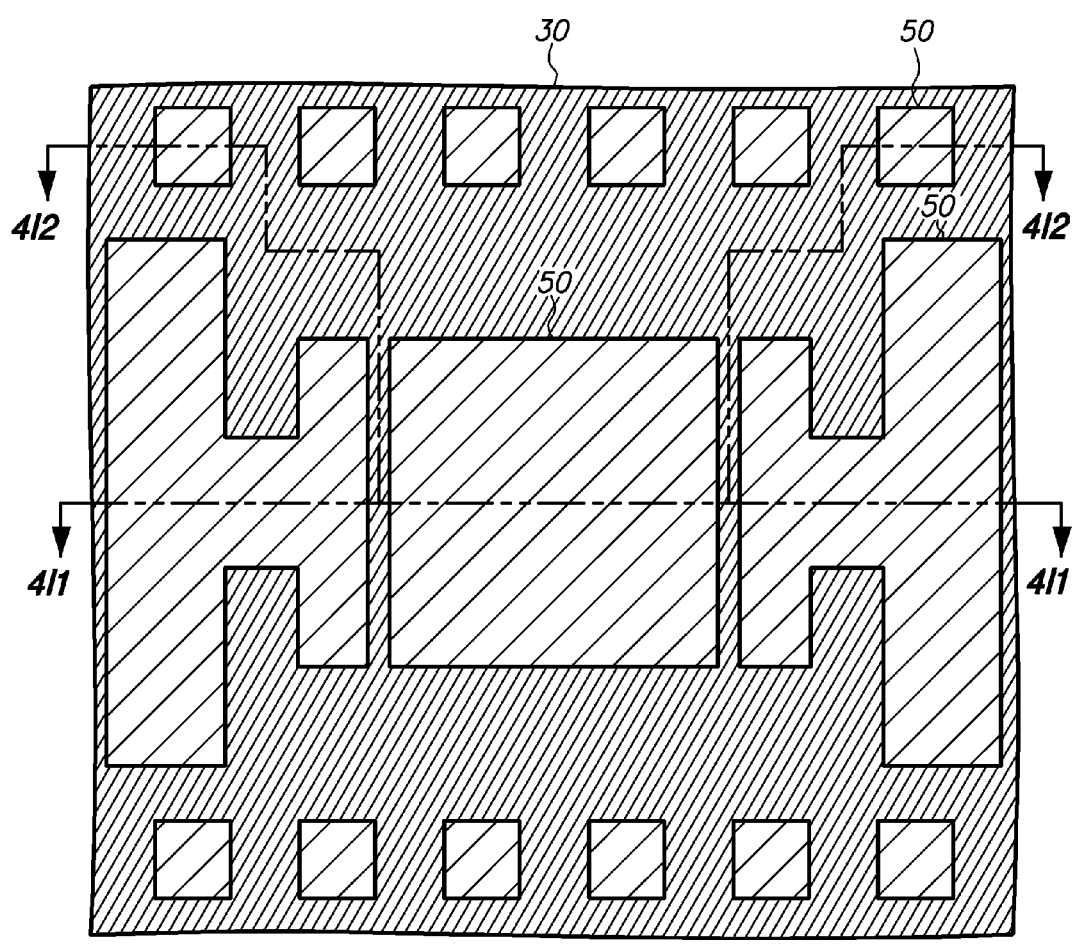
Figure 5A:
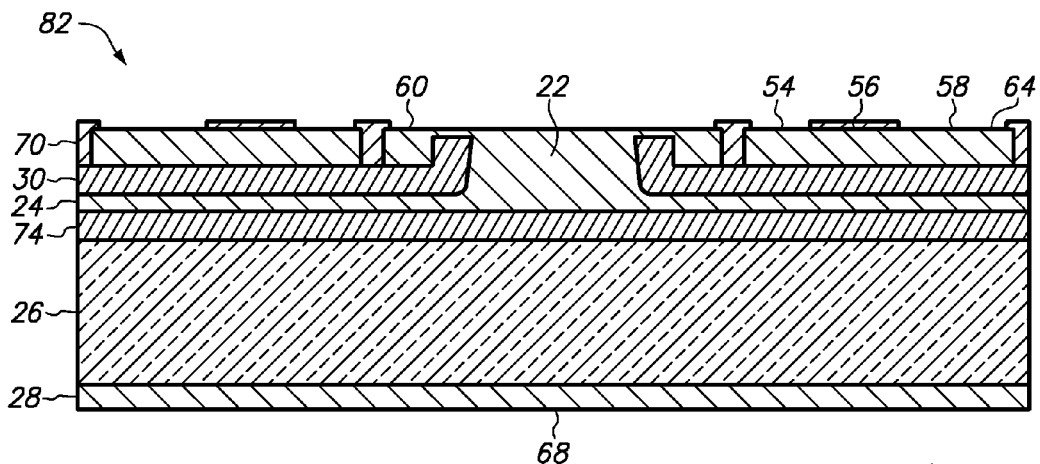
FIGS. 5A, 5B, 5C and 5D are cross-sectional, cross-sectional, top and bottom views, respectively, of a thermal board with a second adhesive in accordance with an embodiment of the present invention.
Figure 5B:
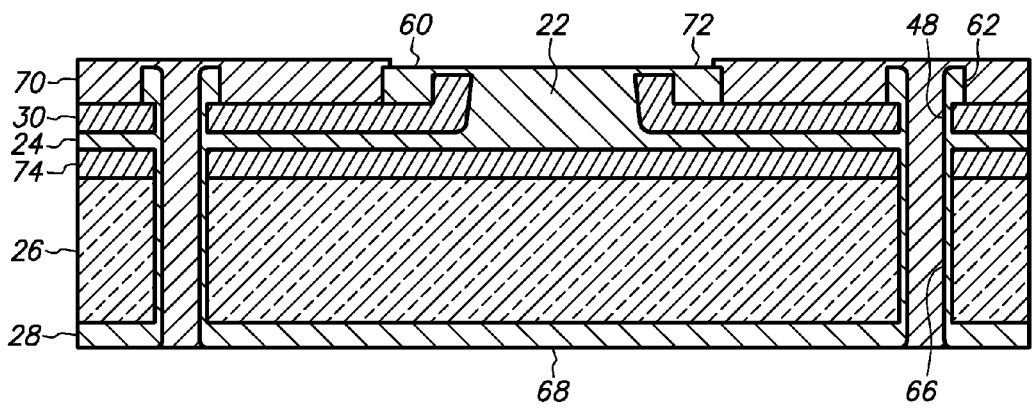
Figure 5C:
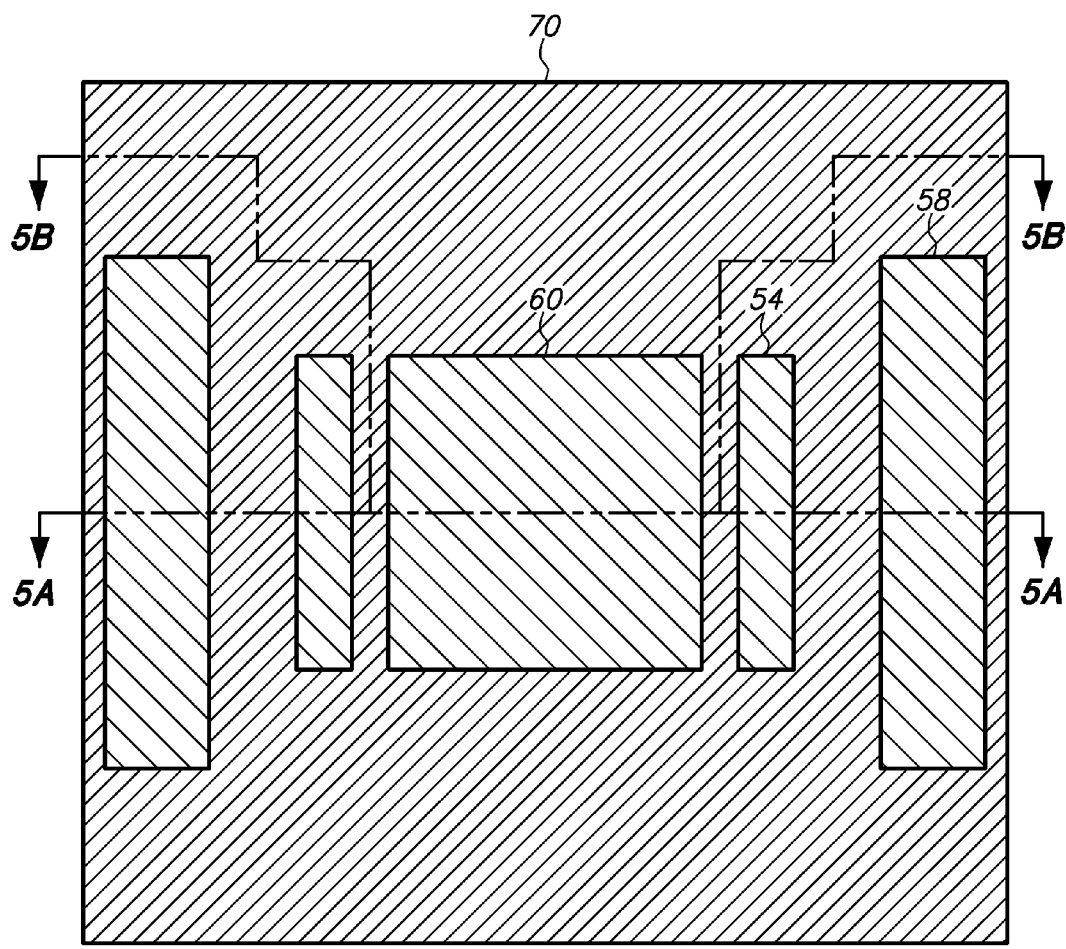
Figure 5D:
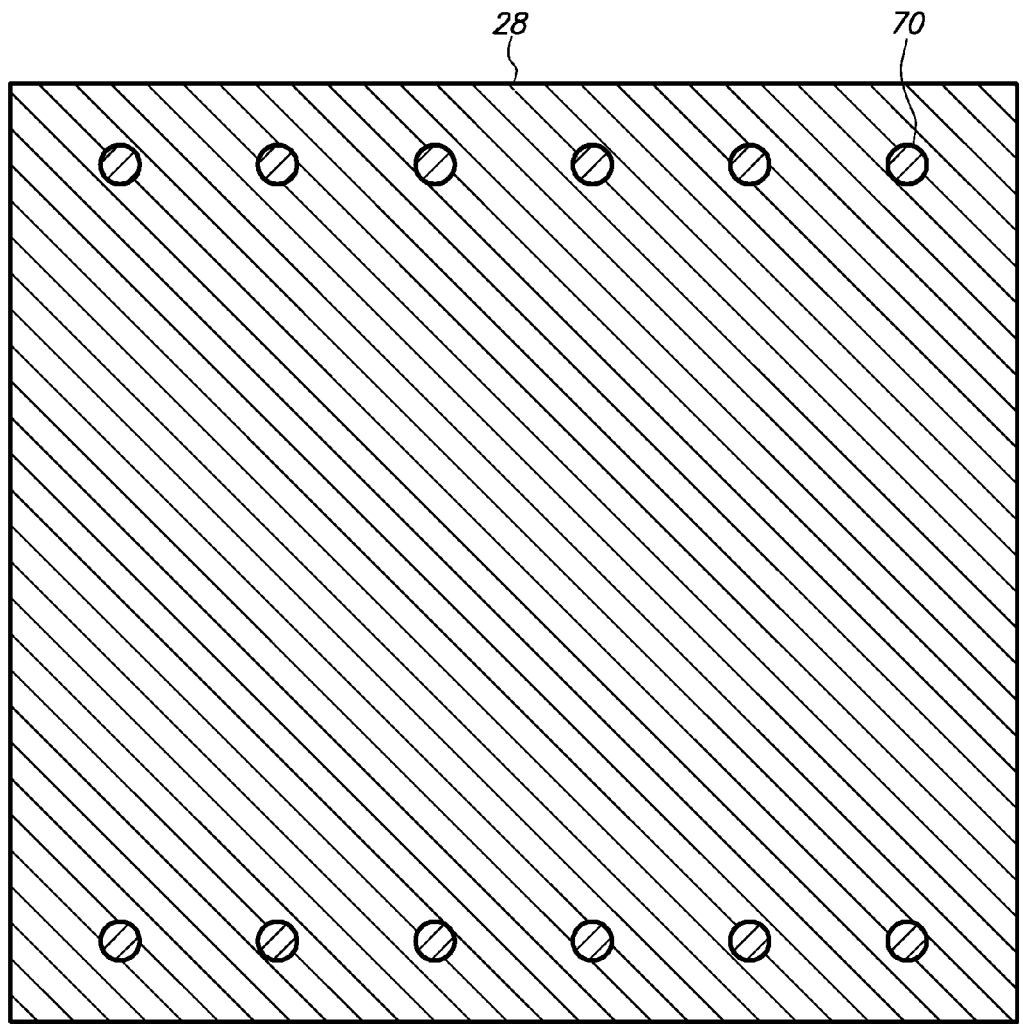
Figure 6A:
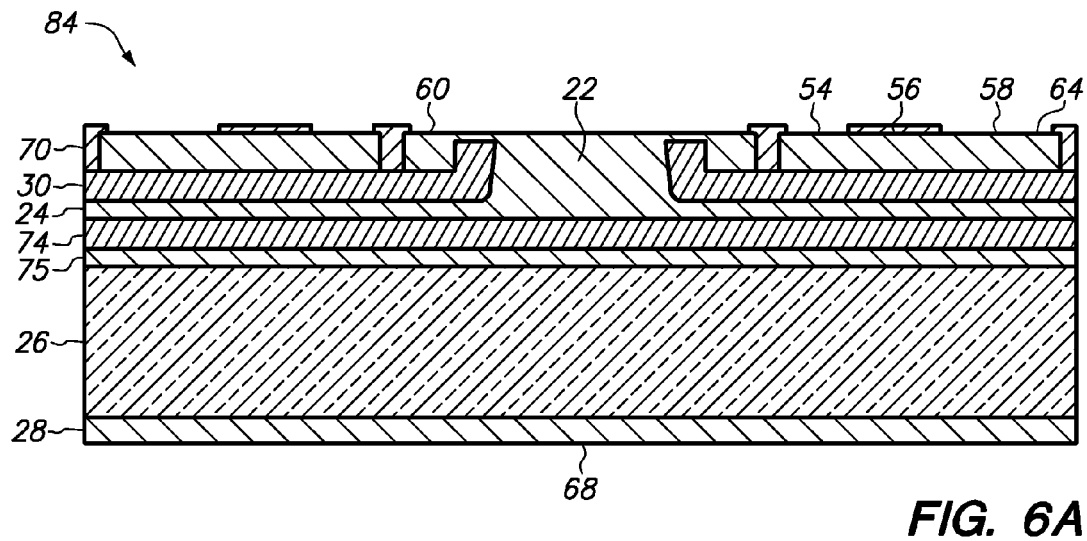
FIGS. 6A, 6B, 6C and 6D are cross-sectional, cross-sectional, top and bottom views, respectively, of a thermal board with a second adhesive and a metal layer in accordance with an embodiment of the present invention.
Figure 6B:
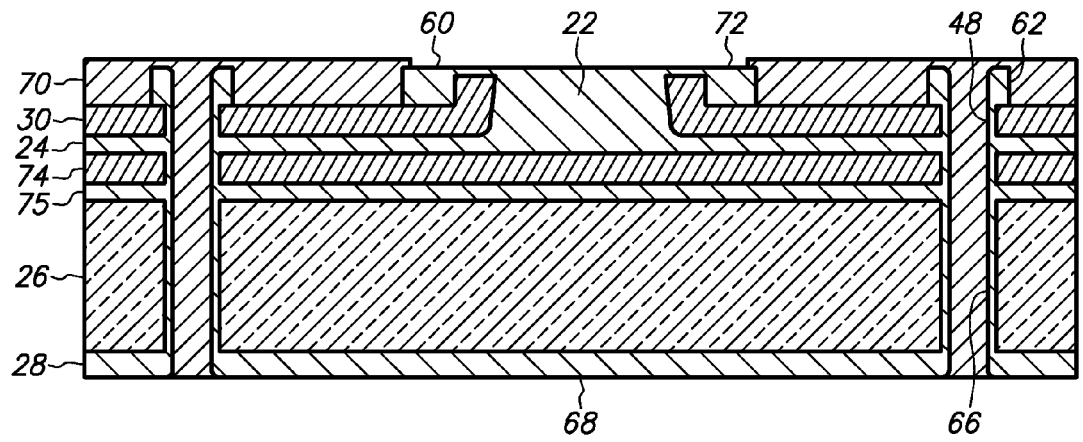
Figure 6C:
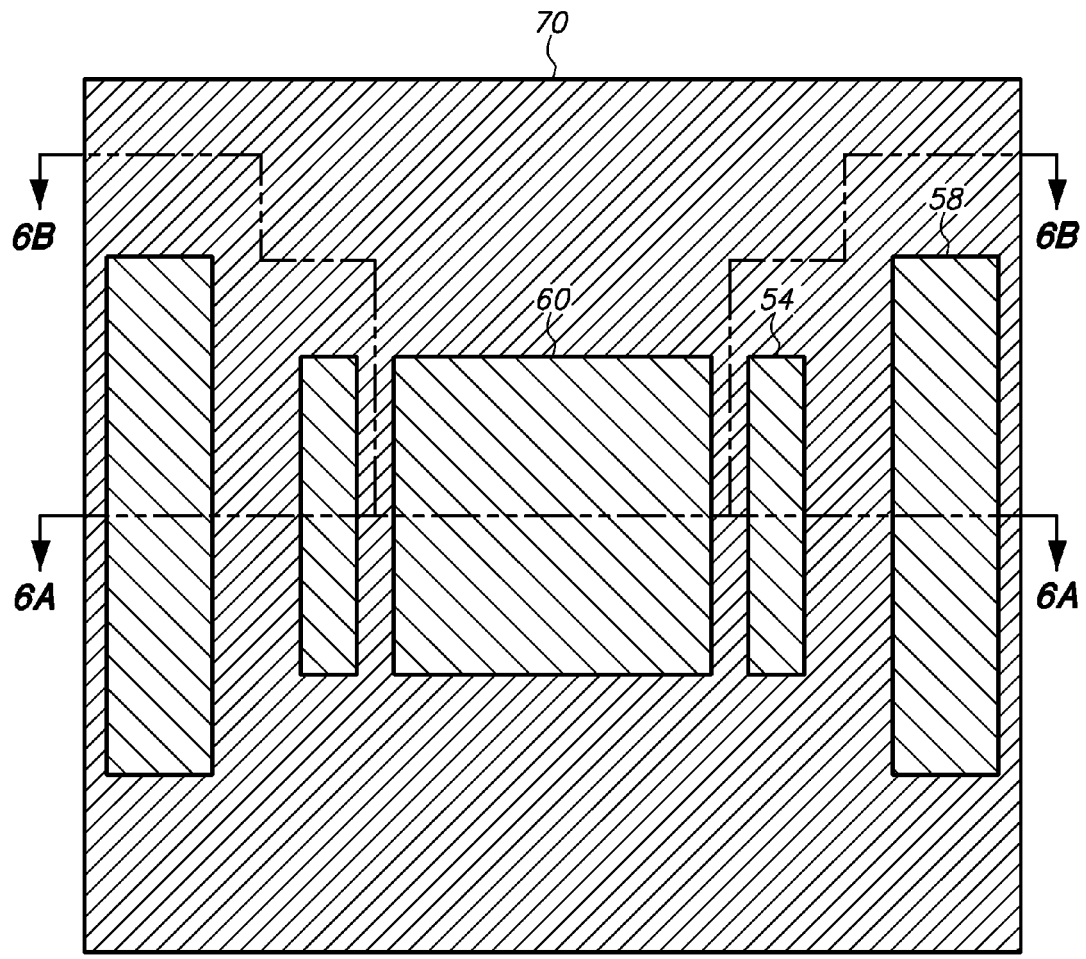
Figure 6D:
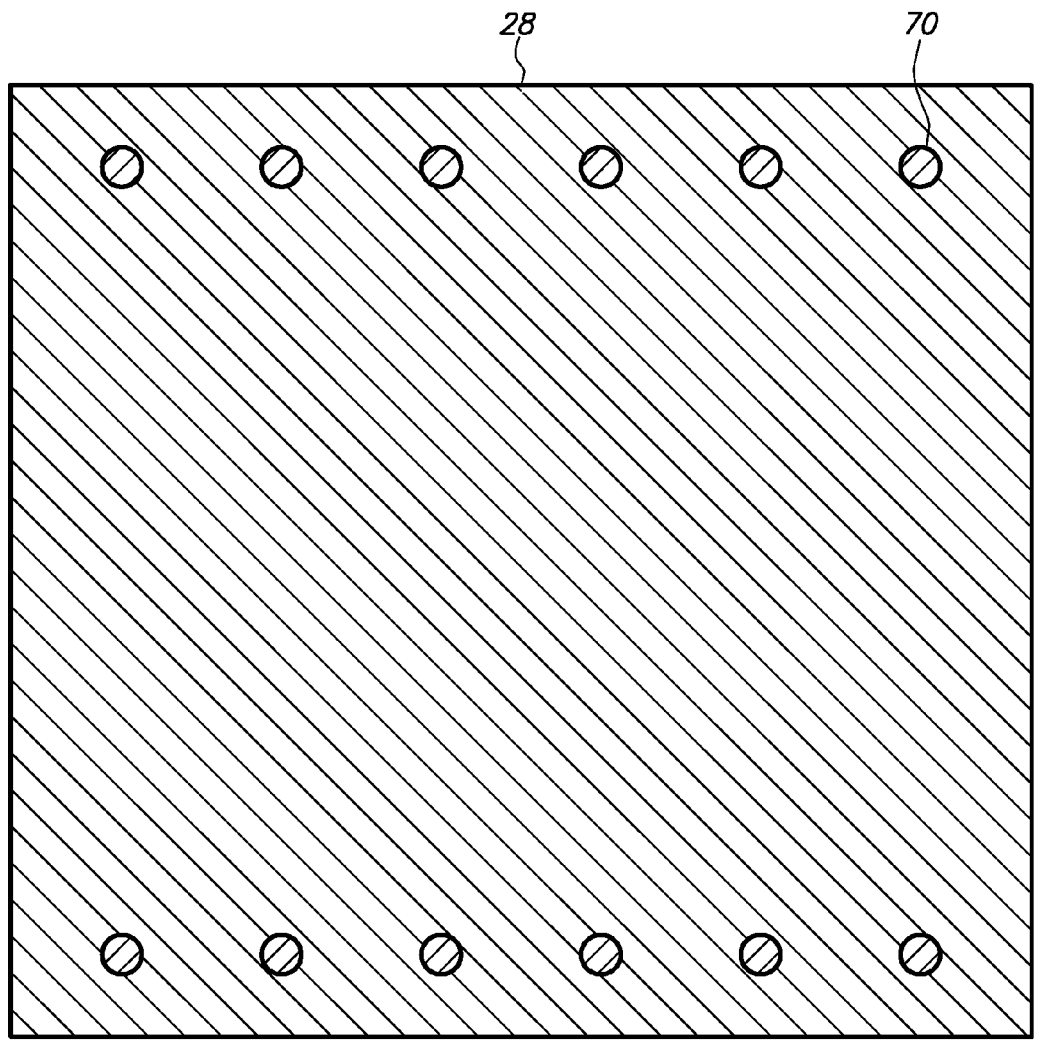
Figure 7A:
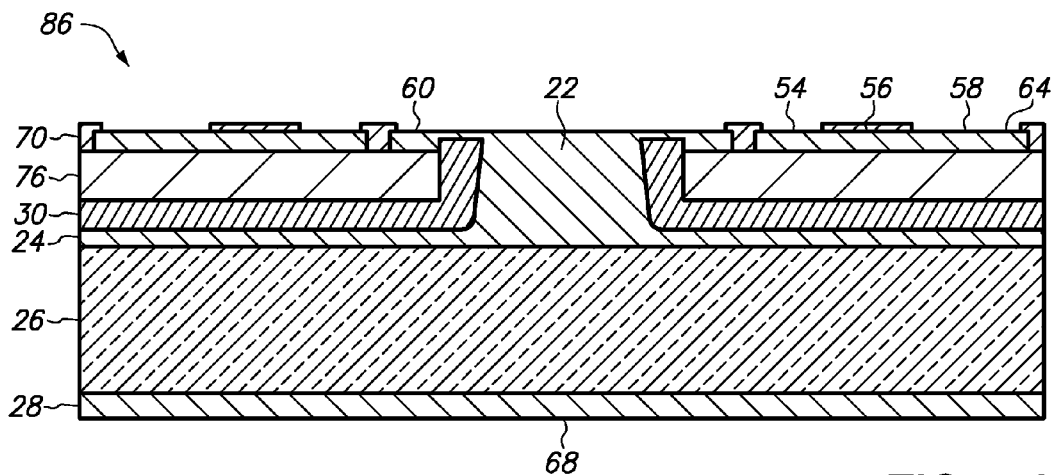
FIGS. 7A, 7B, 7C and 7D are cross-sectional, cross-sectional, top and bottom views, respectively, of a thermal board with a dielectric layer in accordance with an embodiment of the present invention.
Figure 7B:
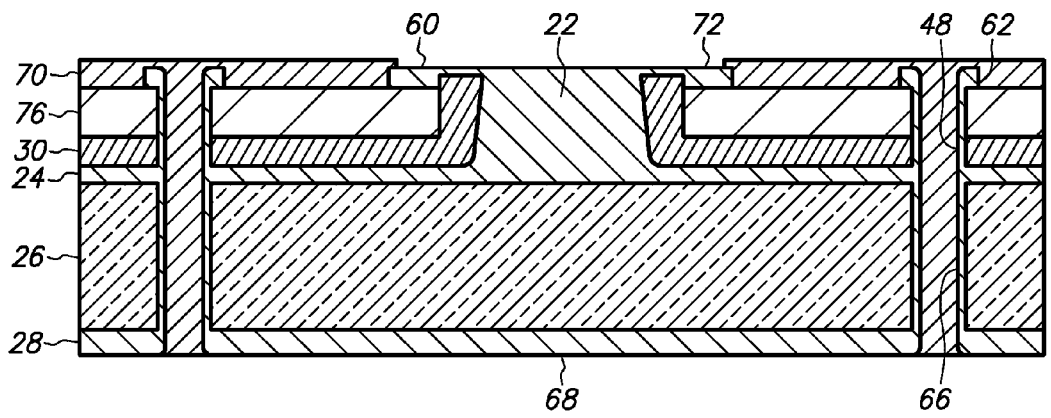
Figure 7C:
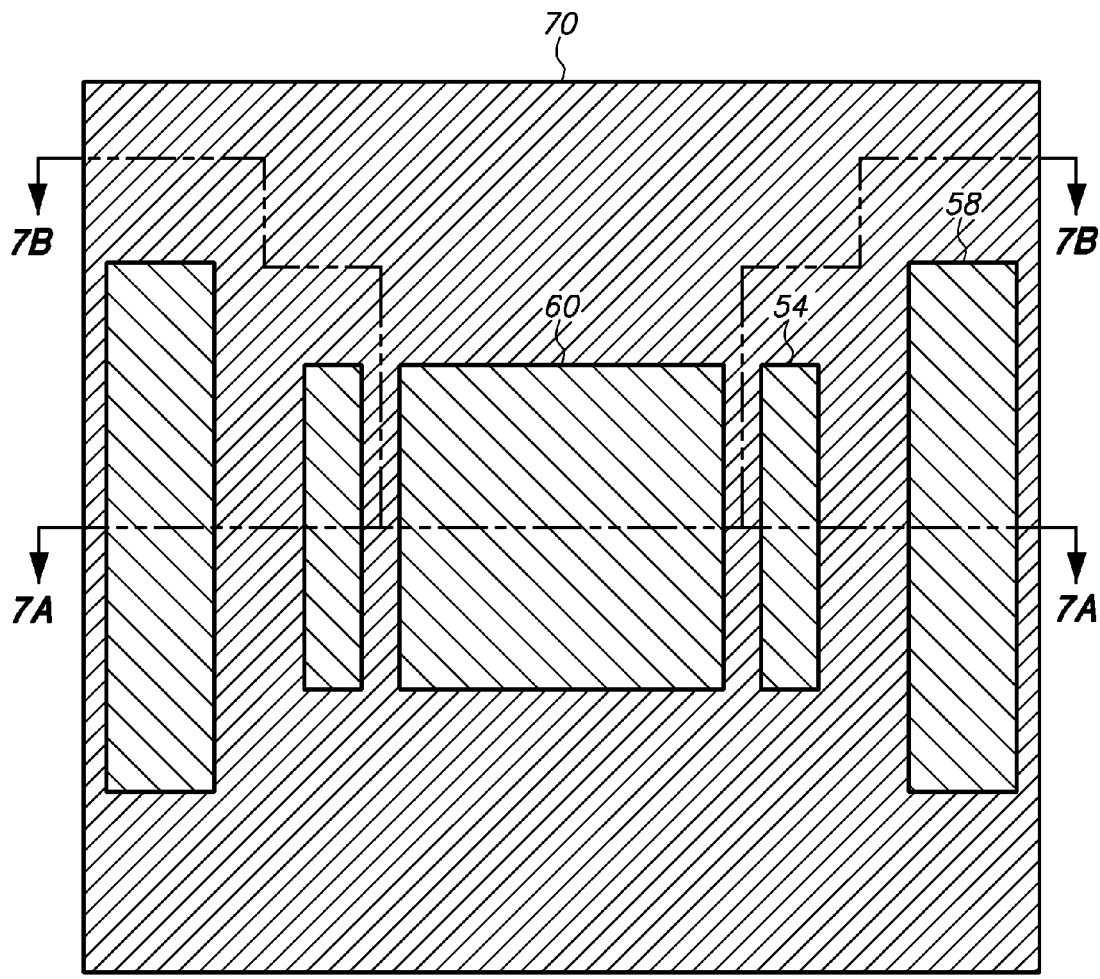
Figure 7D:
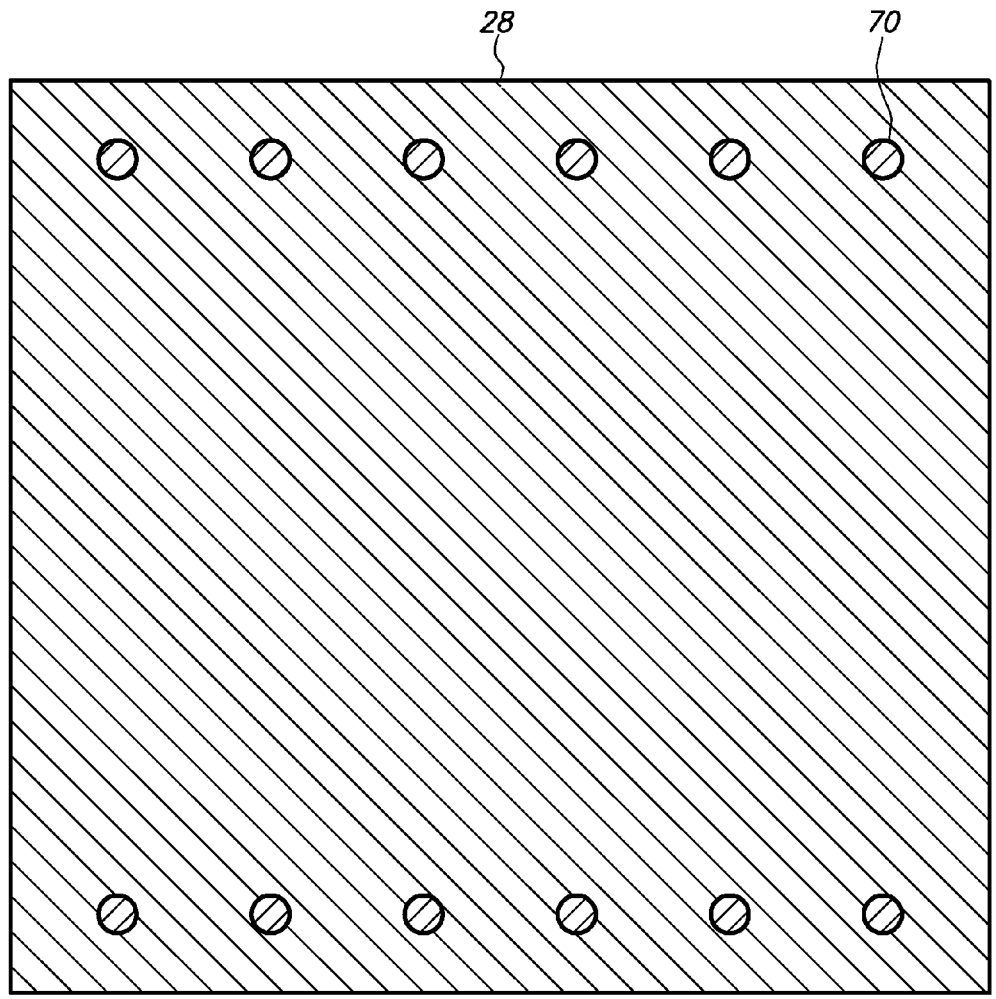
Figure 8A:
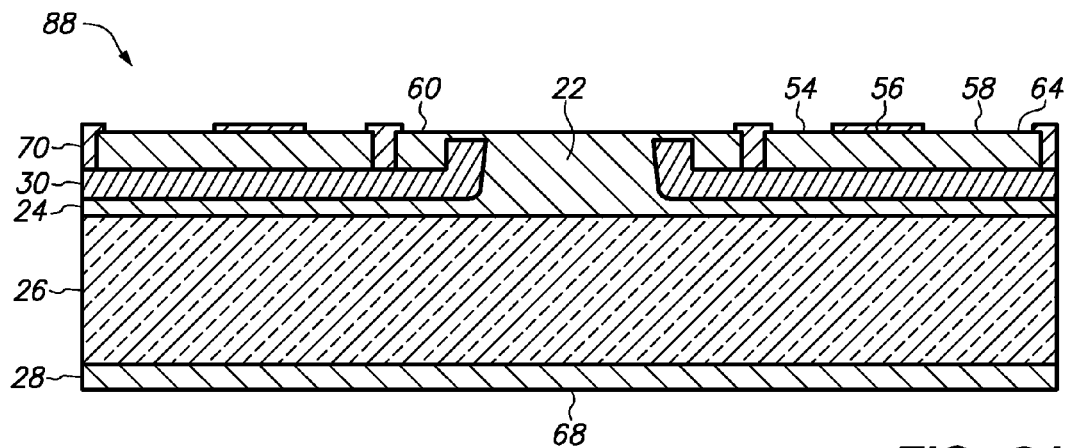
FIGS. 8A, 8B, 8C and 8D are cross-sectional, cross-sectional, top and bottom views, respectively, of a thermal board with a thermal filler in accordance with an embodiment of the present invention.
Figure 8B:
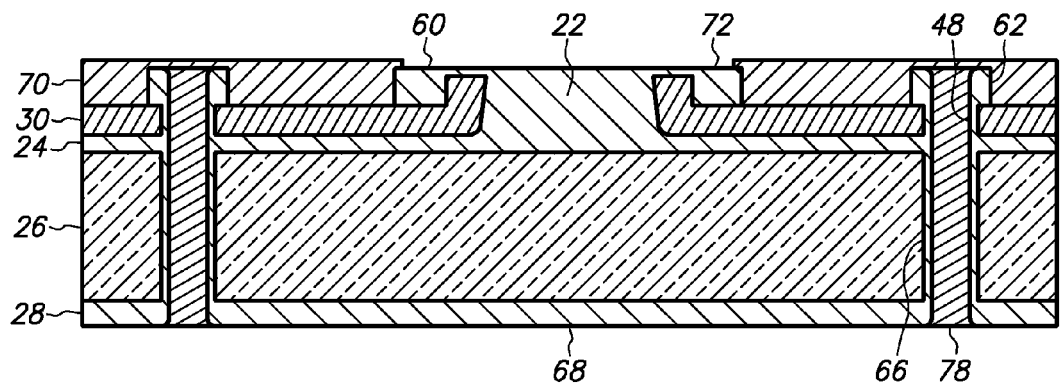
Figure 8C:
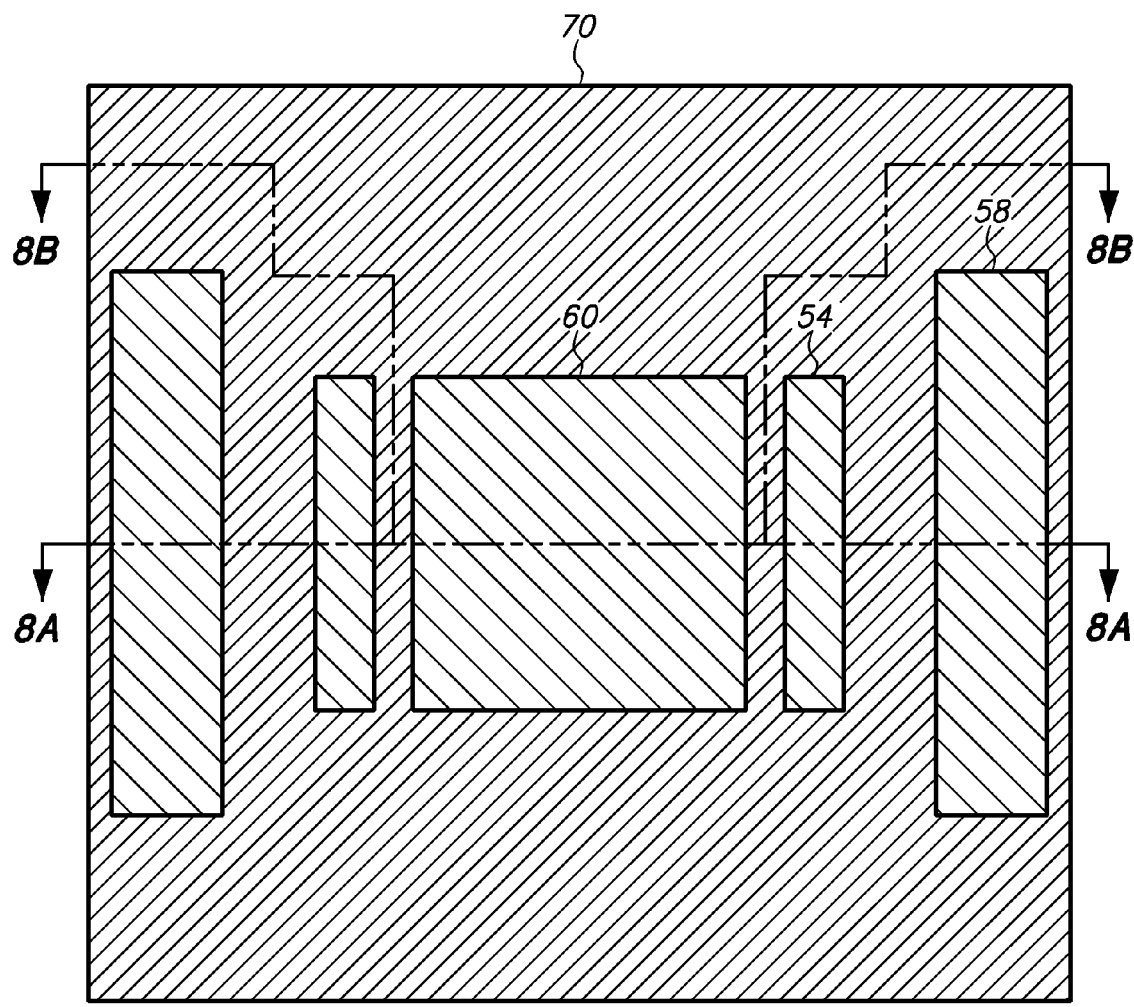
Figure 8D:
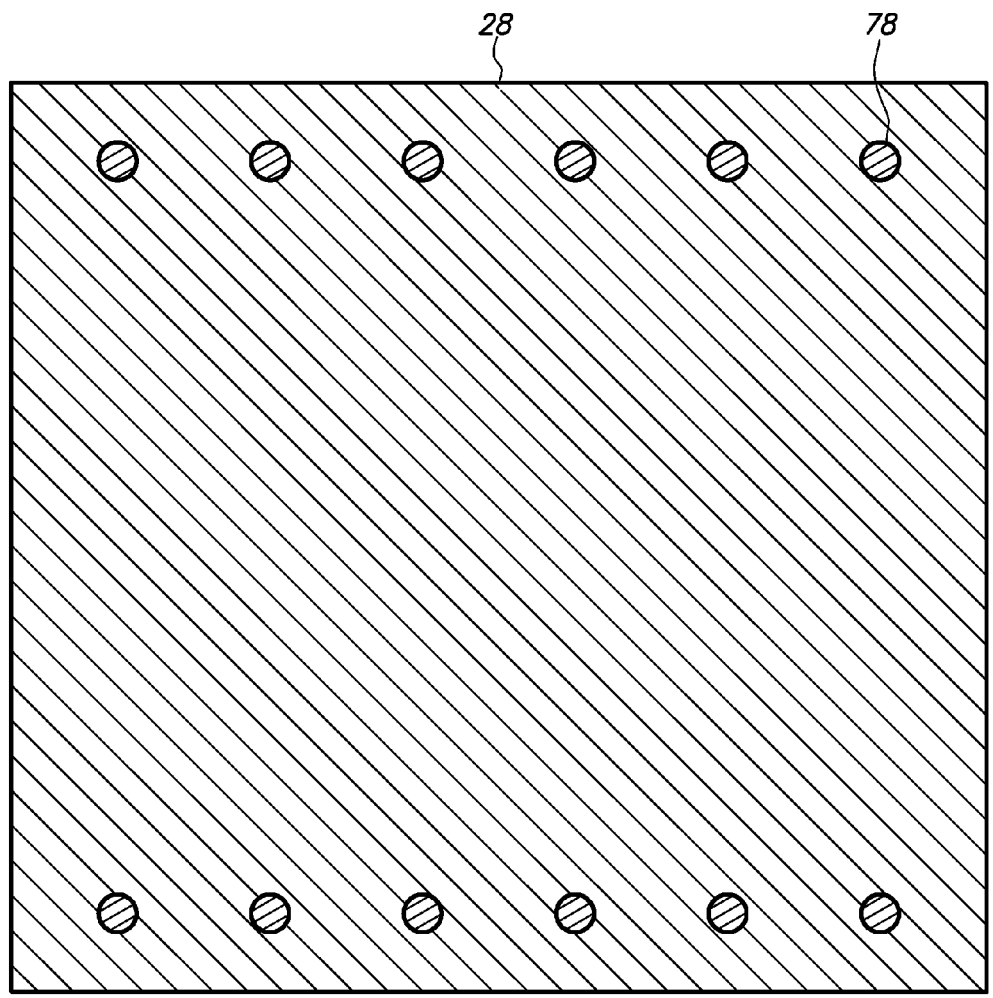
Figure 9A:
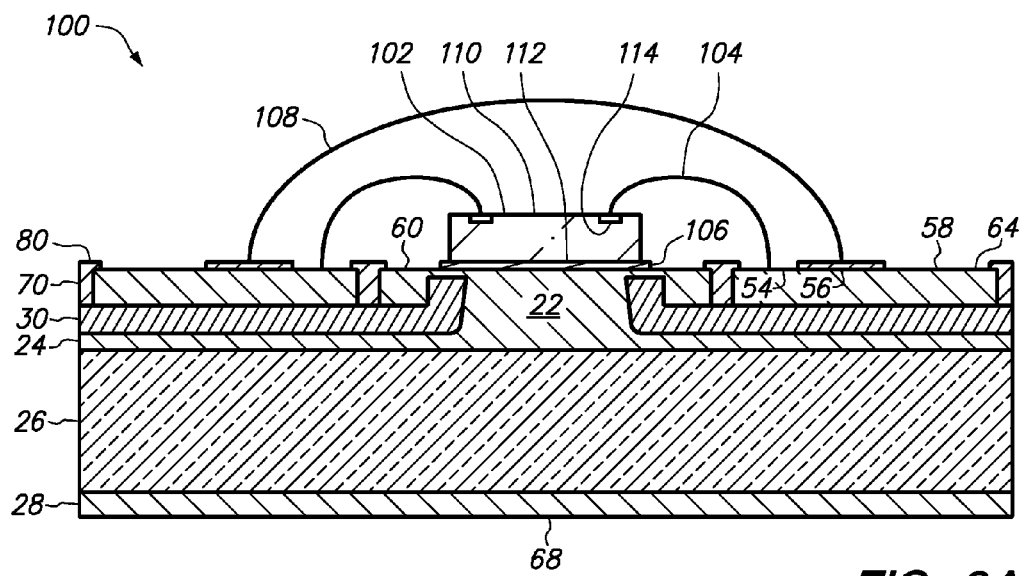
FIGS. 9A, 9B, 9C and 9D are cross-sectional, cross-sectional, top and bottom views, respectively, of a semiconductor chip assembly that includes a thermal board, a semiconductor device and an encapsulant in accordance with an embodiment of the present invention.
Figure 9B:
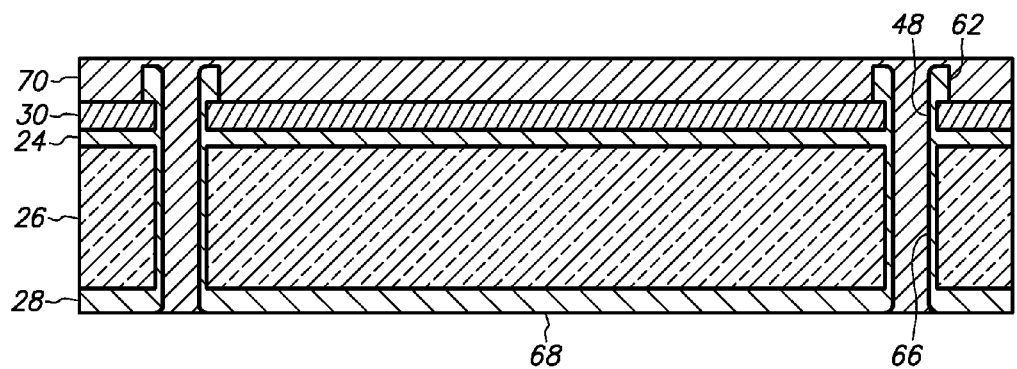
Figure 9C:
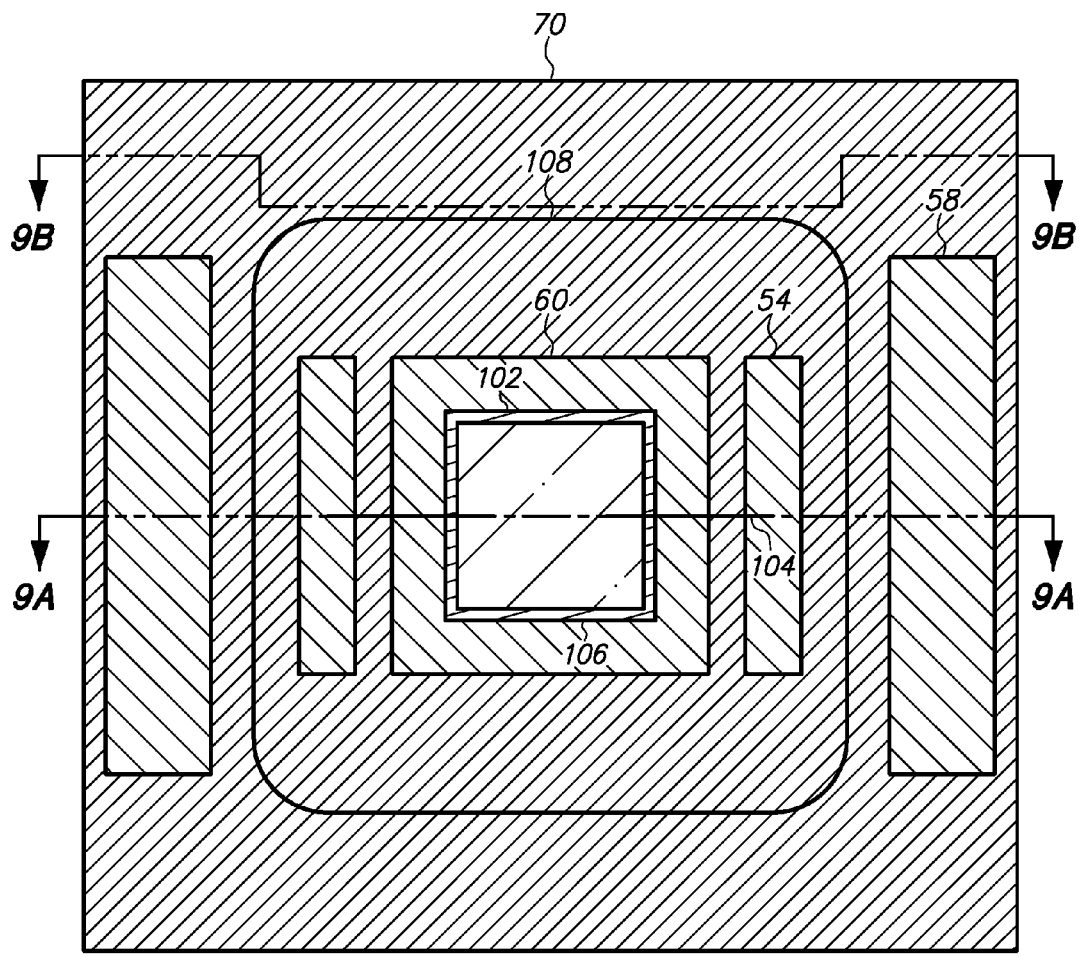
Figure 9D:
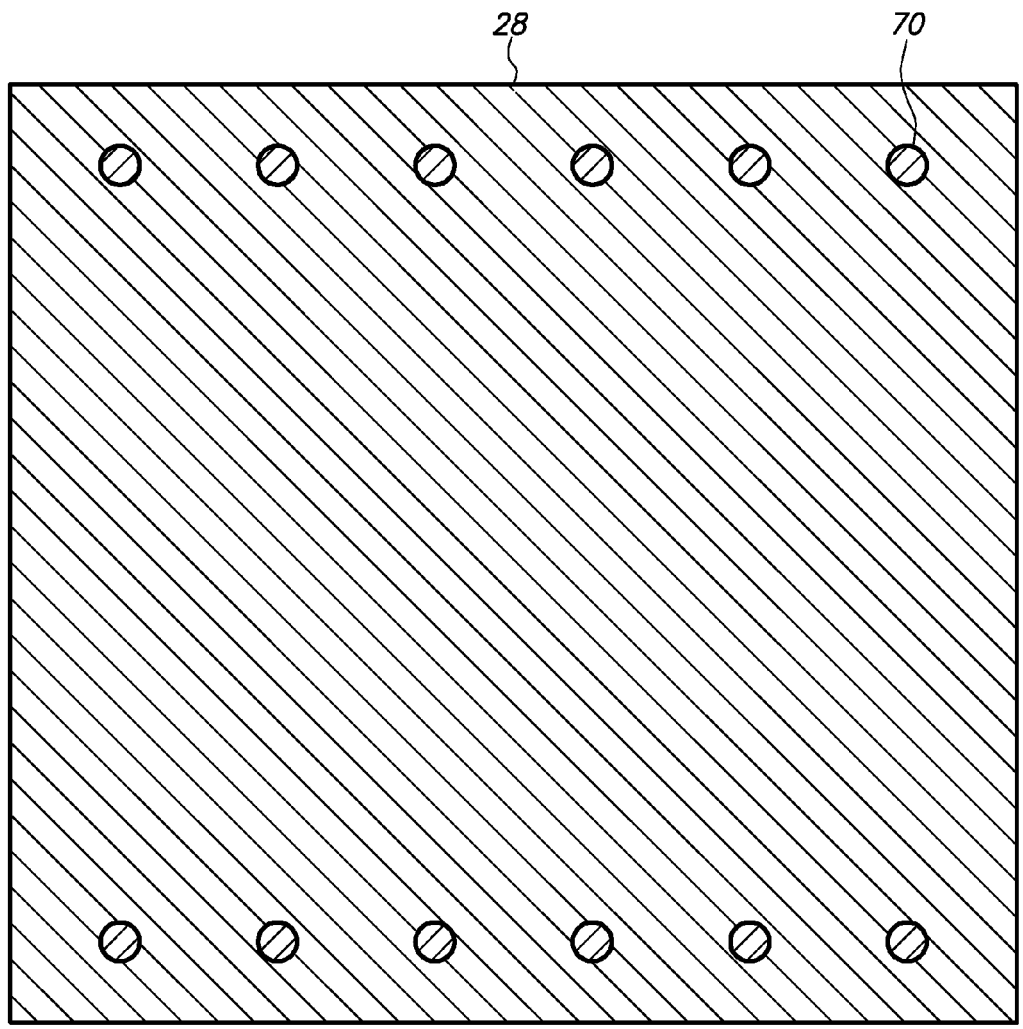
Figure 10A:
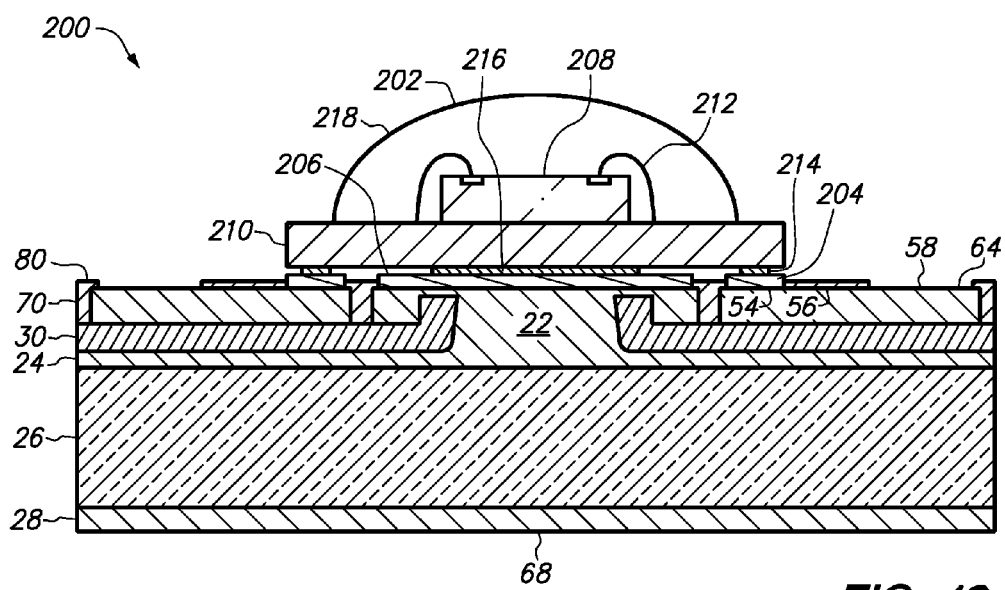
FIGS. 10A, 10B, 10C and 10D are cross-sectional, cross-sectional, top and bottom views, respectively, of a semiconductor chip assembly that includes a thermal board and a semiconductor device with backside contacts in accordance with an embodiment of the present invention.
Figure 10B:
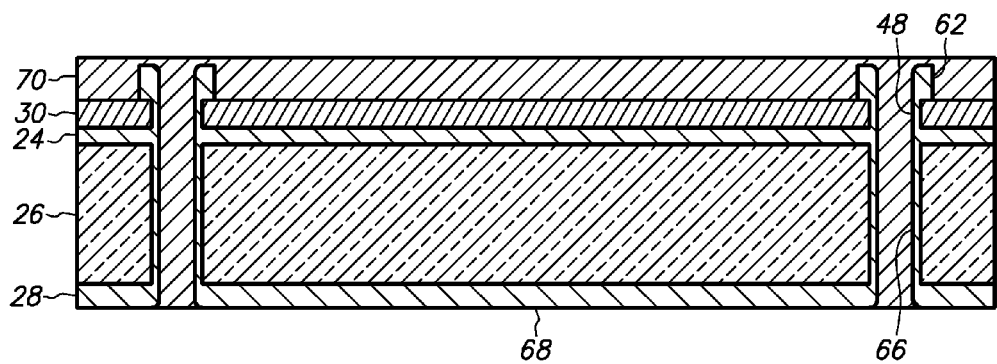
Figure 10C:
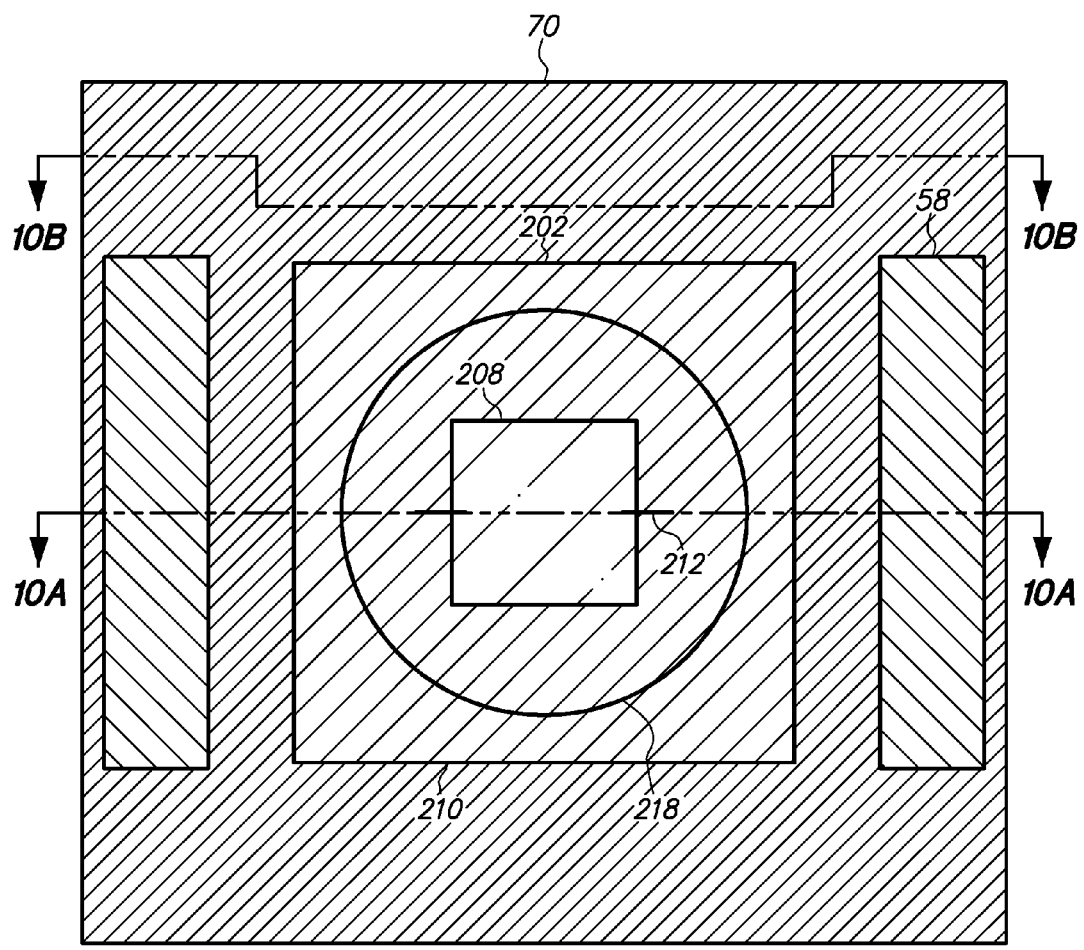
Figure 10D:
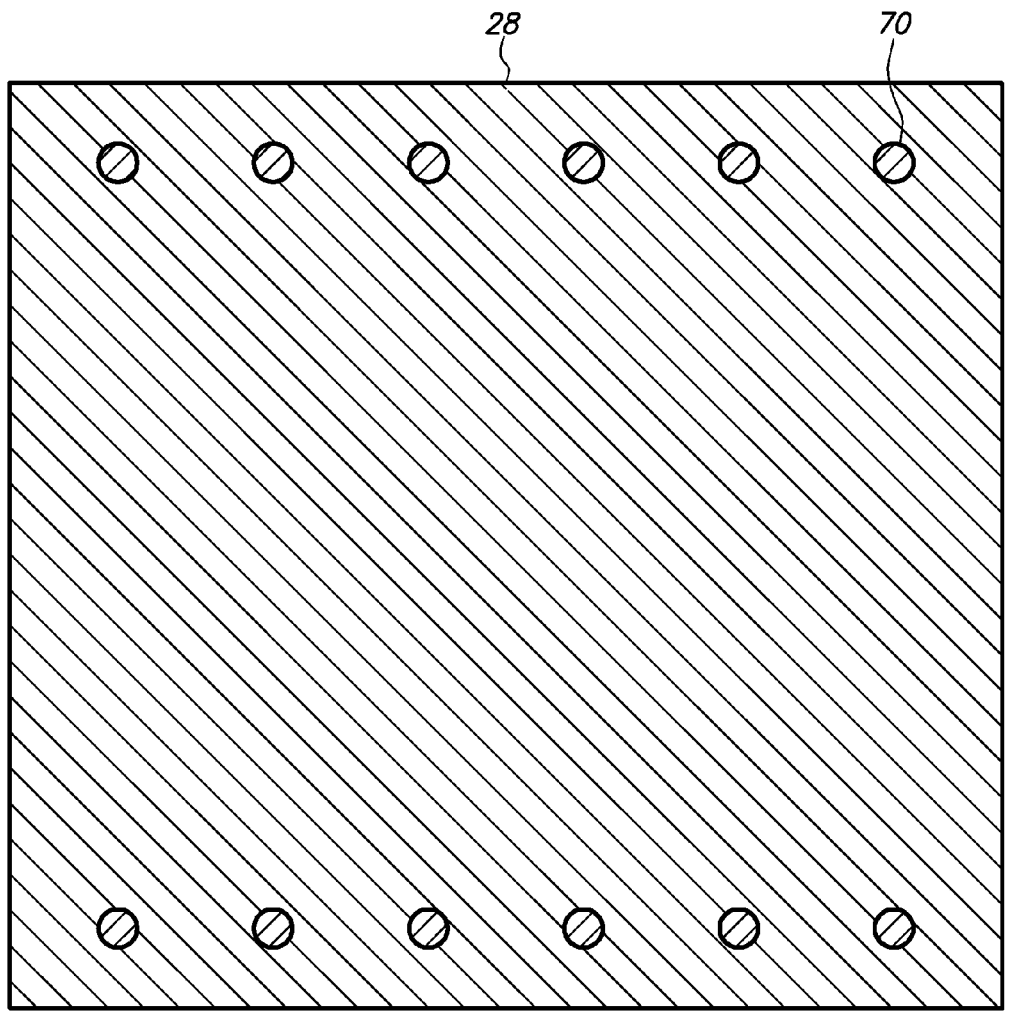

FIGS. 3A and 3B are cross-sectional views showing a method of making a conductive layer in accordance with an embodiment of the present invention, and FIGS. 3C and 3D are top and bottom views, respectively, corresponding to FIG. 3B.

FIG. 3A is a cross-sectional view of conductive layer 34. Conductive layer 34 is illustrated as an unpatterned copper sheet with a thickness of 80 microns.

FIGS. 3B, 3C and 3D are cross-sectional, top and bottom views, respectively, of conductive layer 34 with aperture 36. Aperture 36 is a window that extends through conductive layer 34 and has a length and width of 1250 microns. Aperture 36 is formed by punching or stamping through conductive layer 34 although other techniques such as wet chemical etching can be used.

FIGS. 4A1-4M1 are cross-sectional views showing a method of making a thermal board that includes post 22, base 24, support layer 26, underlayer 28, adhesive 30 and conductive layer 34 in accordance with an embodiment of the present invention, FIGS. 4E2-4M2 are cross-sectional views corresponding to FIGS. 4E1-4M1, respectively, FIGS. 4E3-4M3 are top views corresponding to FIGS. 4E1-4M1, respectively, and FIG. 4M4 is a bottom view corresponding to FIG. 4M1.

In FIGS. 4E1-4M1 the conductive trace fabrication is depicted but the thermal via fabrication is omitted, in FIGS. 4E2-4M2 the thermal via fabrication is depicted but the conductive trace fabrication is omitted and in FIGS. 4E3-4M3 the conductive trace and thermal via fabrication is depicted.

FIG. 4A1 is a cross-sectional view of the structure with adhesive 30 mounted on base 24. Adhesive 30 is mounted by lowering it onto base 24 as post 22 is inserted into and through and upwards in opening 32. Adhesive 30 eventually contacts and rests on base 24. Preferably, post 22 is inserted into and extends through opening 32 without contacting adhesive 30 and is aligned with and centrally located within opening 32.

FIG. 4B1 is a cross-sectional view of the structure with conductive layer 34 mounted on adhesive 30. Conductive layer 34 is mounted by lowering it onto adhesive 30 as post 22 is inserted into and upwards in aperture 36. Conductive layer 34 eventually contacts and rests on adhesive 30.

Post 22 is inserted into but not through aperture 36 without contacting conductive layer 34 and is aligned with and centrally located within aperture 36. As a result, gap 38 is located in aperture 36 between post 22 and conductive layer 34. Gap 38 laterally surrounds post 22 and is laterally surrounded by conductive layer 34. In addition, opening 32 and aperture 36 are precisely aligned with one another and have the same length and width.

At this stage, conductive layer 34 alone is mounted on adhesive 30 and contacts and extends above adhesive 30. Post 22 extends through opening 32 into aperture 36, is 30 microns below the top surface of conductive layer 34 and is exposed through aperture 36 in the upward direction. Adhesive 30 contacts and is sandwiched between base 24 and conductive layer 34 and remains a non-solidified prepreg with B-stage uncured epoxy, and gap 38 is filled with air.

FIG. 4C1 is a cross-sectional view of the structure with adhesive 30 in gap 38. Adhesive 30 is flowed into gap 38 by applying heat and pressure. In this illustration, adhesive 30 is forced into gap 38 by applying downward pressure to conductive layer 34 and/or upward pressure to underlayer 28, thereby moving base 24 and conductive layer 34 towards one another and applying pressure to adhesive 30 while simultaneously applying heat to adhesive 30. Adhesive 30 becomes compliant enough under the heat and pressure to conform to virtually any shape. As a result, adhesive 30 sandwiched between base 24 and conductive layer 34 is compressed, forced out of its original shape and flows into and upward in gap 38. Base 24 and conductive layer 34 continue to move towards one another and adhesive 30 eventually fills gap 38. Moreover, adhesive 30 remains sandwiched between and continues to fill the reduced space between base 24 and conductive layer 34.

For instance, underlayer 28 and conductive layer 34 can be disposed between top and bottom platens (not shown) of a press. In addition, a top cull plate and top buffer paper (not shown) can be sandwiched between conductive layer 34 and the top platen, and a bottom cull plate and bottom buffer paper (not shown) can be sandwiched between underlayer 28 and the bottom platen. The stack includes the top platen, top cull plate, top buffer paper, conductive layer 34, adhesive 30, base 24, support layer 26, underlayer 28, bottom buffer paper, bottom cull plate and bottom platen in descending order. Furthermore, the stack may be positioned on the bottom platen by tooling pins (not shown) that extend upward from the bottom platen through registration holes (not shown) in base 24, support layer 26 and underlayer 28.

The platens are heated and move towards one another, thereby applying heat and pressure to adhesive 30. The cull plates disperse the heat from the platens so that it is more uniformly applied to underlayer 28 and conductive layer 34 and thus adhesive 30, and the buffer papers disperse the pressure from the platens so that it is more uniformly applied to underlayer 28 and conductive layer 34 and thus adhesive 30. Initially, conductive layer 34 contacts and presses down on adhesive 30. As the platen motion and heat continue, adhesive 30 between base 24 and conductive layer 34 is compressed, melted and flows into and upward in gap 38. For instance, the uncured epoxy is melted by the heat and the molten uncured epoxy is squeezed by the pressure into gap 38, however the reinforcement and the filler remain between base 24 and conductive layer 34.

Adhesive 30 elevates more rapidly than post 22 in aperture 36 and fills gap 38. Adhesive 30 also rises slightly above gap 38 and overflows onto the top surfaces of post 22 and conductive layer 34 adjacent to gap 38 before the platen motion stops. This may occur due to the prepreg being slightly thicker than necessary. As a result, adhesive 30 creates a thin coating on the top surfaces of post 22 and conductive layer 34. The platen motion is eventually blocked by post 22 and the platens become stationary but continue to apply heat to adhesive 30.

The upward flow of adhesive 30 in gap 38 is shown by the thick upward arrows, the upward motion of post 22, base 24, support layer 26 and underlayer 28 relative to conductive layer 34 is shown by the thin upward arrows, and the downward motion of conductive layer 34 relative to post 22, base 24, support layer 26 and underlayer 28 is shown by the thin downward arrows.

FIG. 4D1 is a cross-sectional view of the structure with adhesive 30 solidified.

For instance, the platens continue to clamp post 22 and underlayer 28 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between post 22 and conductive layer 34 and between base 24 and conductive layer 34. Adhesive 30 can withstand normal operating pressure without distortion or damage and is only temporarily distorted under unusually high pressure. Furthermore, adhesive 30 can absorb thermal expansion mismatch between post 22 and conductive layer 34 and between base 24 and conductive layer 34.

At this stage, post 22 and conductive layer 34 are essentially coplanar with one another and adhesive 30 and conductive layer 34 extend to a top surface that faces in the upward direction. For instance, adhesive 30 between base 24 and conductive layer 34 has a thickness of 70 microns which is 30 microns less than its initial thickness of 100 microns, post 22 ascends 30 microns in aperture 36 and conductive layer 34 descends 30 microns relative to post 22. The 150 micron height of post 22 is essentially the same as the combined height of conductive layer 34 (80 microns) and the underlying adhesive 30 (70 microns). Furthermore, post 22 continues to be centrally located in opening 32 and aperture 36 and spaced from conductive layer 34 and adhesive 30 fills the space between post 22 and conductive layer 34 and fills the space between base 24 and conductive layer 34. For instance, gap 38 (as well as adhesive 30 between post 22 and conductive layer 34) has a width of 125 microns ((1250−1000)/2) at the top surface of post 22.

Adhesive 30 extends across conductive layer 34 in gap 38. That is, adhesive 30 in gap 38 extends in the upward and downward directions across the thickness of conductive layer 34 at the outer sidewall of gap 38. Adhesive 30 also includes a thin top portion above gap 38 that contacts the top surfaces of post 22 and conductive layer 34 and extends above post 22 by 10 microns.

FIGS. 4E1, 4E2 and 4E3 are cross-sectional, cross-sectional and top views, respectively, of the structure after upper portions of post 22, adhesive 30 and conductive layer 34 are removed.

Post 22, adhesive 30 and conductive layer 34 have their upper portions removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts post 22 and conductive layer 34 (not necessarily at the same time), and as a result, begins to grind post 22 and conductive layer 34 as well. As the grinding continues, post 22, adhesive 30 and conductive layer 34 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 30, a 15 micron thick upper portion of post 22 and a 15 micron thick upper portion of conductive layer 34. The decreased thickness does not appreciably affect post 22, adhesive 30 or conductive layer 34.

At this stage, post 22, adhesive 30 and conductive layer 34 are coplanar with one another at a smoothed lapped lateral top surface that faces in the upward direction.

FIGS. 4F1, 4F2 and 4F3 are cross-sectional, cross-sectional and top views, respectively, of the structure with hole 40. Hole 40 is a through-hole that extends through base 24, support layer 26, underlayer 28, adhesive 30 and conductive layer 34 and has a diameter of 250 microns. Hole 40 is formed by mechanical drilling although other techniques such as laser drilling, plasma etching and wet chemical etching can be used. For instance, base 24, underlayer 28 and conductive layer 34 can be opened by wet chemical etching and support layer 26 and adhesive 30 can be opened by laser drilling or plasma etching.

FIGS. 4G1, 4G2 and 4G3 are cross-sectional, cross-sectional and top views, respectively, of the structure with plated layer 42 deposited on post 22, underlayer 28, adhesive 30 and conductive layer 34. Plated layer 42 forms upper plated layer 44, lower plated layer 46 and plated through-hole 48.

Upper plated layer 44 is deposited on and contacts post 22, adhesive 30 and conductive layer 34 at the lateral top surface and covers them in the upward direction. Upper plated layer 44 is an unpatterned copper layer with a thickness of 25 microns.

Lower plated layer 46 is deposited on and contacts and increases the thickness of underlayer 28. Lower plated layer 46 is an unpatterned copper layer with a thickness of 25 microns.

Plated through-hole 48 is deposited on and extends through base 24, support layer 26, underlayer 28, adhesive 30 and conductive layer 34 in hole 40 and covers the sidewall in the lateral directions. Plated through-hole 48 is a copper tube with a thickness of 25 microns that is metallurgically bonded to and thermally connects base 24, underlayer 28 and conductive layer 34. As a result, plated through-hole 48 extends from base 24 through support layer 26 to underlayer 28 and provides a thermally conductive path between base 24 and underlayer 28.

For instance, the structure is dipped in an activator solution to render support layer 26 and adhesive 30 catalytic to electroless copper, then a first copper layer is electrolessly plated on post 22, base 24, support layer 26, underlayer 28, adhesive 30 and conductive layer 34, and then a second copper layer is electroplated on the first copper layer. The first copper layer has a thickness of 2 microns, the second copper layer has a thickness of 23 microns, and plated layer 42 (and plated layers 44 and 46 and plated through-hole 48) has a thickness of 25 microns. As a result, underlayer 28 essentially grows and has a thickness of 60 microns (35+25) and conductive layer 34 essentially grows and has a thickness of 90 microns (65+25).

Upper plated layer 44 serves as a cover layer for post 22 and adhesive 30 and a build-up layer for conductive layer 34, lower plated layer 46 serves as a build-up layer for underlayer 28 and plated through-hole 48 serves as a thermal interconnect for base 24 and underlayer 28.

Post 22, conductive layer 34, upper plated layer 44 and plated through-hole 48 are shown as a single layer for convenience of illustration Likewise, underlayer 28, lower plated layer 46 and plated through-hole 48 are shown as a single layer for convenience of illustration. The boundary (shown in phantom) between post 22 and upper plated layer 44, between conductive layer 34 and upper plated layer 44, between conductive layer 34 and plated through-hole 48, between underlayer 28 and lower plated layer 46 and between underlayer 28 and plated through-hole 48 may be difficult or impossible to detect since copper is plated on copper. However, the boundary between support layer 26 and plated through-hole 48 in hole 40, between adhesive 30 and plated through-hole 48 in hole 40 and between adhesive 30 and upper plated layer 44 outside hole 40 is clear.

FIGS. 4H1, 4H2 and 4H3 are cross-sectional, cross-sectional and top views, respectively, of the structure with etch mask 50 and cover mask 52 formed on plated layers 44 and 46, respectively. Etch mask 50 and cover mask 52 are illustrated as photoresist layers similar to photoresist layers 16 and 18, respectively. Photoresist layer 50 has a pattern that selectively exposes upper plated layer 44, and photoresist layer 18 remains unpatterned and covers underlayer 28 in the downward direction.

FIGS. 4I1, 4I2 and 4I3 are cross-sectional, cross-sectional and top views, respectively, of the structure with selected portions of conductive layer 34 and upper plated layer 44 removed by etching conductive layer 34 and upper plated layer 44 in the pattern defined by etch mask 50. The etching is a frontside wet chemical etch similar to the etch applied to metal plate 10. For instance, the structure can be inverted as a bottom spray nozzle upwardly sprays the wet chemical etch while a top spray nozzle is deactivated, or the structure can be dipped in the wet chemical etch. The wet chemical etch etches through conductive layer 34 and upper plated layer 44 to adhesive 30 and exposes adhesive 30 in the upward direction without exposing post 22, base 24, support layer 26, underlayer 28 or plated through-hole 48 and converts conductive layer 34 and upper plated layer 44 from unpatterned into patterned layers.

FIGS. 4J1, 4J2 and 4J3 are cross-sectional, cross-sectional and top views, respectively, of the structure after etch masks 50 and 52 are removed. Photoresist layers 50 and 52 can be stripped in the same manner as photoresist layers 16 and 18.

Conductive layer 34 and upper plated layer 44 as etched include pad 54, routing line 56, terminal 58, cap 60 and stub 62. Pad 54, routing line 56, terminal 58, cap 60 and stub 62 are unetched portions of conductive layer 34 and upper plated layer 44 defined by etch mask 50. Thus, conductive layer 34 and upper plated layer 44 are a patterned layer that includes pad 54, routing line 56, terminal 58, cap 60 and stub 62.

Pad 54 and terminal 58 are unetched portions of conductive layer 34 and upper plated layer 44 defined by etch mask 50 that are spaced from plated through-hole 48, cap 60, stub 62 and one another. Routing line 56 is an unetched portion of conductive layer 34 and upper plated layer 44 defined by etch mask 50 that is adjacent to and extends laterally from and electrically connects pad 54 and terminal 58. Thus, routing line 56 provides an electrically conductive path between pad 54 and terminal 58. Cap 60 is an unetched portion of conductive layer 34 and upper plated layer 44 defined by etch mask 50 that extends above and is adjacent to and covers in the upward direction and extends laterally from and is thermally connected to the top of post 22. Stub 62 is an unetched portion of conductive layer 34 and upper plated layer 44 defined by etch mask 50 that is adjacent to and extends laterally from plated through-hole 48.

Pad 54, routing line 56, terminal 58 and stub 62 have a thickness of 90 microns (65+25). Cap 60 has a thickness of 25 microns where it is adjacent to post 22 and includes a selected portion of upper plated layer 44 and excludes conductive layer 34 and a thickness of 90 microns (65+25) where it includes selected portions of conductive layer 34 and upper plated layer 44.

Thus, pad 54 and terminal 58 contact and extend above adhesive 30, have the same thickness and are spaced from and coplanar with one another Likewise, pad 54 and cap 60 contact and extend above adhesive 30, have the same thickness where they are closest to one another, have different thickness where cap 60 is adjacent to post 22 and are spaced from and coplanar with one another.

Conductive trace 64 is provided by pad 54, routing line 56 and terminal 58. Thermal via 66 is provided by plated through-hole 48 and stub 62. Heat spreader 68 is provided by post 22, base 24, underlayer 28, cap 60 and thermal via 66.

FIGS. 4K1, 4K2 and 4K3 are cross-sectional, cross-sectional and top views, respectively, of the structure with solder mask 70 formed on conductive trace 64 and heat spreader 68.

Solder mask 70 is an electrically insulative layer that is selectively patterned to expose pad 54, terminal 58 and cap 64 in the upward direction, cover routing line 56 and thermal via 66 in the upward direction and cover adhesive 30 where it is otherwise exposed in the upward direction while underlayer 28 remains exposed in the downward direction. Solder mask 70 has a thickness of 25 microns above pad 54, routing line 56, terminal 58, cap 60 and stub 62, extends 115 microns (90+25) above adhesive 30 and fills the inner hole in plated through-hole 48.

Solder mask 70 is initially a photoimageable liquid resin that is dispensed on the structure. Thereafter, solder mask 70 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIGS. 4L1, 4L2 and 4L3 are cross-sectional, cross-sectional and top views, respectively, of the structure with plated contacts 72 formed on conductive trace 64 and heat spreader 68.

Plated contacts 72 are thin spot plated metal coatings that contact the exposed copper surfaces. Thus, plated contacts 72 contact pad 54, terminal 58 and cap 60 and cover them in the upward direction, contact underlayer 28 and cover it in the downward direction and are spaced from post 22, base 24 and thermal via 66. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 72 have a thickness of 3.5 microns.

Underlayer 28, pad 54, terminal 58 and cap 60 treated with plated contacts 72 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 72 also protect conductive trace 64 and heat spreader 68 from corrosion. Plated contacts 72 can include a wide variety of metals to accommodate the external connection media. For instance, a gold surface layer can be plated on a buried nickel layer or a nickel surface layer alone can be employed.

Underlayer 28, pad 54, terminal 58 and cap 60 treated with plated contacts 72 are shown as single layers for convenience of illustration. The boundary (not shown) in underlayer 28, pad 54, terminal 58 and cap 60 with plated contacts 72 occurs at the copper/nickel interface.

At this stage, the manufacture of thermal board 80 can be considered complete.

FIGS. 4M1, 4M2, 4M3 and 4M4 are cross-sectional, cross-sectional, top and bottom views, respectively, of thermal board 80 after it is detached at peripheral edges along cut lines from a support frame and/or adjacent thermal boards in a batch.

Thermal board 80 includes support layer 26, adhesive 30, conductive trace 64, heat spreader 68 and solder mask 70. Conductive trace 64 includes pad 54, routing line 56 and terminal 58. Heat spreader 68 includes post 22, base 24, underlayer 28, cap 60 and thermal via 66 which includes plated through-hole 48 and stub 62.

Post 22 is adjacent to and integral with base 24, overlaps base 24, support layer 26 and underlayer 28, extends into and is centrally located within opening 32 and remains centrally located within the peripheries of base 24, support layer 26, underlayer 28, adhesive 30 and cap 60. Post 22 retains its cut-off pyramidal shape with tapered sidewalls in which its diameter (length and width) decreases as it extends upwardly from base 24 to its flat square top adjacent to cap 60. Post 22 is also coplanar with adhesive 30 at their tops at cap 60 and at their bottoms at base 24.

Base 24 is located below post 22, adhesive 30 and conductive trace 64, contacts and is sandwiched between support layer 26 and adhesive 30, covers post 22, cap 60 and conductive trace 64 in the downward direction and extends laterally from post 22 to the peripheral edges of thermal board 80. Base 24 is also sandwiched between post 22 and underlayer 28 and between support layer 26 and adhesive 30.

Support layer 26 is located below post 22, base 24, adhesive 30 and conductive trace 64, contacts and is sandwiched between base 24 and underlayer 28, covers post 22, cap 60 and conductive trace 64 in the downward direction and extends laterally beyond post 22 to the peripheral edges of thermal board 80. Support layer 26 provides mechanical support for base 24 but is primarily plastic and relatively thick and does not thermally connect base 24 and underlayer 28. As a result, support layer 26 is not part of heat spreader 68.

Underlayer 28 is located below post 22, base 24, support layer 26, adhesive 30 and conductive trace 64, is spaced from base 24, covers post 22, cap 60 and conductive trace 64 in the downward direction and extends laterally beyond post 22 the peripheral edges of thermal board 80.

Plated through-hole 48 extends from base 24 through support layer 26 to underlayer 28, is metallurgically bonded to base 24 and underlayer 28 and provides a thermally conductive path between base 24 and underlayer 28. Plated through-hole 48 also extends above post 22 and adhesive 30, extends through base 24 and adhesive 30 to stub 62 and contacts support layer 26 and adhesive 30 in hole 40. Plated through-hole 48 also retains its tubular shape with straight vertical inner and outer sidewalls in which its diameter is constant as it extends upward from underlayer 28 to stub 62.

Stub 62 extends above post 22 and adhesive 30 and is coplanar with routing line 56 above post 22 and adhesive 30.

Thermal via 66 is spaced from and laterally offset from post 22 and cap 60. Furthermore, thermal via 66 provides no electrical function. For instance, stub 62 is covered by solder mask 70 in the upward direction and is not configured as a pad or a terminal. Moreover, stub 62 and plated through-hole 48 above base 24 provide no thermal function. Instead, they are unnecessary remnants of conductive layer 34, upper plated layer 44 and plated through-hole 48 covered by etch mask 50 as the wet chemical etch is applied to conductive layer 34 and upper plated layer 44 to form pad 54, routing line 56, terminal 58 and cap 60 in order to protect plated through-hole 48 below base 24 from the wet chemical etch. Thus, stub 62 and plated through-hole 48 above base 24 can but need not be removed.

Heat spreader 68 is essentially a heat slug with a buried copper core shared by post 22, base 24, underlayer 28, cap 60 and thermal via 66.

Adhesive 30 is mounted on and extends above base 24, contacts and is sandwiched between post 22 and plated through-hole 48, between post 22 and cap 60, between base 24 and pad 54, between base 24 and routing line 56, between base 24 and terminal 58, between base 24 and cap 60 and between base 24 and stub 62 and is spaced from support layer 26 and underlayer 28. Adhesive 30 also extends laterally from post 22 beyond terminal 58, covers pad 54, routing line 56 and terminal 58 in the downward direction, covers cap 60 outside the periphery of post 22 in the downward direction, covers and surrounds post 22 in the lateral directions, fills most of the space between conductive trace 64 and heat spreader 68 and is solidified.

Adhesive 30 alone can intersect an imaginary horizontal line between post 22 and plated through-hole 48, an imaginary horizontal line between post 22 and cap 60, an imaginary vertical line between base 24 and pad 54, an imaginary vertical line between base 24 and routing line 56, an imaginary vertical line between base 24 and terminal 58, an imaginary vertical line between base 24 and cap 60 and an imaginary vertical line between base 24 and stub 62. Thus, an imaginary horizontal line exists that intersects only adhesive 30 as the line extends from post 22 to plated through-hole 48, an imaginary vertical line exists that intersects only adhesive 30 as the line extends from base 24 to cap 60 and so on.

Pad 54, routing line 56 and terminal 58 contact and are mounted on and extend above adhesive 30, are located above and spaced from base 24, support layer 26 and underlayer 28 and are spaced from heat spreader 68.

Pad 54 and terminal 58 have the same thickness and are coplanar with one another above adhesive 30 at a top surface that faces in the upward direction and is exposed.

Pad 54 and cap 60 have the same thickness where they are closest to one another, have different thickness where cap 60 is adjacent to post 22 and are coplanar with one another above adhesive 30 at a top surface that faces in the upward direction and is exposed.

Routing line 56 and stub 62 have the same thickness and are coplanar with one another above adhesive 30 at top surfaces that face in the upward direction and are covered by solder mask 70.

Base 24, support layer 26, underlayer 28, adhesive 30 and solder mask 70 extend to straight vertical peripheral edges of thermal board 80 after it is detached or singulated from a batch of identical simultaneously manufactured thermal boards.

Pad 54 is customized as an electrical interface for a semiconductor device such as an LED chip that is subsequently mounted on cap 60, terminal 58 is customized as an electrical interface for the next level assembly such as a solderable wire or electrical contact from a printed circuit board, cap 60 is customized as a thermal interface for the semiconductor device, and underlayer 28 is customized as a thermal interface for the next level assembly such as the printed circuit board or a heat sink for an electronic device.

Pad 54 and terminal 58 are horizontally offset from one another and exposed at the top surface of thermal board 80, thereby providing horizontal signal routing between the semiconductor device and the next level assembly.

Conductive trace 64 provides horizontal (fan-out) routing from pad 54 to terminal 58 by routing line 56. Conductive trace 64 is not limited to this configuration. For instance, the electrically conductive path between pad 54 and terminal 58 can include vias that extend through adhesive 30 and additional routing lines (above and/or below adhesive 30) as well as passive components such as resistors and capacitors mounted on additional pads.

Conductive trace 64 is shown in cross-section as a continuous circuit trace for convenience of illustration. However, conductive trace 64 can provide horizontal signal routing in both the X and Y directions. That is, pad 54 and terminal 58 can be laterally offset from one another in the X and Y directions.

Conductive trace 64 and heat spreader 68 remain spaced from one another. As a result, conductive trace 64 and heat spreader 68 are mechanically attached and electrically isolated from one another.

Heat spreader 68 provides heat spreading and heat dissipation from a semiconductor device that is subsequently mounted on cap 60 to the next level assembly that thermal board 80 is subsequently mounted on. The semiconductor device generates heat that flows into cap 60, from cap 60 into post 22, through post 22 into base 24, through base 24 into thermal via 66 and through thermal via 66 into underlayer 28, where it is spread out relative to post 22 and dissipated in the downward direction, for instance to an underlying heat sink.

Post 22, base 24, routing line 56 and thermal via 66 are copper. Underlayer 28, pad 54, terminal 58 and cap 60 are copper/nickel/silver, consist of a silver surface layer, a buried copper core and a buried nickel layer that contacts and is sandwiched between the silver surface layer and the buried copper core and are primarily copper at the buried copper core. Plated contacts 72 provide the silver surface layer and the buried nickel layer and various combinations of metal plate 10, underlayer 28, conductive layer 34 and plated layer 42 provide the buried copper core.

Conductive trace 64 includes a buried copper core shared by pad 54, routing line 56 and terminal 58 and heat spreader 68 includes a buried copper core shared by post 22, base 24, underlayer 28, cap 60 and thermal via 66. Furthermore, conductive trace 64 includes a plated contact 72 at pad 54 and at terminal 58 and heat spreader 68 includes a plated contact 72 at underlayer 28 and at cap 60. Moreover, conductive trace 64 consists of copper/nickel/silver and is primarily copper at the buried copper core and heat spreader 68 consists of copper/nickel/silver and is primarily copper at the buried copper core.

Thermal board 80 does not expose post 22, base 24, support layer 26 or thermal via 66 in the upward direction. Post 22 is shown in phantom in FIG. 4M3 for convenience of illustration.

Thermal board 80 can include multiple conductive traces 64 with a pad 54, routing line 56 and terminal 58. A single conductive trace 64 is described and labeled for convenience of illustration. In conductive traces 64, pads 54 and terminals 58 generally have similar shapes and sizes whereas routing lines 56 may (but need not) have different routing configurations. For instance, some conductive traces 64 may be spaced and separated and electrically isolated from one another whereas other conductive traces 64 can intersect or route to the same pad 54 or terminal 58 and be electrically connected to one another. Likewise, some pads 54 may receive independent signals whereas other pads 54 share a common signal, power or ground.

Thermal board 80 can include multiple thermal vias 66 with a plated through-hole 48 and stub 62. A single thermal via 66 is described and labeled for convenience of illustration. In thermal vias 66, plated through-holes 48 and stubs 62 generally have similar shapes and sizes. For instance, thermal vias 66 may be arranged in two identical rows that are parallel to routing lines 56 and one another in the X direction and are laterally offset from and located on opposite sides of post 22 and cap 60 in the Y direction. In any case, thermal vias 66 provide separate thermally conductive paths from base 24 to underlayer 28.

Thermal board 80 can be adapted for an LED package with blue, green and red LED chips, with each LED chip including an anode and a cathode and each LED package including a corresponding anode terminal and cathode terminal. In this instance, thermal board 80 can include six pads 54 and four terminals 58 so that each anode is routed from a separate pad 54 to a separate terminal 58 whereas each cathode is routed from a separate pad 54 to a common ground terminal 58.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 64 after they are formed. A plating bus can be disconnected during the wet chemical etch that forms pad 54, routing line 56, terminal 58, cap 60 and stub 62.

Thermal board 80 can include registration holes (not shown) that are drilled or sliced through base 24, support layer 26, underlayer 28, adhesive 30 and solder mask 70 so that thermal board 80 can be positioned by inserting tooling pins through the registration holes when it is subsequently mounted on an underlying carrier.

Thermal board 80 can accommodate multiple semiconductor devices rather than one with a single post 22 or multiple posts 22. Thus, multiple semiconductor devices can be mounted on a single post 22 or separate semiconductor devices can be mounted on separate posts 22. Likewise, multiple semiconductor devices can be mounted on a single cap 60 or separate semiconductor devices can be mounted on multiple caps 60.

Thermal board 80 with a single post 22 for multiple semiconductor devices can be accomplished by adjusting etch mask 50 to define additional pads 54, routing lines 56 and terminals 58. The pads 54, routing lines 56 and terminals 58 can be laterally repositioned to provide a 2×2 array for four semiconductor devices. In addition, the topography (lateral shape) can be adjusted for pads 54 and terminals 58. Likewise, thermal vias 66 can be laterally repositioned to accommodate the additional conductive traces 64.

Thermal board 80 with multiple posts 22 for multiple semiconductor devices can be accomplished by adjusting etch mask 16 to define additional posts 22, adjusting adhesive 30 to include additional openings 32, adjusting conductive layer 34 to include additional apertures 36 and adjusting etch mask 50 to define additional pads 54, routing lines 56, terminals 58 and caps 60. These elements can be laterally repositioned to provide a 2×2 array for four semiconductor devices. In addition, the topography (lateral shape) can be adjusted for posts 22, pads 54, routing lines 56, terminals 58 and caps 60. Likewise, thermal vias 66 can be laterally repositioned to accommodate the additional posts 22, caps 60 and conductive traces 64.

FIGS. 5A, 5B, 5C and 5D are cross-sectional, cross-sectional, top and bottom views, respectively, of a thermal board with a second adhesive in accordance with an embodiment of the present invention.

In this embodiment, a second adhesive is sandwiched between the base and the support layer. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 82 includes support layer 26, adhesive 30, conductive trace 64, heat spreader 68, solder mask 70 and adhesive 74. Conductive trace 64 includes pad 54, routing line 56 and terminal 58. Heat spreader 68 includes post 22, base 24, underlayer 28, cap 60 and thermal via 66 which includes plated through-hole 48 and stub 62.

Adhesive 74 contacts and is sandwiched between base 24 and support layer 26. Plated through-hole 48 contacts and extends through adhesive 74. Base 24 and support layer 26 are spaced from one another and adhesives 30 and 74 are spaced from one another. Thermal via 66 extends from base 24 through support layer 26 and adhesive 74 to underlayer 28.

Thermal board 82 can be manufactured in a manner similar to thermal board 80 with suitable adjustments for adhesive 74. For instance, adhesive 74 is an electrically insulative epoxy sheet with a thickness of 50 microns and a metal layer (not shown) is an unpatterned copper sheet with a thickness of 35 microns identical to underlayer 28. Furthermore, support layer 26, underlayer 28 and the metal layer are a double-sided copper clad laminate in which support layer 26 contacts and is sandwiched between underlayer 28 and the metal layer. Thereafter, the metal layer is stripped and support layer 26 and underlayer 28 become a single-sided copper clad laminate. Thereafter, support layer 26 and underlayer 28 are attached to base 24 by second adhesive 74.

Adhesive 30 is mounted on base 24, conductive layer 34 is mounted on adhesive 30 and heat and pressure are applied to flow and solidify adhesive 30. Thereafter, grinding is applied to planarize post 22, adhesive 30 and conductive layer 34 at the top surface, hole 40 is drilled through base 24, support layer 26, underlayer 28, adhesive 30, conductive layer 34 and adhesive 74 and then plated layers 44 and 46 and plated through-hole 48 are deposited on the structure. Thereafter, conductive layer 34 and plated layer 44 are etched to form pad 54, routing line 56, terminal 58, cap 60 and stub 62, then solder mask 70 is formed on the top surface and then plated contacts 72 provide a surface finish for underlayer 28, pad 54, terminal 58 and cap 60. Thereafter, base 24, support layer 26, underlayer 28, adhesive 30, solder mask 70 and adhesive 74 are cut or cracked at the peripheral edges of thermal board 82 to detach it from the batch.

FIGS. 6A, 6B, 6C and 6D are cross-sectional, cross-sectional, top and bottom views, respectively, of a thermal board with a second adhesive and a metal layer in accordance with an embodiment of the present invention.

In this embodiment, a second adhesive and a metal layer are sandwiched between the base and the support layer. For purposes of brevity, any description of thermal board 80 is incorporated herein insofar as the same is applicable, and the same description need not be repeated Likewise, elements of the thermal board similar to those in thermal board 80 have corresponding reference numerals.

Thermal board 84 includes support layer 26, adhesive 30, conductive trace 64, heat spreader 68, solder mask 70 and adhesive 74. Conductive trace 64 includes pad 54, routing line 56 and terminal 58. Heat spreader 68 includes post 22, base 24, underlayer 28, cap 60, thermal via 66 and metal layer 75. Thermal via 66 includes plated through-hole 48 and stub 62.

Adhesive 74 contacts and is sandwiched between base 24 and metal layer 75. Metal layer 75 contacts and is sandwiched between support layer 26 and adhesive 74. Plated through-hole 48 contacts and extends through adhesive 74 and is metallurgically bonded to and extends through metal layer 75. Base 24, support layer 26 and metal layer 75 are spaced from one another and adhesives 30 and 74 are spaced from one another. Thermal via 66 extends from base 24 through support layer 26, adhesive 74 and metal layer 75 to underlayer 28.

Thermal board 84 can be manufactured in a manner similar to thermal board 80 with suitable adjustments for adhesive 74 and metal layer 75. For instance, adhesive 74 is an electrically insulative epoxy sheet with a thickness of 50 microns and metal layer 75 is an unpatterned copper sheet with a thickness of 35 microns identical to underlayer 28. Furthermore, support layer 26, underlayer 28 and metal layer 75 are a double-sided copper clad laminate in which support layer 26 contacts and is sandwiched between underlayer 28 and metal layer 75. Thereafter, support layer 26, underlayer 28 and metal layer 75 are attached to base 24 by second adhesive 74.

Adhesive 30 is mounted on base 24, conductive layer 34 is mounted on adhesive 30 and heat and pressure are applied to flow and solidify adhesive 30. Thereafter, grinding is applied to planarize post 22, adhesive 30 and conductive layer 34 at the top surface, hole 40 is drilled through base 24, support layer 26, underlayer 28, adhesive 30, conductive layer 34, adhesive 74 and metal layer 75 and then plated layers 44 and 46 and plated through-hole 48 are deposited on the structure. Thereafter, conductive layer 34 and plated layer 44 are etched to form pad 54, routing line 56, terminal 58, cap 60 and stub 62, then solder mask 70 is formed on the top surface and then plated contacts 72 provide a surface finish for underlayer 28, pad 54, terminal 58 and cap 60. Thereafter, base 24, support layer 26, underlayer 28, adhesive 30, solder mask 70, adhesive 74 and metal layer 75 are cut or cracked at the peripheral edges of thermal board 84 to detach it from the batch.

Metal layer 75 provides no thermal function and instead is an unnecessary remnant of a double-sided copper clad laminate which can be removed (thermal board 82) or remain intact (thermal board 84).

FIGS. 7A, 7B, 7C and 7D are cross-sectional, cross-sectional, top and bottom views, respectively, of a thermal board with a dielectric layer in accordance with an embodiment of the present invention.

In this embodiment, a dielectric layer is sandwiched between the conductive trace and the adhesive. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 86 includes support layer 26, adhesive 30, conductive trace 64, heat spreader 68, solder mask 70 and dielectric layer 76. Conductive trace 64 includes pad 54, routing line 56 and terminal 58. Heat spreader 68 includes post 22, base 24, underlayer 28, cap 60 and thermal via 66 which includes plated through-hole 48 and stub 62.

Pad 54, routing line 56, terminal 58, cap 60 and stub 62 contact and are mounted on and extend above dielectric layer 76 and plated through-hole 48 contacts and extends through dielectric layer 76. Cap 60 contacts adhesive 30 between post 22 and dielectric layer 76 but pad 54, routing line 56, terminal 58 and stub 62 are spaced from adhesive 30. Dielectric layer 76 contacts and is sandwiched between adhesive 30 and pad 54, between adhesive 30 and routing line 56, between adhesive 30 and terminal 58, between adhesive 30 and cap 60 and between adhesive 30 and stub 62 is spaced from post 22 and base 24.

Thermal board 86 can be manufactured in a manner similar to thermal board 80 with suitable adjustments for dielectric layer 76. For instance, metal plate 10 is 250 microns (rather than 200 microns), post 22 has a height of 200 microns (rather than 150 microns), conductive layer 34 has a thickness of 30 microns (rather than 80 microns) and dielectric layer 76 is an electrically insulative epoxy sheet with a thickness of 100 microns. Furthermore, conductive layer 34 and dielectric layer 76 are a copper/epoxy substrate and aperture 36 extends through conductive layer 34 and dielectric layer 76.

Adhesive 30 is mounted on base 24 and then conductive layer 34 and dielectric layer 76 are mounted on adhesive 30. As a result, conductive layer 34 is attached to dielectric layer 76 and spaced from adhesive 30 and dielectric layer 76 contacts and is sandwiched between adhesive 30 and conductive layer 34. Furthermore, adhesive 30 is non-solidified and dielectric layer 76 is solidified.

Thereafter, heat and pressure are applied to flow and solidify adhesive 30, grinding is applied to planarize post 22, adhesive 30 and conductive layer 34 at the top surface, hole 40 is drilled through base 24, support layer 26, underlayer 28, adhesive 30, conductive layer 34 and dielectric layer 76 and then plated layers 44 and 46 and plated through-hole 48 are deposited on the structure. Thereafter, conductive layer 34 and plated layer 44 are etched to form pad 54, routing line 56, terminal 58, cap 60 and stub 62, then solder mask 70 is formed on the top surface and then plated contacts 72 provide a surface finish for underlayer 28, pad 54, terminal 58 and cap 60. Thereafter, base 24, support layer 26, underlayer 28, adhesive 30, solder mask 70 and dielectric layer 76 are cut or cracked at the peripheral edges of thermal board 86 to detach it from the batch.

FIGS. 8A, 8B, 8C and 8D are cross-sectional, cross-sectional, top and bottom views, respectively, of a thermal board with a thermal filler in accordance with an embodiment of the present invention.

In this embodiment, the thermal via includes a thermal filler in the plated through-hole. For purposes of brevity, any description of thermal board 80 is incorporated herein insofar as the same is applicable, and the same description need not be repeated Likewise, elements of the thermal board similar to those in thermal board 80 have corresponding reference numerals.

Thermal board 88 includes support layer 26, adhesive 30, conductive trace 64, heat spreader 68 and solder mask 70. Conductive trace 64 includes pad 54, routing line 56 and terminal 58. Heat spreader 68 includes post 22, base 24, underlayer 28, cap 60 and thermal via 66 which includes plated through-hole 48, stub 62 and thermal filler 78.

Thermal filler 78 (rather than solder mask 70) fills the inner hole in plated through-hole 48. Thermal filler 78 also has high thermal conductivity and therefore increases the thermal conductivity of thermal via 66. Thermal filler 78 is illustrated as epoxy filled with aluminum nitride. Thus, aluminum nitride particles are dispersed in the epoxy.

Thermal board 88 can be manufactured in a manner similar to thermal board 80 with suitable adjustments for thermal filler 78. For instance, adhesive 30 is mounted on base 24, conductive layer 34 is mounted on adhesive 30 and heat and pressure are applied to flow and solidify adhesive 30. Thereafter, grinding is applied to planarize post 22, adhesive 30 and conductive layer 34 at the top surface, hole 40 is drilled through base 24, support layer 26, underlayer 28, adhesive 30 and conductive layer 34 and then plated layers 44 and 46 and plated through-hole 48 are deposited on the structure. Thereafter, thermal filler 78 is deposited into plated through-hole 48. Thereafter, conductive layer 34 and plated layer 44 are etched to form pad 54, routing line 56, terminal 58, cap 60 and stub 62, then solder mask 70 is formed on the top surface and then plated contacts 72 provide a surface finish for underlayer 28, pad 54, terminal 58 and cap 60. Thereafter, base 24, support layer 26, underlayer 28, adhesive 30 and solder mask 70 are cut or cracked at the peripheral edges of thermal board 88 to detach it from the batch.

Thermal filler 78 is initially an epoxy paste that is selectively screen printed into plated through-hole 48. Thereafter, the epoxy paste is heated and hardened at a relatively low temperature such as 190° C.

FIGS. 9A, 9B, 9C and 9D are cross-sectional, cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the cap, is electrically connected to the pad using a wire bond and is thermally connected to the cap using a die attach. The semiconductor device is covered by a color-shifting encapsulant that converts the blue light to white light.

Semiconductor chip assembly 100 includes thermal board 80, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is a thermal contact surface.

LED chip 102 is mounted on heat spreader 68, electrically connected to conductive trace 64 and thermally connected to heat spreader 68. In particular, LED chip 102 is mounted on cap 60 (and thus post 22), overlaps post 22, base 24, support layer 26, underlayer 28, adhesive 30 and cap 60 but does not overlap conductive trace 64, thermal via 66 or solder mask 70, is electrically connected to pad 54 by wire bond 104 and is thermally connected to and mechanically attached to cap 60 by die attach 106.

For instance, wire bond 104 is bonded to and electrically connects pads 54 and 114, thereby electrically connecting LED chip 102 to terminal 58. Die attach 106 contacts and is sandwiched between and thermally connects and mechanically attaches cap 60 and thermal contact surface 112, thereby thermally connecting LED chip 102 to post 22, thereby thermally connecting LED chip 102 to base 24, thereby thermally connecting LED chip 102 to thermal via 66 and thereby thermally connecting LED chip 102 to underlayer 28.

Encapsulant 108 is a solid adherent electrically insulative color-shifting protective enclosure that provides environmental protection such as moisture resistance and particle protection for LED chip 102 and wire bond 104. Encapsulant 108 contacts pad 54, cap 60, solder mask 70, LED chip 102, wire bond 104 and die attach 106, is spaced from post 22, base 24, support layer 26, underlayer 28, adhesive 30, terminal 58 and thermal via 66 and covers post 22, pad 54, cap 60, LED chip 102, wire bond 104 and die attach 106 in the upward direction. Encapsulant 108 is transparent for convenience of illustration.

Pad 54 is spot plated with nickel/silver to bond well with wire bond 104, thereby improving signal transfer from conductive trace 64 to LED chip 102, and cap 60 is spot plated with nickel/silver to bond well with die attach 106, thereby improving heat transfer from LED chip 102 to heat spreader 68. Cap 60 also provides a highly reflective surface which reflects the light emitted towards the silver surface layer by LED chip 102, thereby increasing light output in the upward direction. Furthermore, since cap 60 is shaped and sized to accommodate thermal contact surface 112, post 22 need not be shaped and sized to accommodate thermal contact 112.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor. For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 60 using die attach 106, then wire bonding pads 54 and 114 and then forming encapsulant 108.

For instance, die attach 106 is initially a silver-filled epoxy paste with high thermal conductivity that is selectively screen printed on cap 60 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 54 and 114 and then encapsulant 108 is molded on the structure.

LED chip 102 can be electrically connected to pad 54 by a wide variety of connection media, thermally connected to and mechanically attached to heat spreader 68 by a wide variety of thermal adhesives and encapsulated by a wide variety of encapsulants.

Semiconductor chip assembly 100 is a first-level single-chip package.

FIGS. 10A, 10B, 10C and 10D are cross-sectional, cross-sectional, top and bottom views, respectively, of a semiconductor chip assembly that includes a thermal board and a semiconductor device with backside contacts in accordance with an embodiment of the present invention.

In this embodiment, the semiconductor device is an LED package rather than an LED chip. Furthermore, the semiconductor device is mounted on the heat spreader and the conductive trace, overlaps the post and the conductive trace, is electrically connected to the pad using a solder joint and is thermally connected to the cap using a solder joint.

Semiconductor chip assembly 200 includes thermal board 80, LED package 202 and solder joints 204 and 206. LED package 202 includes LED chip 208, submount 210, wire bond 212, electrical contact 214, thermal contact 216 and encapsulant 218. LED chip 208 includes a bond pad (not shown) electrically connected to a via (not shown) in submount 210 by wire bond 212, thereby electrically connecting LED chip 208 to electrical contact 214. LED chip 208 is mounted on and thermally connected to and mechanically attached to submount 210 by a die attach (not shown), thereby thermally connecting LED chip 208 to thermal contact 216. Submount 210 is a ceramic block with low electrical conductivity and high thermal conductivity, and contacts 214 and 216 are plated on and protrude downwardly from the backside of submount 210. Furthermore, LED chip 208 is similar to LED chip 102, wire bond 212 is similar to wire bond 104 and encapsulant 218 is similar to encapsulant 108.

LED package 202 is mounted on conductive trace 64 and heat spreader 68, electrically connected to conductive trace 64 and thermally connected to heat spreader 68. In particular, LED package 202 is mounted on pad 54 and cap 60 (and thus post 22 and adhesive 30), overlaps post 22, base 24, support layer 26, underlayer 28, adhesive 30, pad 54, cap 60 and solder mask 70 but does not overlap terminal 58 or thermal via 66, is electrically connected to pad 54 by solder joint 204 and is thermally connected to cap 60 by solder joint 206.

For instance, solder joint 204 contacts and is sandwiched between and electrically connects and mechanically attaches pad 54 and electrical contact 214, thereby electrically connecting LED chip 208 to terminal 58. Likewise, solder joint 206 contacts and is sandwiched between and thermally connects and mechanically attaches cap 60 and thermal contact 216, thereby thermally connecting LED chip 208 to underlayer 28.

Pad 54 is spot plated with nickel/silver to bond well with solder joint 204, thereby improving signal transfer from conductive trace 64 to LED chip 208, and cap 60 is spot plated with nickel/silver to bond well with solder joint 206, thereby improving heat transfer from LED chip 208 to heat spreader 68. Furthermore, since cap 60 is shaped and sized to accommodate thermal contact 216, post 22 need not be shaped and sized to accommodate thermal contact 216.

Semiconductor chip assembly 200 can be manufactured by depositing a solder material on pad 54 and cap 60, then placing contacts 214 and 216 on the solder material over pad 54 and cap 60, respectively, and then reflowing the solder material to provide solder joints 204 and 206.

For instance, solder paste is selectively screen printed on pad 54 and cap 60, then LED package 202 is positioned over thermal board 80 using a pick-up head and an automated pattern recognition system in step-and-repeat fashion. The pick-up head places contacts 214 and 216 on the solder paste over pad 54 and cap 60, respectively. Next, the solder paste is heated and reflowed at a relatively low temperature such as 190° C. and then the heat is removed and the solder paste cools and solidifies to form hardened solder joints 204 and 206. Alternatively, solder balls are placed on pad 54 and cap 60, then contacts 214 and 216 are placed on the solder balls over pad 54 and cap 60, respectively, and then the solder balls are heated and reflowed to form solder joints 204 and 206.

The solder material can be initially deposited on thermal board 80 or LED package 202 by plating or printing or placement techniques, then sandwiched between thermal board 80 and LED package 202 and then reflowed. The solder material can also be deposited on underlayer 28 and terminal 58 if required for the next level assembly. Furthermore, a conductive adhesive such as silver-filled epoxy or other connection media can be used instead of solder, and the connection media on underlayer 28, pad 54, terminal 58 and cap 60 need not be the same.

Semiconductor chip assembly 200 is a second-level single-chip module.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the thermal board can include single-level conductive traces and multi-level conductive traces. The thermal board can also include multiple posts arranged in an array for multiple semiconductor devices and additional conductive traces to accommodate the additional semiconductor devices. The thermal board can also include a conductive trace that provides vertical signal routing with a plated through-hole that extends through the base, the adhesive and the support layer. The thermal board can also include the second adhesive, the metal layer and the dielectric layer. The thermal board can also include the second adhesive, the metal layer and the thermal filler. The thermal board can also include the dielectric layer and the thermal filler. The semiconductor device can be flip-chip bonded to the pad and the cap by solder joints, overlap the pad and cover the post in the upward direction. The semiconductor device can be covered in the upward direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the thermal board can include additional conductive traces to receive and route additional wire bonds to the chips. This may be more cost effective than providing a miniature post for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive or the substrate. As a result, the adhesive can have low thermal conductivity which drastically reduces cost. The heat spreader can include a post and a base that are integral with one another, a cap that is metallurgically bonded and thermally connected to the post and a thermal via that is metallurgically bonded and thermally connected to the base and the underlayer, thereby enhancing reliability and reducing cost. The cap can be coplanar with the pad, thereby facilitating the electrical, thermal and mechanical connections with the semiconductor device. Furthermore, the cap can be customized for the semiconductor device and the underlayer can be customized for the next level assembly, thereby enhancing the thermal connection from the semiconductor device to the next level assembly. For instance, the cap can have a square or rectangular shape in a lateral plane with the same or similar topography as the thermal contact of the semiconductor device and the post can have a circular shape. In any case, the heat spreader can be a wide variety of thermally conductive structures.

The pad can be electrically connected to or isolated from the cap. For instance, a routing line above the adhesive and the dielectric layer can electrically connect the pad and the cap, or a routing line between the adhesive and the dielectric layer can electrically connect the base and a plated through-hole, or the pad and the cap can be merged. Thereafter, the terminal can be electrically connected to ground, thereby electrically connecting the cap to ground.

The post can be deposited on or integral with the base. The post can be integral with the base when they are a single-piece metal such as copper or aluminum. The post can also be integral with the base when they include a single-piece metal such as copper at their interface as well as additional metal elsewhere such as a solder upper post portion and a copper lower post portion and base. The post can also be integral with the base when they share single-piece metals at their interface such as a copper coating on a nickel buffer layer on an aluminum core.

The post can include a flat top surface that is coplanar with the adhesive. For instance, the post can be coplanar with the adhesive or the post can be etched after the adhesive is solidified to provide a cavity in the adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The support layer can provide mechanical support for the base and the substrate. For instance, the support layer can prevent the substrate from warping during metal grinding, chip mounting, wire bonding and encapsulant molding.

The underlayer can include fins at its backside that protrude in the downward direction. For instance, the underlayer can be cut at its bottom surface by a routing machine to form lateral grooves that define the fins. In this instance, the underlayer can have a thickness of 500 microns, the grooves can have a depth of 300 microns and the fins can have a height of 300 microns. The fins can increase the surface area of the underlayer, thereby increasing the thermal conductivity of the underlayer by thermal convection when it remains exposed to the air rather than mounted on a heat sink.

The cap can be formed by numerous deposition techniques including electroplating, electroless plating, evaporating and sputtering as a single layer or multiple layers after the adhesive is solidified. The cap can be the same metal as the post or the adjacent top of the post. Furthermore, the cap can extend across the aperture to the substrate or reside within the periphery of the aperture. Thus, the cap can contact or be spaced from the substrate. In any case, the cap extends upwardly from the top of the post.

The adhesive can provide a robust mechanical bond between the heat spreader and the substrate. For instance, the adhesive can extend laterally from the post beyond the conductive trace to the peripheral edges of the assembly, the adhesive can fill the space between the post and the dielectric layer and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer can be mounted on the adhesive so that the conductive layer contacts the adhesive and is exposed in the upward direction and the post extends into and is exposed in the upward direction by the aperture. In this instance, the conductive layer can have a thickness of 80 to 150 microns which is thick enough to handle without warping and wobbling yet thin enough to pattern without excessive etching.

The conductive layer and the dielectric layer can be mounted on the adhesive. For instance, the conductive layer can be provided on the dielectric layer, then the aperture can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the post extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the post is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned for the pad and the cap. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the cap can be coplanar at their top surfaces, thereby enhancing solder joints between the semiconductor device and the thermal board by controlling solder ball collapse.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the substrate is mounted on the adhesive. For instance, the conductive layer can be patterned on the substrate to provide the pad before it is mounted on the adhesive or after it is attached to the post and the base by the adhesive. Likewise, the conductive layer can be patterned to provide the terminal before the plated through-hole is formed.

The plated contact surface finish can be formed before or after the pad and the terminal are formed. For instance, the plated contacts can be deposited on the conductive layer before or after it is etched to form the pad, the terminal, the cap and the stub.

The encapsulant can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

A lid can overlap or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

A lens can overlap or replace the encapsulant. The lens can provide environmental protection such as moisture resistance and particle protection for the chip and the wire bond in a sealed enclosure. The lens can also provide a convex refractive surface that focuses the light in the upward direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, routing lines, plated through-holes and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, plated layers, plated through-hole, plated contacts, stubs, solder mask, second adhesive, metal layer, dielectric layer, thermal filler and encapsulant are generally desirable but may be omitted in some embodiments. For instance, if the opening and the aperture are punched rather than drilled so that the top of the post is shaped and sized to accommodate a thermal contact surface of the semiconductor device then the cap can be omitted. If single-level horizontal signal routing is used then the dielectric layer can be omitted. If a thick adhesive is used then the dielectric layer can be omitted Likewise, the stub and the metal layer can be employed merely to facilitate manufacturing the thermal board.

The heat spreader can include another thermal via that is spaced from the post, extends through the base, the support layer, the adhesive and the dielectric layer outside the opening and the aperture and is adjacent to and thermally connects the cap and the underlayer to improve heat dissipation from the cap to the underlayer and heat spreading in the underlayer.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single support layer, a single underlayer, a single adhesive, a single conductive layer, a single dielectric layer, a single plated layer and a single solder mask and then separated from one another Likewise, numerous sets of heat spreaders and conductive traces that are each dedicated to a single semiconductor device can be simultaneously batch manufactured for each thermal board in the batch using a single metal plate, a single support layer, a single underlayer, a single adhesive, a single conductive layer, a single dielectric layer, a single plated layer and a single solder mask.

For example, the support layer and the underlayer can be attached to the metal plate, then multiple recesses can be etched in the metal plate to form multiple posts and the base, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the conductive layer can be grinded to form a lateral top surface, then the holes can be drilled through the base, the support layer, the underlayer, the adhesive, the conductive layer and the dielectric layer, then the plated layer can be plated on the structure to form the upper and lower plated layers and the plated through-holes in the holes, then the conductive layer and the upper plated layer can be etched to form the conductive traces corresponding to the posts, the caps corresponding to the posts and the stubs for the thermal vias, then the solder mask can be deposited on the structure and patterned to expose the pads, the terminals and the caps, then the plated contact surface finish can be formed on the pads, the terminals, the caps and the underlayer and then the base, the adhesive, the dielectric layer, the support layer, the underlayer and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then LED packages can be placed on the solder paste portions, then the solder paste portions can be simultaneously heated, reflowed and hardened to provide the solder joints and then the thermal boards can be separated from one another.

As another example, die attach paste portions can be deposited on the caps, then chips can be placed on the die attach paste portions, then the die attach paste portions can be simultaneously heated and hardened to provide the die attaches, then the chips can be wired bonded to the corresponding pads, then the encapsulants can be formed over the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the cap or the die attach is between the semiconductor device and the post and is intersected by the line, and regardless of whether another imaginary vertical line intersects the post but not the semiconductor device (outside the periphery of the semiconductor device) Likewise, the adhesive overlaps the base and is overlapped by the pad, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "plated through-hole" in conjunction with the thermal via refers to a thermal interconnect that is formed in a hole using plating. For instance, the plated through-hole exists regardless of whether it remains intact in the hole and spaced from peripheral edges of the assembly or is subsequently split or trimmed such that the hole is converted into a groove and the remaining portion is in the groove at a peripheral edge of the assembly.

The term "cap" in conjunction with the heat spreader refers to a contact region that is adapted to contact and/or bond to external connection media (such as solder or thermally conductive adhesive) that thermally connects the heat spreader to the semiconductor device.

The term "underlayer" in conjunction with the heat spreader refers to a contact region that is adapted to contact and/or bond to external connection media (such as solder or thermally conductive adhesive) that thermally connects the heat spreader to an external device (such as a PCB or a heat sink) associated with the next level assembly.

The terms "opening" and "aperture" and "hole" refer to a through-hole and are synonymous. For instance, the post is exposed by the adhesive in the upward direction when it is inserted into the opening in the adhesive. Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the adhesive is mounted on the base, the substrate is mounted on the adhesive, the post is inserted into and aligned with the opening and the aperture is aligned with the opening regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:
   providing a post, a base, a support layer, an underlayer, a conductive layer and an adhesive, wherein
     the post is adjacent to the base, extends above the base in an upward direction, extends into an opening in the adhesive and is aligned with an aperture in the conductive layer,
     the base extends below the post in a downward direction opposite the upward direction, extends laterally from the post in lateral directions orthogonal to the upward and downward directions and is sandwiched between the adhesive and the support layer,
     the conductive layer is mounted on and extends above the adhesive,
     the adhesive is sandwiched between the base and the conductive layer and is non-solidified,
     the support layer is sandwiched between the base and the underlayer, and
     the underlayer extends below the support layer; then
   flowing the adhesive into and upward in a gap located in the aperture between the post and the conductive layer;
   solidifying the adhesive; then
   providing a conductive trace that includes a pad, a terminal and a selected portion of the conductive layer;
   providing a thermal via that extends from the base through the support layer to the underlayer and provides a thermally conductive path between the base and the underlayer;
   providing a heat spreader that includes the post, the base, the underlayer and the thermal via; then
   mounting a semiconductor device on the post, wherein the semiconductor device overlaps the post, the base, the support layer and the underlayer and the underlayer covers the post in the downward direction;
   electrically connecting the semiconductor device to the pad, thereby electrically connecting the semiconductor device to the terminal; and
   thermally connecting the semiconductor device to the post, thereby thermally connecting the semiconductor device to the underlayer.

2. The method of claim 1, wherein providing the post and the base includes:
   providing a metal plate;
   forming an etch mask on the metal plate that selectively exposes the metal plate and defines the post;
   etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
   removing the etch mask.

3. The method of claim 1, wherein providing the post, the base, the support layer and the underlayer includes:
   providing a metal plate;
   attaching the support layer and the underlayer to the metal plate; then
   forming an etch mask on the metal plate that selectively exposes the metal plate and defines the post;
   etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
   removing the etch mask.

4. The method of claim 1, wherein:
   providing the adhesive includes providing a prepreg with uncured epoxy;
   flowing the adhesive includes melting the uncured epoxy and compressing the uncured epoxy between the base and the conductive layer; and
   solidifying the adhesive includes curing the uncured epoxy.

5. The method of claim 1, wherein flowing the adhesive includes filling the gap with the adhesive.

6. The method of claim 1, wherein mounting the conductive layer includes mounting the conductive layer alone on the adhesive.

7. The method of claim 1, wherein mounting the conductive layer includes mounting the conductive layer and a dielectric layer on the adhesive, wherein the dielectric layer contacts and is sandwiched between the conductive layer and the adhesive and is solidified and the aperture extends through the conductive layer and the dielectric layer.

8. The method of claim 1, wherein providing the pad includes removing selected portions of the conductive layer after solidifying the adhesive.

9. The method of claim 1, wherein providing the pad includes:
   grinding the post, the adhesive and the conductive layer such that the post, the adhesive and the conductive layer are laterally aligned with one another at a top lateral surface that faces in the upward direction; and then
   removing selected portions of the conductive layer using an etch mask that defines the pad.

10. The method of claim 1, wherein providing the terminal includes removing selected portions of the conductive layer after solidifying the adhesive.

11. The method of claim 1, wherein providing the terminal includes:
    grinding the post, the adhesive and the conductive layer such that the post, the adhesive and the conductive layer are laterally aligned with one another at a top lateral surface that faces in the upward direction; and then
    removing selected portions of the conductive layer using an etch mask that defines the terminal.

12. The method of claim 1, wherein providing the thermal via includes:
    providing a plated through-hole that extends from the base through the support layer to the underlayer after solidifying the adhesive; and then
    removing selected portions of the conductive layer.

13. The method of claim 1, wherein providing the conductive trace and the heat spreader includes:
providing a plated through-hole for the thermal via that extends from the conductive layer through the adhesive to the base and from the base through the support layer to the underlayer after solidifying the adhesive; and then
removing selected portions of the conductive layer using an etch mask that defines the pad, the terminal and a stub for the thermal via that is adjacent to the plated through-hole.

14. The method of claim 1, wherein mounting the semiconductor device includes providing a first solder joint between the semiconductor device and the pad and a second solder joint between the semiconductor device and the post, electrically connecting the semiconductor device includes providing the first solder joint between the semiconductor device and the pad, and thermally connecting the semiconductor device includes providing the second solder joint between the semiconductor device and the post.

15. The method of claim 1, wherein mounting the semiconductor device includes providing a die attach between the semiconductor device and the post, electrically connecting the semiconductor device includes providing a wire bond between the semiconductor device and the pad, and thermally connecting the semiconductor device includes providing the die attach between the semiconductor device and the post.

16. A method of making a semiconductor chip assembly, comprising:
providing a post, a base, a support layer and an underlayer, wherein the post is adjacent to and integral with the base and extends above the base in an upward direction, the base extends below the post in a downward direction opposite the upward direction and extends laterally from the post in lateral directions orthogonal to the upward and downward directions, the support layer is sandwiched between the base and the underlayer and the underlayer extends below the support layer;
providing an adhesive, wherein an opening extends through the adhesive;
providing a conductive layer, wherein an aperture extends through the conductive layer;
mounting the adhesive on the base, including inserting the post into the opening, wherein the adhesive extends above the base and the post extends into the opening;
mounting the conductive layer on the adhesive, including aligning the post with the aperture, wherein the conductive layer extends above the adhesive and the adhesive is sandwiched between the base and the conductive layer and is non-solidified; then
applying heat to melt the adhesive;
moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;
applying heat to solidify the molten adhesive, thereby mechanically attaching the post and the base to the conductive layer; then
providing a conductive trace that includes a pad, a terminal and a selected portion of the conductive layer;
providing a cap that extends above and is adjacent to and covers in the upward direction and extends laterally from a top of the post;
providing a thermal via that provides a thermally conductive path between the base and the underlayer, including providing a plated through-hole that extends from the base through the support layer to the underlayer;
providing a heat spreader that includes the post, the base, the cap, the underlayer and the thermal via; then
mounting a semiconductor device on the cap, wherein the semiconductor device overlaps the post, the base, the cap, the support layer and the underlayer and the underlayer covers the post in the downward direction;
electrically connecting the semiconductor device to the pad, thereby electrically connecting the semiconductor device to the terminal; and
thermally connecting the semiconductor device to the cap, thereby thermally connecting the semiconductor device to the underlayer.

17. The method of claim 16, wherein providing the post and the base includes:
providing a metal plate;
forming an etch mask on the metal plate that selectively exposes the metal plate and defines the post;
etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
removing the etch mask.

18. The method of claim 16, wherein providing the post, the base, the support layer and the underlayer includes:
providing a metal plate;
attaching the support layer and the underlayer to the metal plate; then
forming an etch mask on the metal plate that selectively exposes the metal plate and defines the post;
etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
removing the etch mask.

19. The method of claim 16, wherein:
providing the adhesive includes providing a prepreg with uncured epoxy;
flowing the adhesive includes melting the uncured epoxy and compressing the uncured epoxy between the base and the conductive layer; and
solidifying the adhesive includes curing the uncured epoxy.

20. The method of claim 16, wherein flowing the adhesive includes filling the gap with the adhesive.

21. The method of claim 16, wherein mounting the conductive layer includes mounting the conductive layer alone on the adhesive.

22. The method of claim 16, wherein mounting the conductive layer includes mounting the conductive layer and a dielectric layer on the adhesive, wherein the dielectric layer contacts and is sandwiched between the conductive layer and the adhesive and is solidified and the aperture extends through the conductive layer and the dielectric layer.

23. The method of claim 16, wherein providing the pad includes removing selected portions of the conductive layer after solidifying the adhesive.

24. The method of claim 16, wherein providing the pad includes:

grinding the post, the adhesive and the conductive layer such that the post, the adhesive and the conductive layer are laterally aligned with one another at a top lateral surface that faces in the upward direction; and then removing selected portions of the conductive layer using an etch mask that defines the pad.

25. The method of claim 16, wherein providing the terminal includes removing selected portions of the conductive layer after solidifying the adhesive.

26. The method of claim 16, wherein providing the terminal includes:

grinding the post, the adhesive and the conductive layer such that the post, the adhesive and the conductive layer are laterally aligned with one another at a top lateral surface that faces in the upward direction; and then removing selected portions of the conductive layer using an etch mask that defines the terminal.

27. The method of claim 16, wherein providing the conductive trace and the heat spreader includes:

providing the plated through-hole through the base, the adhesive, the conductive layer, the support layer and the underlayer after solidifying the adhesive; and then removing selected portions of the conductive layer using an etch mask that defines the pad and the terminal.

28. The method of claim 16, wherein providing the conductive trace and the heat spreader includes:

providing the plated through-hole through the base, the adhesive, the conductive layer, the support layer and the underlayer after solidifying the adhesive; and then removing selected portions of the conductive layer using an etch mask that defines the pad, the terminal and the cap.

29. The method of claim 16, wherein mounting the semiconductor device includes providing a first solder joint between the semiconductor device and the pad and a second solder joint between the semiconductor device and the cap, electrically connecting the semiconductor device includes providing the first solder joint between the semiconductor device and the pad, and thermally connecting the semiconductor device includes providing the second solder joint between the semiconductor device and the cap.

30. The method of claim 16, wherein mounting the semiconductor device includes providing a die attach between the semiconductor device and the post, electrically connecting the semiconductor device includes providing a wire bond between the semiconductor device and the pad, and thermally connecting the semiconductor device includes providing the die attach between the semiconductor device and the post.

31. A method of making a semiconductor chip assembly, comprising:

providing a post, a base, a support layer and an underlayer, wherein the post is adjacent to and integral with the base and extends above the base in an upward direction, the base extends below the post in a downward direction opposite the upward direction and extends laterally from the post in lateral directions orthogonal to the upward and downward directions, the support layer is sandwiched between the base and the underlayer and is non-metallic and is solidified and the underlayer extends below the support layer;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends into the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad, a terminal and a routing line, wherein the pad, the terminal and the routing line include a selected portion of the conductive layer and the routing line provides an electrically conductive path between the pad and the terminal;

providing a cap that extends above and is adjacent to and covers in the upward direction and extends laterally from a top of the post and includes a selected portion of the conductive layer;

providing a thermal via that provides a thermally conductive path between the base and the underlayer and includes a selected portion of the conductive layer, including providing a plated through-hole that extends from the conductive layer through the adhesive to the base and from the base through the support layer to the underlayer;

providing a heat spreader that includes the post, the base, the cap, the underlayer and the thermal via; then mounting a semiconductor device on the cap, wherein the semiconductor device overlaps the post, the base, the cap, the support layer and the underlayer and the underlayer covers the post in the downward direction;

electrically connecting the semiconductor device to the pad, thereby electrically connecting the semiconductor device to the terminal; and thermally connecting the semiconductor device to the cap, thereby thermally connecting the semiconductor device to the post, thereby thermally connecting the semiconductor device to the base, thereby thermally connecting the semiconductor device to the thermal via and thereby thermally connecting the semiconductor device to the underlayer.

32. The method of claim 31, wherein providing the post, the base, the support layer and the underlayer includes:

providing a metal plate;

attaching the support layer and the underlayer to the metal plate; then forming an etch mask on the metal plate that selectively exposes the metal plate and defines the post;

etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then removing the etch mask.

33. The method of claim 31, wherein:
providing the adhesive includes providing a prepreg with uncured epoxy;
flowing the adhesive includes melting the uncured epoxy and compressing the uncured epoxy between the base and the conductive layer; and
solidifying the adhesive includes curing the uncured epoxy.

34. The method of claim 31, wherein flowing the adhesive includes filling the gap with the adhesive.

35. The method of claim 31, wherein mounting the conductive layer includes mounting the conductive layer alone on the adhesive.

36. The method of claim 31, wherein mounting the conductive layer includes mounting the conductive layer and a dielectric layer on the adhesive, wherein the dielectric layer contacts and is sandwiched between the conductive layer and the adhesive and is solidified and the aperture extends through the conductive layer and the dielectric layer.

37. The method of claim 31, wherein providing the pad, the terminal and the routing line includes:
grinding the post, the adhesive and the conductive layer such that the post, the adhesive and the conductive layer are laterally aligned with one another at a top lateral surface that faces in the upward direction; and then
removing selected portions of the conductive layer using an etch mask that defines the pad, the terminal and the routing line.

38. The method of claim 31, wherein providing the pad, the terminal, the routing line and the cap includes:
grinding the post, the adhesive and the conductive layer such that the post, the adhesive and the conductive layer are laterally aligned with one another at a top lateral surface that faces in the upward direction; and then
removing selected portions of the conductive layer using an etch mask that defines the pad, the terminal, the routing line and the cap.

39. The method of claim 31, wherein providing the conductive trace and the heat spreader includes:
providing a hole that extends through the base, the adhesive, the conductive layer, the support layer and the underlayer after solidifying the adhesive; then
depositing a plated layer on the post, the adhesive and the conductive layer and into the hole, wherein the plated layer forms an upper plated layer that covers the post in the upward direction and the plated through-hole in the hole; then
forming an etch mask on the upper plated layer that defines the pad, the terminal, the routing line and the cap;
etching the conductive layer and the upper plated layer in a pattern defined by the etch mask; and then
removing the etch mask.

40. The method of claim 31, wherein providing the conductive trace and the heat spreader includes:
providing a hole that extends through the base, the adhesive, the conductive layer, the support layer and the underlayer after solidifying the adhesive; then
depositing a plated layer on the post, the adhesive and the conductive layer and into the hole, wherein the plated layer forms an upper plated layer that covers the post in the upward direction and the plated through-hole in the hole; then
forming an etch mask on the upper plated layer that defines the pad, the terminal, the routing line, the cap and a stub for the thermal via that is adjacent to the plated through-hole;
etching the conductive layer and the upper plated layer in a pattern defined by the etch mask; and then
removing the etch mask.

* * * * *